(12) United States Patent
Lim et al.

(10) Patent No.: US 11,387,847 B2
(45) Date of Patent: Jul. 12, 2022

(54) APPARATUS FOR TIME INTERLEAVING AND METHOD USING THE SAME

(71) Applicant: ELECTRONICS AND TELECOMMUNICATIONS RESEARCH INSTITUTE, Daejeon (KR)

(72) Inventors: Bo-Mi Lim, Daejeon (KR); Sun-Hyoung Kwon, Daejeon (KR); Sung-Ik Park, Daejeon (KR); Jae-Young Lee, Daejeon (KR); Heung-Mook Kim, Daejeon (KR); Nam-Ho Hur, Sejong (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 17/060,748

(22) Filed: Oct. 1, 2020

(65) Prior Publication Data
US 2021/0021286 A1 Jan. 21, 2021

Related U.S. Application Data

(63) Continuation of application No. 16/353,423, filed on Mar. 14, 2019, now Pat. No. 10,833,708, which is a
(Continued)

(30) Foreign Application Priority Data

Apr. 26, 2016 (KR) .......... 10-2016-0051128
Apr. 28, 2016 (KR) .......... 10-2016-0052350
Apr. 13, 2017 (KR) .......... 10-2017-0047880

(51) Int. Cl.
*H03M 13/27* (2006.01)
*H04L 1/00* (2006.01)
*H04L 47/62* (2022.01)

(52) U.S. Cl.
CPC ...... *H03M 13/2732* (2013.01); *H04L 1/0043* (2013.01); *H04L 1/0057* (2013.01);
(Continued)

(58) Field of Classification Search
CPC .. H03M 13/23; H03M 13/27; H03M 13/2732; H04L 1/006; H04L 1/0043;
(Continued)

(56) References Cited

U.S. PATENT DOCUMENTS

2010/0266052 A1 10/2010 Kim et al.
2011/0222462 A1 9/2011 Ho et al.
(Continued)

FOREIGN PATENT DOCUMENTS

CA 2950574 A1 12/2015
KR 1020170122117 A 11/2017

OTHER PUBLICATIONS

P. Klenner et al., "Physical Layer Time Interleaving for the ATSC 3.0 System," IEEE Transactions on Broadcasting, Jan. 12, 2016, pp. 253-262, vol. 62, No. 1.

*Primary Examiner* — Shelly A Chase

(57) ABSTRACT

An apparatus and method for time interleaving corresponding to hybrid time interleaving mode are disclosed. An apparatus for time interleaving according to an embodiment of the present invention includes a twisted block interleaver configured to perform intra-subframe interleaving corresponding to time interleaving blocks; and a convolutional delay line configured to perform inter-subframe interleaving using an output of the twisted block interleaver.

8 Claims, 46 Drawing Sheets

Related U.S. Application Data continuation of application No. 15/495,860, filed on Apr. 24, 2017, now Pat. No. 10,284,228.

(52) U.S. Cl.
CPC .......... *H04L 1/0059* (2013.01); *H04L 1/0071* (2013.01); *H04L 1/007* (2013.01); *H04L 1/0048* (2013.01); *H04L 47/6245* (2013.01)

(58) Field of Classification Search
CPC ... H04L 1/0071; H04L 1/0075; H04L 1/0051; H04L 1/0059
See application file for complete search history.

(56) References Cited

U.S. PATENT DOCUMENTS

| | | |
|---|---|---|
| 2011/0228865 A1 | 9/2011 | Park et al. |
| 2013/0272448 A1 | 10/2013 | Moon et al. |
| 2015/0288554 A1 | 10/2015 | Baek et al. |
| 2016/0191286 A1* | 6/2016 | Baek ..................... H04L 1/0075 375/340 |
| 2017/0013026 A1* | 1/2017 | Kwak ..................... H04L 67/16 |
| 2017/0118053 A1* | 4/2017 | Baek ..................... H03M 13/00 |
| 2017/0272206 A1* | 9/2017 | Baek ..................... H04L 47/806 |
| 2021/0021286 A1 | 1/2021 | Lim et al. |

\* cited by examiner

Virtual FEC cells are skipped during reading processing

APPARATUS FOR TIME INTERLEAVING AND METHOD USING THE SAME

CROSS REFERENCE TO RELATED APPLICATION

This application is a continuation of U.S. application Ser. No. 16/353,423 filed Mar. 14, 2019, which is a continuation of U.S. application Ser. No. 15/495,860 filed Apr. 24, 2017, now U.S. Pat. No. 10,284,228, which claims the benefit of Korean Patent Application Nos. 10-2016-0051128, 10-2016-0052350 and 10-2017-0047880, filed Apr. 26, 2016, Apr. 28, 2016, and Apr. 13, 2017, which are hereby incorporated by reference in their entirety into this application.

BACKGROUND OF THE INVENTION

1. Technical Field

The present invention relates to broadcast signal transmission/reception technology that is used in a broadcasting system and, more particularly, to a broadcast signal transmission/reception system that uses time interleaving.

2. Description of the Related Art

Bit-Interleaved Coded Modulation (BICM) is bandwidth-efficient transmission technology, and is implemented in such a manner that an error-correction coder, a bit-by-bit interleaver and a high-order modulator are combined with one another.

BICM can provide excellent performance using a simple structure because it uses a low-density parity check (LDPC) coder or a Turbo coder as the error-correction coder. Furthermore, BICM can provide high-level flexibility because it can select modulation order and the length and code rate of an error correction code in various forms. Due to these advantages, BICM has been used in broadcasting standards, such as DVB-T2 and DVB-NGH, and has a strong possibility of being used in other next-generation broadcasting systems.

The decoding process can be greatly changed according to the time interleaving modes corresponding to the physical layer pipes when one service is transmitted using a plurality of physical layer pipes.

Therefore, it is very important to determine the time interleaving modes and parameters related to time interleaving of the physical layer pipes in consideration of decoding complexity and the like.

When performing inter-subframe interleaving, the decoding complexity is greatly increased. That is, when inter-subframe interleaving is performed, it is very important to lower the increase in decoding complexity.

SUMMARY OF THE INVENTION

Accordingly, the present invention has been made keeping in mind the above problems occurring in the prior art, and an object of the present invention is to lower the decoding complexity of a broadcasting system by appropriately setting positions of virtual cells when inter-subframe interleaving is performed.

Furthermore, an object of the present invention is to enable a convolutional delay line for hybrid-time interleaving to operate by using new virtual cells independent of virtual cells included in a twisted block interleaver so that the broadcasting system operates efficiently.

Furthermore, an object of the present invention is to operate the broadcasting system more efficiently without increasing the decoding complexity by appropriately using initial values of the FIFO register included in the convolutional delay line.

In order to accomplish the above objects, the present invention provides an apparatus for time interleaving, including: a twisted block interleaver configured to perform intra-subframe interleaving corresponding to time interleaving blocks; and a convolutional delay line configured to perform inter-subframe interleaving using an output of the twisted block interleaver.

In this case, the twisted block interleaver may perform the intra-subframe interleaving by performing a column-wise writing operation and a diagonal-wise reading operation.

In this case, the convolutional delay line may read only data cells except for virtual cells from the twisted block interleaver.

In this case, the convolutional delay line may generate (store) new virtual cells prior to switches moving to a next branch, after each row of the data cells is written from the twisted block interleaver.

In this case, the new virtual cells may correspond to the number obtained by subtracting the number of FEC blocks ($N_{FEC\_TI}$) in a time interleaving block of an interleaving frame from the maximum number of the FEC blocks ($N_{FEC\_TI\_MAX}$) corresponding to the time interleaving block of the interleaving frame for each branch.

In this case, the new virtual cells may not be outputted from the apparatus for time interleaving.

In this case, the convolutional delay line may include branches corresponding to a time interleaving unit ($N_{IU}$), and each of remaining branches except for the first branch of the branches may include one or more FIFO registers.

In this case, the convolutional delay line may output only a part of initial values stored in the FIFO register.

In this case, the part of the initial values may correspond to one initialization cell for each of the remaining branches.

In this case, the apparatus for time interleaving may further include a cell interleaver configured to interleave cells in the time interleaving block.

Furthermore, an embodiment of the present invention provides a method of time interleaving, including: performing twisted block interleaving corresponding to intra-subframe interleaving; and performing inter-subframe interleaving using an output of the twisted block interleaving.

In this case, the twisted block interleaving may be performed by using a column-wise writing operation and a diagonal-wise reading operation.

In this case, the performing inter-subframe interleaving may be performed by using a convolutional delay line, and the comvolutional delay line may read only data cells except for virtual cells corresponding to the twisted block interleaving.

In this case, the convolutional delay line may generate (store) new virtual cells prior to switches moving to a next branch, after each row of the data cells is written from the output of the twisted block interleaving.

In this case, the new virtual cells may correspond to the number obtained by subtracting the number of FEC blocks ($N_{FEC\_TI}$) in a time interleaving block of an interleaving frame from the maximum number of the FEC blocks ($N_{FEC\_TI\_MAX}$) corresponding to the time interleaving block of the interleaving frame for each branch.

In this case, the new virtual cells may not be outputted from the inter-subframe interleaving.

In this case, the convolutional delay line may include branches corresponding to a time interleaving unit ($N_{IU}$), and each of remaining branches except for the first branch of the branches may include at least one FIFO register.

In this case, the convolutional delay line may output only a part of initial values stored in the FIFO register.

In this case, the part of the initial values may correspond to one initialization cell for each of the remaining branches.

In this case, the method of time interleaving may further include performing cell interleaving corresponding to cells in the time interleaving block.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
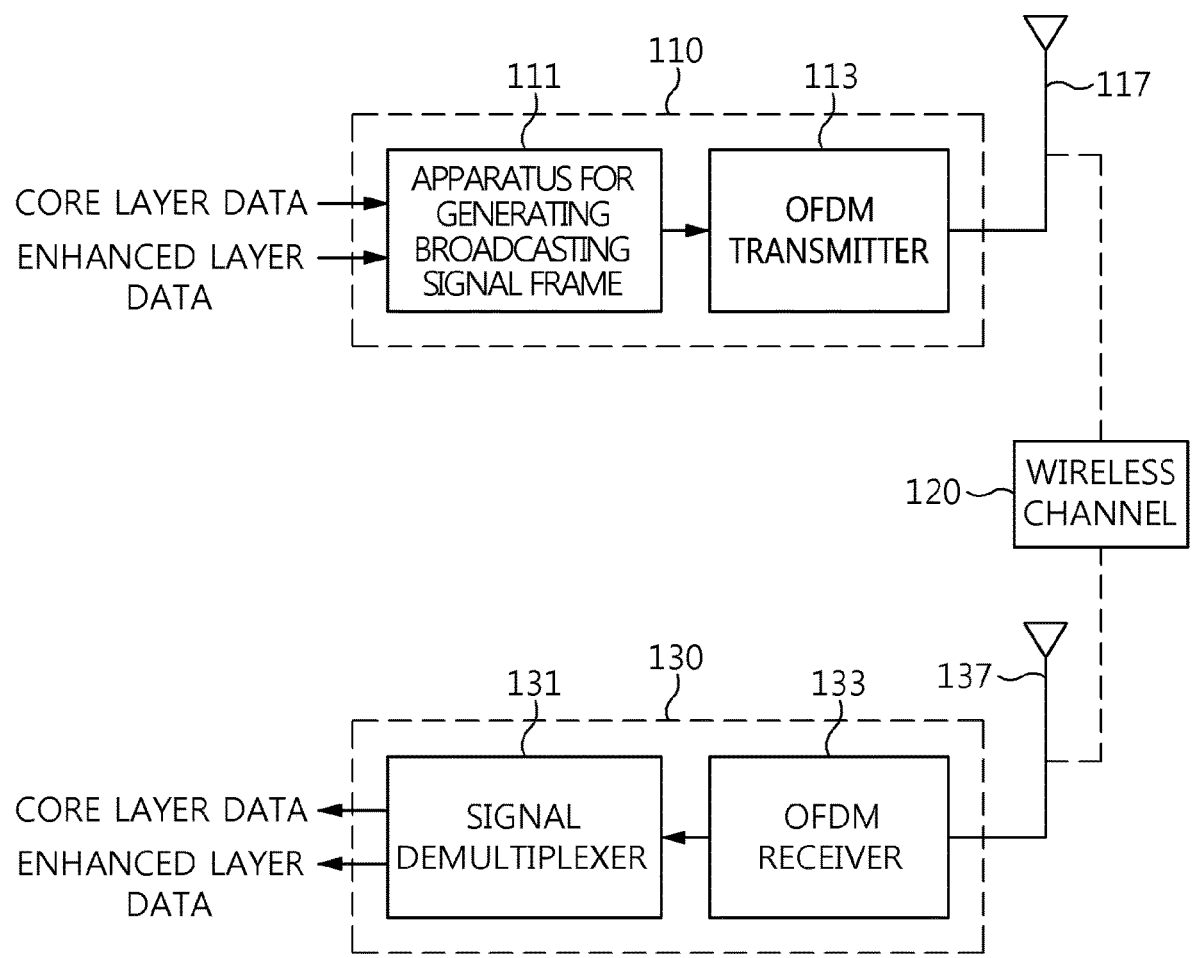
FIG. 1 is a block diagram showing a broadcast signal transmission/reception system according to an embodiment of the present invention.

The present invention will be described in detail below with reference to the accompanying drawings. In the description, redundant descriptions and descriptions of well-known functions and configurations that have been deemed to make the gist of the present invention unnecessarily obscure will be omitted below. The embodiments of the present invention are provided to fully describe the present invention to persons having ordinary knowledge in the art to which the present invention pertains. Accordingly, the shapes, sizes, etc. of components in the drawings may be exaggerated to make the description obvious.

Preferred embodiments of the present invention are described in detail below with reference to the accompanying drawings.

FIG. 1 is a block diagram showing a broadcast signal transmission/reception system according to an embodiment of the present invention.

Referring to FIG. 1, a broadcast signal transmission/reception system according to the embodiment of the present invention includes a broadcast signal transmission apparatus 110, a wireless channel 120, and a broadcast signal reception apparatus 130.

The broadcast signal transmission apparatus 110 includes an apparatus for generating broadcast signal frame 111 which generate the broadcast signal frame by multiplexing core layer data and enhanced layer data, and an OFDM transmitter 113.

The apparatus 111 combines a core layer signal corresponding to core layer data and an enhanced layer signal corresponding to enhanced layer data, performs power-normalizing for reducing power of the combined signal to a power level corresponding to the core layer signal, and generating a time-interleaved signal by performing time interleaving after performing the power-normalizing. In this case, the core layer signal and the enhanced layer signal may be combined at different power levels. In this case, the time interleaving may be applied to both the core layer signal and the enhanced layer signal. In this case, the apparatus 111 may generate a broadcast signal frame including a bootstrap and a preamble using the time-interleaved signal. In this case, the broadcast signal frame may be an ATSC 3.0 frame.

According to an embodiment, the apparatus 111 may time-interleave one layer signal (BICM output signal) and generate the broadcast signal frame without combining two layer signals.

In this case, the preamble may signal a time interleaving mode corresponding to the time interleaver for each of physical layer pipes (PLPs).

In this case, the physical layer pipes may include one enhanced layer physical layer pipe and a plurality of core layer physical layer pipes which are layered-division multiplexed with the one enhanced layer physical layer pipe.

In this case, the time interleaving mode corresponding to the enhanced layer physical layer pipe may be the same as time interleaving modes corresponding to the core layer physical layer pipes with which the enhanced layer physical layer pipe is layered-division multiplexed.

In this case, the time interleaving modes corresponding to the core layer physical layer pipes with which the enhanced layer physical layer pipe is layered-division multiplexed may be all no time interleaving mode or all hybrid time interleaving mode.

In this case, the core layer physical layer pipes with which the enhanced layer physical layer pipe is layered-division multiplexed may all use an intra-subframe interleaving mode, when the time interleaving modes corresponding to the core layer physical layer pipes with which the enhanced layer physical layer pipe is layered-division multiplexed are all hybrid time interleaving mode.

In this case, each of core layer physical layer pipes with which the enhanced layer physical layer pipe is layered-division multiplexed may consist of an integer number of FEC blocks within each subframe, when the time interleaving modes corresponding to the core layer physical layer pipes with which the enhanced layer physical layer pipe is layered-division multiplexed are all no time interleaving mode.

In this case, all of available data cells of the subframe may be filled with dummy modulation values first and then the actual physical layer pipe data may be overwritten for generating the subframe.

In this case, the dummy modulation values may be generated by using a scrambling sequence generated using a generator polynomial corresponding to $1+X+X^3+X^6+X^7+X^{11}+X^{12}+X^{13}+X^{16}$.

In this case, the dummy modulation values may be generated by mapping a value of the scrambling sequence into one among two phases which are separated by 180 degrees.

In this case, the scrambling sequence may be generated by using eight bits which are generated by a third bit output ($x^{14}$), a fourth bit output ($x^{13}$), a fifth bit output ($x^{12}$), a sixth bit output ($x^{11}$), a tenth bit output ($x^7$), thirteenth bit output ($x^4$), fourteenth bit output ($x^3$) and a sixteenth bit output (x) of a shift register initialized by 0xF180 value.

In this case, the physical layer pipes may include a plurality of core layer physical layer pipes corresponding to one complete delivered product, and the core layer physical layer pipes may be not layered division multiplexed.

In this case, each of the core layer physical layer pipes may use either a no time interleaving mode or a hybrid time interleaving mode as the time interleaving mode, and may not use a convolutional interleaving mode.

In this case, all of the core layer physical layer pipes may use an intra-subframe interleaving mode or all of the core layer physical layer pipes may use an inter-subframe interleaving mode, when all of the core layer physical layer pipes use the hybrid time interleaving mode as the time interleaving mode.

In this case, all of the core layer physical layer pipes may be configured with the same value of L1D_plp_HTI_inter_subframe when all of the core layer physical layer pipes use the hybrid time interleaving mode as the time interleaving mode.

In this case, all of the core layer physical layer pipes may use the same time interleaving unit ($N_{IU}$) when all of the core layer physical layer pipes use the hybrid time interleaving mode as the time interleaving mode and the inter-subframe interleaving mode.

In this case, any of the core layer physical layer pipes configured with the hybrid time interleaving mode may use the intra-subframe interleaving mode when at least one of the core layer physical layer pipes uses the no time interleaving mode as the time interleaving mode.

In this case, the one complete delivered product may correspond to at least one subframe, and the subframe may be filled with dummy modulation values first and then the actual physical layer pipe data may be overwritten for generating the subframe.

In this case, the time interleaving may use one of time interleaver groups, and a boundary between the time interleaver groups may be a boundary between Physical Layer Pipes (PLPs) of a core layer corresponding to the core layer signal. That is, one of the boundaries between the Physical Layer Pipes of the core layer may be the boundary between the time interleaver groups.

In this case, enhanced layer data corresponding to the one of the time interleaver groups include dummy values.

In this case, the dummy values may be inserted after the actual data cells of the last Enhanced PLP in a PLP group so that the total number of Enhanced Layer cells in the PLP group is the same as the total number of Core Layer cells in the PLP group.

In this case, the dummy values may be not inserted in core layer data.

In this case, the dummy values may be inserted after core layer and enhanced layer BICMs and before the core layer signal and the enhanced layer signal are combined.

In this case, the dummy values may correspond to a predetermined scrambling sequence.

In this case, the scrambling sequence may be modulated by using the same constellation mapping that is used for the last Enhanced PLP.

In this case, the dummy values may have the same power as the last Enhanced PLP.

In this case, the scrambling sequence may be generated by a 16-bit shift register corresponding to a predetermined generator polynomial.

In this case, the scrambling sequence may be generated by a generator polynomial corresponding to $1+X+X^3+X^6+X^7+X^{11}+X^{12}+X^{13}+X^{16}$.

In this case, the scrambling sequence may be generated by using eight bits which are generated by a third bit output ($x^{14}$), a fourth bit output ($x^{13}$), a fifth bit output ($x^{12}$), a sixth bit output ($x^{11}$), a tenth bit output ($x^7$), thirteenth bit output ($x^4$), fourteenth bit output ($x^3$) and a sixteenth bit output (x) of a shift register initialized by 0xF180 value.

The OFDM transmitter 113 transmits the generated broadcast signal frame using an OFDM communication method via an antenna 117, thereby allowing the transmitted OFDM signal to be received via the antenna 137 of the broadcast signal reception apparatus 130 over the wireless channel 120.

The broadcast signal reception apparatus 130 includes an OFDM receiver 133 and a signal demultiplexer 131. When the signal transmitted over the wireless channel 120 is received via the antenna 137, the OFDM receiver 133 receives an OFDM signal via synchronization, channel estimation and equalization.

In this case, the OFDM receiver 133 may detect and demodulate the bootstrap from the OFDM signal, demodulate the preamble using information included in the bootstrap, and demodulate the super-imposed payload using information included in the preamble.

The signal demultiplexer 131 restores the core layer data from the signal (super-imposed payload) received via the OFDM receiver 133 first, and then restores the enhanced layer data via cancellation corresponding to the restored core layer data. In this case, the signal demultiplexer 131 may generate a broadcast signal frame first, may restore the bootstrap, may restore the preamble using the information included in the bootstrap, and may use the signaling information included in the preamble for the restoration of a data signal. In this case, the signaling information may be L1 signaling information and may include injection level information, normalizing factor information, etc.

In this case, the preamble may include a time interleaving mode corresponding to the time interleaver for each physical layer pipe.

In this case, the preamble may include a PLP identification information for identifying Physical Layer Pipes (PLPs); and a layer identification information for identifying layers corresponding to division of layers.

In this case, the PLP identification information and the layer identification information may be included in the preamble as fields different from each other.

In this case, the time interleaver information may be included in the preamble on the basis of the core layer.

In this case, the preamble may selectively include an injection level information corresponding to the injection level controller for each of the Physical Layer Pipes (PLPs) based on a result of comparing the layer identification information with a predetermined value.

In this case, the preamble may include type information, start position information and size information of the Physical Layer Pipes.

In this case, the type information may be for identifying one among a first type corresponding to a non-dispersed physical layer pipe and a second type corresponding to a dispersed physical layer pipe.

In this case, the non-dispersed physical layer pipe may be assigned for contiguous data cell indices, and the dispersed physical layer pipe may include two or more subslices.

In this case, the type information may be selectively signaled according to a result of comparing the layer identification information with a predetermined value for each of the Physical Layer Pipes (PLPs).

In this case, the type information may be signaled only for the core layer.

In this case, the start position information may be identical to an index corresponding to the first data cell of the physical layer pipe.

In this case, the start position information may indicate the start position of the physical layer pipe using cell addressing scheme.

In this case, the start position information may be included in the preamble for each of the Physical Layer Pipes (PLPs) without checking a condition of a conditional statement corresponding to the layer identification information.

In this case, the size information may be generated based on the number of data cells assigned to the physical layer pipe.

In this case, the size information may be included in the preamble for each of the Physical Layer Pipes (PLPs) without checking a condition of a conditional statement corresponding to the layer identification information.

In this case, the time interleaver information may be signaled on the basis of the core layer.

In this case, the time interleaver may correspond to a hybrid time interleaver. In this case, Physical Layer Pipes (PLPs) of a core layer and an enhanced layer may include only complete FEC blocks.

In this case, the preamble may be for signaling information for identifying a part of a FEC block in the enhanced layer in case that the boundary between the time interleaver groups does not correspond to a boundary between FEC blocks in the enhanced layer, the FEC block corresponding to the boundary between the time interleaver groups.

In this case, the information for identifying the part of the FEC block may include at least one of start position information of a Physical Layer Pipe (PLP) in the core layer, start position information of a Physical Layer Pipe (PLP) in the enhanced layer, modulation information corresponding to the enhanced layer, and FEC type information corresponding to the enhanced layer.

In this case, the start position information of the Physical Layer Pipe (PLP) may correspond to an index of a first data cell of the Physical Layer Pipe (PLP).

In this case, the modulation information may be signaled only if the FEC type information satisfies a predetermined condition.

In this case, the enhanced layer signal may correspond to enhanced layer data that is restored based on cancellation corresponding to restoration of core layer data corresponding to the core layer signal.

In this case, the time interleaver may correspond to a convolutional time interleaver, the time interleaver groups may include the Physical Layer Pipe (PLP) which includes an incomplete FEC block, and the preamble may be for signaling start position information of a first complete FEC block in the Physical Layer Pipe (PLP).

In this case, the time interleaver may perform the interleaving by using one of a plurality of operation modes.

In this case, the operation modes may include a first mode corresponding to no time interleaving, a second mode for performing a Convolutional time interleaving and a third mode for performing a Hybrid time interleaving.

In this case, the preamble may include a field indicating a start position of a first complete FEC block corresponding to a current Physical Layer Pipe for the first mode and the second mode, and may not include the field indicating the start position of the first FEC block for the third mode. In this case, the field indicating the start position may indicate the start position of the first FEC block starting in a current Physical Layer Pipe during a current subframe.

In this case, the field indicating the start position of the first FEC block may be one of a first field used in the first mode and a second field used in the second mode, and the first field and the second field may have different lengths.

In this case, the length of the second field may be longer than the length of the first field.

In this case, the length of the first field may be determined based on a length of a LDPC codeword and a modulation order and the length of the second field may be determined not only by the length of the LDPC codeword and the modulation order but also by further considering a depth of a Convolutional time interleaver.

In this case, the length of the first field may be 15 bits and the length of the second field may be 22 bits.

In this case, the first field and the second field may be separately signaled for each of a core layer corresponding to the core layer signal and an enhanced layer corresponding to the enhanced layer signal.

As will be described in detail later, the apparatus 111 shown in FIG. 1 may include a combiner configured to generate a multiplexed signal by combining a core layer signal and an enhanced layer signal; a power normalizer configured to perform power-normalizing for reducing the power of the multiplexed signal to a power level corresponding to the core layer signal; a time interleaver configured to generate a time-interleaved signal by performing time interleaving after performing the power-normalizing; and a frame builder configured to generate a broadcast signal frame including a preamble for signaling a time interleaving mode corresponding to the time interleaver for each of physical layer pipes (PLPs). In this case, the time interleaver may use one of time interleaver groups, and enhanced layer data corresponding to the one of the time interleaver groups may include dummy values. In this case, the broadcast signal transmission apparatus 110 shown in FIG. 1 may be viewed as including: a combiner configured to generate a multiplexed signal by combining a core layer signal and an enhanced layer signal; a power normalizer configured to perform power-normalizing for reducing the power of the multiplexed signal to a power level corresponding to the core layer signal; a time interleaver configured to generate a time-interleaved signal by performing time interleaving after performing the power-normalizing; a frame builder configured to generate a broadcast signal frame including a preamble for signaling a time interleaving mode corresponding to the time interleaver for each of physical layer pipes (PLPs); and an OFDM transmitter configured to transmit the broadcast signal frame using OFDM communication scheme through an antenna. In this case, the time interleaver may use one of time interleaver groups, and enhanced layer data corresponding to the one of the time interleaver groups may include dummy values.

According to an embodiment, the apparatus 111 shown in FIG. 1 may include a time interleaver configured to generate a time-interleaved signal by performing time-interleaving on a BICM output signal; and a frame builder configured to generate a broadcast signal frame including a preamble for signaling a time interleaving mode corresponding to the time interleaver for each of physical layer pipes (PLPs), in case of a single layer. In this case, the BICM output signal may be an output signal of a BICM apparatus which will be described later. In this case, the broadcast signal transmission apparatus 110 shown in FIG. 1 may be viewed as including: a time interleaver configured to generate a time-interleaved signal by performing time-interleaving on a BICM output signal; a frame builder configured to generate a broadcast signal frame including a preamble for signaling a time interleaving mode corresponding to the time interleaver for each of physical layer pipes (PLPs); and an OFDM transmitter configured to transmit the broadcast signal frame using OFDM communication scheme through an antenna.

As will be described in detail later, the signal demultiplexer shown in FIG. 1 may include a time deinterleaver configured to generate a time-deinterleaved signal by applying time deinterleaving to a received signal corresponding to a broadcast signal frame; a de-normalizer configured to increase the power of the received signal or the time-deinterleaved signal by a level corresponding to a reduction in power by the power normalizer of the transmitter; a core layer BICM decoder configured to restore core layer data from the signal power-adjusted by the de-normalizer; an enhanced layer symbol extractor configured to extract an enhanced layer signal by performing cancellation corresponding to the core layer data on the signal power-adjusted by the de-normalizer using the output signal of the core layer FEC decoder of the core layer BICM decoder; a de-injection level controller configured to increase the power of the enhanced layer signal by a level corresponding to a reduction in power by the injection level controller of the transmitter; and an enhanced layer BICM decoder configured to restore enhanced layer data using the output signal of the de-injection level controller. In this case, the broadcast signal reception apparatus 130 shown in FIG. 1 may be viewed as including: an OFDM receiver configured to generate a received signal by performing any one or more of synchronization, channel estimation and equalization on a transmitted signal corresponding to a broadcast signal frame; a time deinterleaver configured to generate a time-deinterleaved signal by applying time deinterleaving to the received signal; a de-normalizer configured to increase the power of the received signal or the time-deinterleaved signal by a level corresponding to a reduction in power by the power normalizer of the transmitter; a core layer BICM decoder configured to restore core layer data from the signal power-adjusted by the de-normalizer; an enhanced layer symbol extractor configured to extract an enhanced layer signal by performing cancellation corresponding to the core layer data on the signal power-adjusted by the de-normalizer using the output signal of the core layer FEC decoder of the core layer BICM decoder; a de-injection level controller configured to increase the power of the enhanced layer signal by a level corresponding to a reduction in power by the injection level controller of the transmitter; and an enhanced layer BICM decoder configured to restore enhanced layer data using the output signal of the de-injection level controller.

In this case, the time deinterleaver may use one of time interleaver groups, and enhanced layer data corresponding to the one of the time interleaver groups may include dummy values.

In this case, the time deinterleaver may correspond to the time interleaving mode.

In this case, the preamble may include the time interleaving mode corresponding to the time interleaver for each physical layer pipe.

Although not explicitly shown in FIG. 1, a broadcast signal transmission/reception system according to an embodiment of the present invention may multiplex/demultiplex one or more pieces of extension layer data in addition to the core layer data and the enhanced layer data. In this case, the extension layer data may be multiplexed at a power level lower than that of the core layer data and the enhanced layer data. Furthermore, when two or more extension layers are included, the injection power level of a second extension layer may be lower than the injection power level of a first extension layer, and the injection power level of a third extension layer may be lower than the injection power level of the second extension layer.

Figure 2:
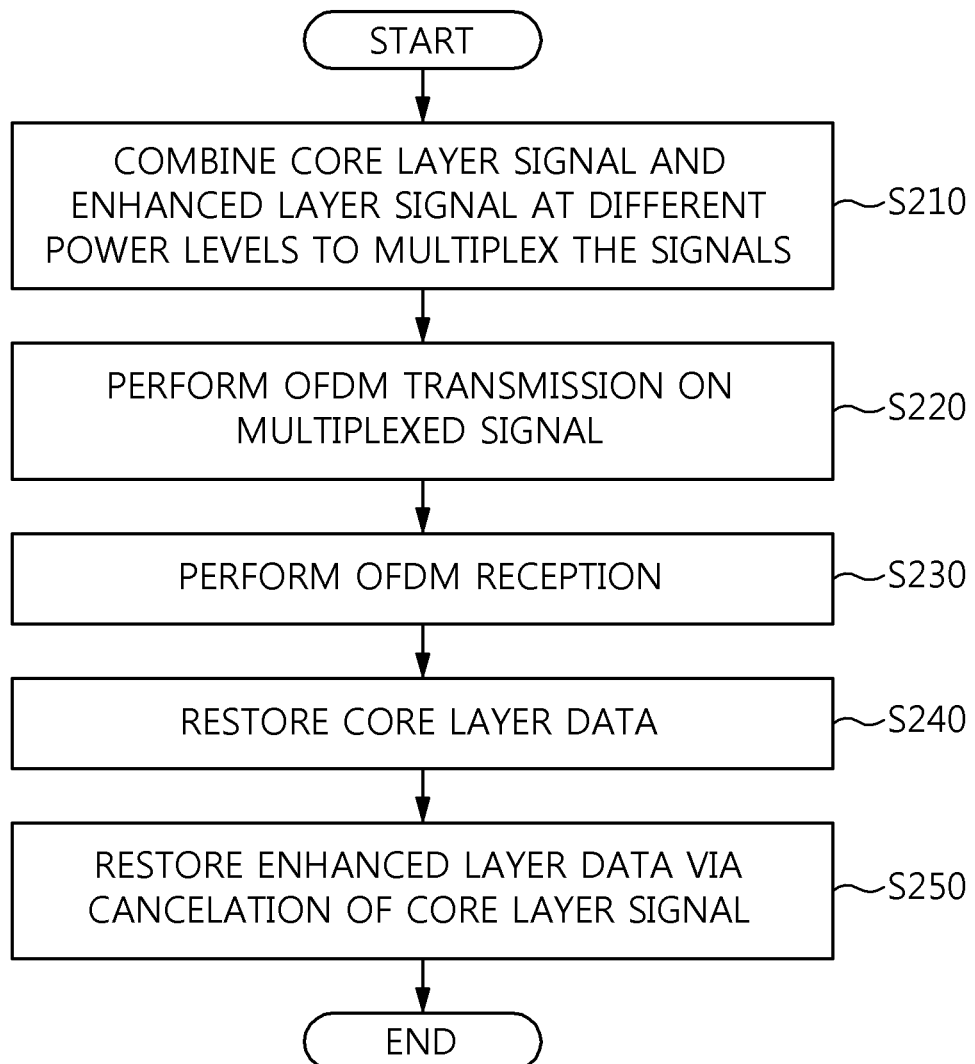
FIG. 2 is an operation flowchart showing a broadcast signal transmission/reception method according to an embodiment of the present invention.

FIG. 2 is an operation flowchart showing a broadcast signal transmission/reception method according to an embodiment of the present invention.

Referring to FIG. 2, in the broadcast signal transmission/reception method according to the embodiment of the present invention, a core layer signal and an enhanced layer signal are combined for multiplexing them to generate a broadcast signal frame at step S210. In this case, the core layer signal and the enhanced layer signal may be combined at different power levels. In this case, the broadcast signal frame may be generated by performing time interleaving, and the preamble of the broadcast signal frame may include a time interleaving mode corresponding to the time interleaving for each of the physical layer pipes (PLPs).

According to an embodiment, the time interleaved signal may be generated by performing time interleaving on the BICM output signal and the broadcast signal frame which include a preamble for signaling a time interleaving mode corresponding to the time interleaving for each of the physical layer pipes may be generated at step S210.

In this case, the physical layer pipes may include a plurality of core layer physical layer pipes corresponding to one complete delivered product, and the core layer physical layer pipes may be not layered division multiplexed.

In this case, each of the core layer physical layer pipes may use either a no time interleaving mode or a hybrid time interleaving mode as the time interleaving mode, and may not use a convolutional interleaving mode.

In this case, all of the core layer physical layer pipes may use an intra-subframe interleaving mode or all of the core layer physical layer pipes may use an inter-subframe interleaving mode, when all of the core layer physical layer pipes use the hybrid time interleaving mode as the time interleaving mode.

In this case, all of the core layer physical layer pipes may be configured with the same value of L1D_plp_ HTI_inter_ subframe when all of the core layer physical layer pipes use the hybrid time interleaving mode as the time interleaving mode.

In this case, all of the core layer physical layer pipes may use the same time interleaving unit ($N_{IU}$) when all of the core layer physical layer pipes use the hybrid time interleaving mode as the time interleaving mode and the inter-subframe interleaving mode.

In this case, any of the core layer physical layer pipes configured with the hybrid time interleaving mode may use the intra-subframe interleaving mode when at least one of the core layer physical layer pipes uses the no time interleaving mode as the time interleaving mode.

In this case, the one complete delivered product may correspond to at least one subframe, and the subframe may be filled with dummy modulation values first and then the actual physical layer pipe data may be overwritten for generating the subframe.

In this case, the dummy modulation values may be generated by using a scrambling sequence generated using a generator polynomial corresponding to $1+X+X^3+X^6+X^7+X_{11}+X_{12}+X^{13}+X^{16}$.

In this case, the dummy modulation values may be generated by mapping a value of the scrambling sequence into one among two phases which are separated by 180 degrees.

In this case, the physical layer pipes may include one enhanced layer physical layer pipe and a plurality of core layer physical layer pipes which are layered-division multiplexed with the one enhanced layer physical layer pipe.

In this case, the time interleaving mode corresponding to the enhanced layer physical layer pipe may be the same as time interleaving modes corresponding to the core layer physical layer pipes with which the enhanced layer physical layer pipe is layered-division multiplexed.

In this case, the time interleaving modes corresponding to the core layer physical layer pipes with which the enhanced layer physical layer pipe is layered-division multiplexed may be all no time interleaving mode or all hybrid time interleaving mode.

In this case, the core layer physical layer pipes with which the enhanced layer physical layer pipe is layered-division multiplexed may all use an intra-subframe interleaving mode, when the time interleaving modes corresponding to the core layer physical layer pipes with which the enhanced layer physical layer pipe is layered-division multiplexed are all hybrid time interleaving mode.

In this case, each of core layer physical layer pipes with which the enhanced layer physical layer pipe is layered-division multiplexed may consist of an integer number of FEC blocks within each subframe, when the time interleaving modes corresponding to the core layer physical layer pipes with which the enhanced layer physical layer pipe is layered-division multiplexed are all no time interleaving mode.

In this case, all of available data cells of the subframe may be filled with dummy modulation values first and then the actual physical layer pipe data may be overwritten for generating the subframe.

In this case, the dummy modulation values may be generated by using a scrambling sequence generated using a generator polynomial corresponding to $1+X+X^3+X^6+X^7+X^{11}+X^{12}+X^{13}+X^{16}$.

In this case, the dummy modulation values may be generated by mapping a value of the scrambling sequence into one among two phases which are separated by 180 degrees.

In this case, the scrambling sequence may be generated by using eight bits which are generated by a third bit output ($x^{14}$), a fourth bit output ($x^{13}$), a fifth bit output ($x^{12}$), a sixth bit output ($x^{11}$), a tenth bit output ($x^7$), thirteenth bit output ($x^4$), fourteenth bit output ($x^3$) and a sixteenth bit output (x) of a shift register initialized by 0xF180 value.

In this case, the broadcast signal frame generated at step S210 may include the bootstrap, the preamble and a superimposed payload. In this case, at least of the bootstrap and the preamble may include L1 signaling information. In this case, the L1 signaling information may include injection level information and normalizing factor information.

In this case, the preamble may include a PLP identification information for identifying Physical Layer Pipes (PLPs); and a layer identification information for identifying layers corresponding to division of layers.

In this case, the PLP identification information and the layer identification information may be included in the preamble as fields different from each other.

In this case, the time interleaver information may be included in the preamble on the basis of a core layer.

In this case, the preamble may selectively include an injection level information corresponding to the injection level controller for each of the Physical Layer Pipes (PLPs) based on a result of comparing the layer identification information with a predetermined value.

In this case, the preamble may include type information, start position information and size information of the Physical Layer Pipes.

In this case, the type information may be for identifying one among a first type corresponding to a non-dispersed physical layer pipe and a second type corresponding to a dispersed physical layer pipe.

In this case, the non-dispersed physical layer pipe may be assigned for contiguous data cell indices, and the dispersed physical layer pipe may include two or more subslices.

In this case, the type information may be selectively signaled according to a result of comparing the layer identification information with a predetermined value for each of the Physical Layer Pipes (PLPs).

In this case, the type information may be signaled only for the core layer.

In this case, the start position information may be identical to an index corresponding to the first data cell of the physical layer pipe.

In this case, the start position information may indicate the start position of the physical layer pipe using cell addressing scheme.

In this case, the start position information may be included in the preamble for each of the Physical Layer Pipes (PLPs) without checking a condition of a conditional statement corresponding to the layer identification information.

In this case, the size information may be generated based on the number of data cells assigned to the physical layer pipe.

In this case, the size information may be included in the preamble for each of the Physical Layer Pipes (PLPs) without checking a condition of a conditional statement corresponding to the layer identification information.

In this case, the time interleaver information may be signaled on the basis of the core layer.

In this case, the generating the time-interleaved signal may use a hybrid time interleaver for performing the interleaving.

In this case, the Physical Layer Pipes (PLPs) of a core layer and an enhanced layer may include only complete FEC blocks.

In this case, the preamble may be for signaling information for identifying a part of a FEC block of the enhanced layer in case that the boundary between the time interleaver groups does not correspond to a boundary between FEC blocks of the enhanced layer, the FEC block corresponding to the boundary between the time interleaver groups.

In this case, the information for identifying the part of the FEC block may include at least one of start position information of a Physical Layer Pipe (PLP) in the core layer, start position information of a Physical Layer Pipe (PLP) in the enhanced layer, modulation information corresponding to the enhanced layer, and FEC type information corresponding to the enhanced layer.

In this case, the start position information of the Physical Layer Pipe (PLP) may correspond to an index of a first data cell of the Physical Layer Pipe (PLP).

In this case, the modulation information may be signaled only if the FEC type information satisfies a predetermined condition.

In this case, the enhanced layer signal corresponds to enhanced layer data that may be restored based on cancellation corresponding to restoration of core layer data corresponding to the core layer signal.

In this case, the generating the time-interleaved signal may use a convolutional time interleaver for performing the interleaving, the time interleaver groups may include the Physical Layer Pipe (PLP) which includes an incomplete FEC block, and the preamble may be for signaling start position information of a first complete FEC block in the Physical Layer Pipe (PLP).

In this case, the interleaving may use one of time interleaver groups, and enhanced layer data corresponding to the one of the time interleaver groups may include dummy values.

In this case, the dummy values may be inserted after the actual data cells of the last Enhanced PLP in a PLP group so that the total number of Enhanced Layer cells in the PLP group is the same as the total number of Core Layer cells in the PLP group.

In this case, the dummy values may be not inserted in core layer data.

In this case, the dummy values may be inserted after core layer and enhanced layer BICMs and before the core layer signal and the enhanced layer signal are combined.

In this case, the dummy values may correspond to a predetermined scrambling sequence.

In this case, the scrambling sequence may be modulated by using the same constellation mapping that is used for the last Enhanced PLP.

In this case, the dummy values may have the same power as the last Enhanced PLP.

In this case, the scrambling sequence may be generated by a 16-bit shift register corresponding to a predetermined generator polynomial.

In this case, the scrambling sequence may be generated by a generator polynomial corresponding to $1+X+X^3+X^6+X^7+X^{11}+X^{12}+X^{13}+X^{16}$.

In this case, the scrambling sequence may be generated by using eight bits which are generated by a third bit output ($x^{14}$), a fourth bit output ($x^{13}$), a fifth bit output ($x^{12}$), a sixth bit output ($x^{11}$), a tenth bit output ($x^7$), thirteenth bit output ($x^4$), fourteenth bit output ($x^3$) and a sixteenth bit output (x) of a shift register initialized by 0xF180 value.

In this case, the interleaving may be performed by using one of a plurality of operation modes.

In this case, the operation modes may include a first mode corresponding to no time interleaving, a second mode for performing a Convolutional time interleaving and a third mode for performing a Hybrid time interleaving.

In this case, the preamble may include a field indicating a start position of a first complete FEC block corresponding to a current Physical Layer Pipe for the first mode and the second mode, and may not include the field indicating the start position of the first FEC block for the third mode.

In this case, the field indicating the start position of the first FEC block may be one of a first field used in the first mode and a second field used in the second mode, and the first field and the second field may have different lengths.

In this case, the length of the second field may be longer than the length of the first field.

In this case, the length of the first field may be determined based on a length of a LDPC codeword and a modulation order and the length of the second field may be determined not only by the length of the LDPC codeword and the modulation order but also by further considering a depth of a Convolutional time interleaver.

In this case, the length of the first field may be 15 bits and the length of the second field may be 22 bits.

In this case, the first field and the second field may be separately signaled for each of a core layer corresponding to the core layer signal and an enhanced layer corresponding to the enhanced layer signal.

Furthermore, in the broadcast signal transmission/reception method according to the embodiment of the present invention, the broadcast signal frame is OFDM transmitted at step S220.

Furthermore, in the broadcast signal transmission/reception method according to the embodiment of the present invention, the transmitted signal is OFDM received at step S230.

In this case, at step S230, synchronization, channel estimation and equalization may be performed.

In this case, the bootstrap may be restored, the preamble may be restored using a signal included in the restored bootstrap, and the data signal may be restored using the signaling information included in the preamble at step S230.

Furthermore, in the broadcast signal transmission/reception method according to the embodiment of the present invention, core layer data is restored from the received signal at step S240.

Furthermore, in the broadcast signal transmission/reception method according to the embodiment of the present invention, enhanced layer data is restored via the cancellation of the core layer signal at step S250.

In particular, steps S240 and S250 shown in FIG. 2 may correspond to demultiplexing operations corresponding to step S210.

As will be described in detail later, step S210 shown in FIG. 2 may include generating a time-interleaved signal by performing time interleaving on a BICM output signal; and generating a broadcast signal frame including a preamble for signaling a time interleaving mode corresponding to the time interleaving for each of the physical layer pipes (PLPs) in case of a single layer. In this case, the broadcast signal transmission method of steps S210 and S220 may be viewed as including generating a time-interleaved signal by performing time interleaving on a BICM output signal; generating a broadcast signal frame including a preamble for signaling a time interleaving mode corresponding to the time interleaving for each of the physical layer pipes (PLPs); and transmitting the broadcast signal frame using an OFDM communication scheme through an antenna in case of a single layer.

As will be described in detail later, step S210 shown in FIG. 2 may include generating a multiplexed signal by combining a core layer signal and an enhanced layer signal; performing power-normalizing for reducing the power of the multiplexed signal to a power level corresponding to the core layer signal; generating a time-interleaved signal by performing time interleaving after performing the power-normalizing; and generating a broadcast signal frame including a preamble for signaling a time interleaving mode corresponding to the time interleaving for each of the physical layer pipes (PLPs). In this case, the time interleaving may use one of time interleaver groups, and enhanced layer data corresponding to the one of time interleaver groups may include dummy values. In this case, the broadcast signal transmission method of steps S210 and S220 may be viewed as including generating a multiplexed signal by combining a core layer signal and an enhanced layer signal; performing power-normalizing for reducing the power of the multiplexed signal to a power level corresponding to the core layer signal; generating a time-interleaved signal by performing time interleaving after performing the power-normalizing; generating a broadcast signal frame including a preamble for signaling a time interleaving mode corresponding to the time interleaving for each of the physical layer pipes (PLPs); and transmitting the broadcast signal frame using an OFDM communication scheme through an antenna. In this case, the time interleaving may use one of time interleaver groups, and enhanced layer data corresponding to the one of the time interleaver groups may include dummy values.

As will be described in detail later, steps S240 and S250 shown in FIG. 2 may include generating a time-deinterleaved signal by applying time deinterleaving to a received signal corresponding to a broadcast signal frame; increasing the power of the received signal or the time-deinterleaved signal by a level corresponding to a reduction in power by the power normalizer of the transmitter; restoring core layer data from the power-adjusted signal; extracting an enhanced layer signal by performing cancellation corresponding to the core layer data on the power-adjusted signal; increasing the power of the enhanced layer signal by a level corresponding to a reduction in power by the injection level controller of the transmitter; and restoring enhanced layer data using the power-adjusted enhanced signal. In this case, a broadcast signal reception method according to an embodiment of the present invention may be viewed as including: generating a received signal by performing any one or more of synchronization, channel estimation and equalization on a transmitted signal corresponding to a broadcast signal frame; generating a time-deinterleaved signal by applying time deinterleaving to the received signal; increasing the power of the received signal or the time-deinterleaved signal by a level corresponding to a reduction in power by the power normalizer of the transmitter; restoring core layer data from the power-adjusted signal; extracting an enhanced layer signal by performing cancellation corresponding to the core layer data on the power-adjusted signal; increasing the power of the enhanced layer signal by a level corresponding to a reduction in power by the injection level controller of the transmitter; and restoring enhanced layer data using the power-adjusted enhanced layer signal.

In this case, the time deinterleaving may correspond to the time interleaving mode.

In this case, the preamble may include the time interleaving mode corresponding to the time interleaving for each physical layer pipe.

In this case, the time deinterleaving may perform the deinterleaving by using one of a plurality of operation modes.

In this case, the time deinterleaving may use one of time interleaver groups, and enhanced layer data corresponding to the one of time interleaver groups may include dummy values.

Figure 3:
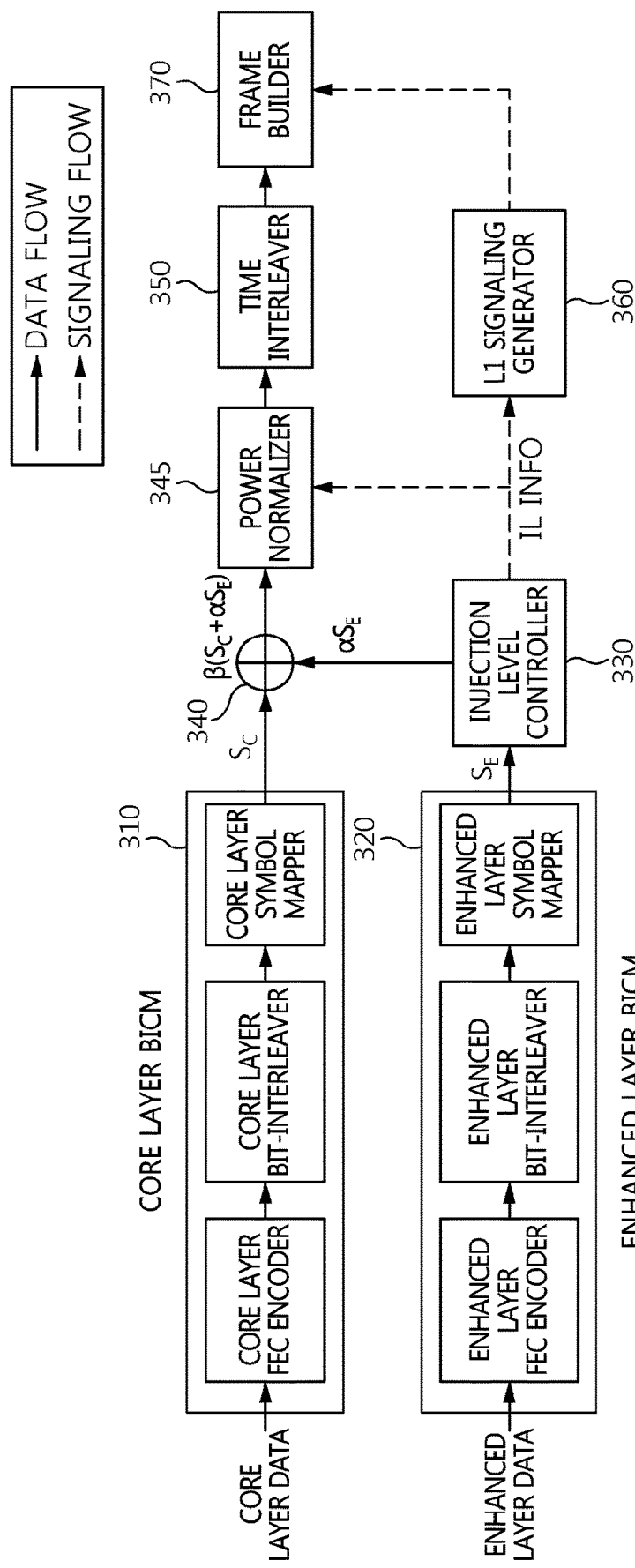
FIG. 3 is a block diagram showing an example of the apparatus for generating broadcast signal frame in FIG. 1.

FIG. 3 is a block diagram showing an example of the apparatus for generating broadcast signal frame in FIG. 1.

Referring to FIG. 3, the apparatus for generating broadcast signal frame according to an embodiment of the present invention may include a core layer BICM unit 310, an enhanced layer BICM unit 320, an injection level controller 330, a combiner 340, a power normalizer 345, and a time interleaver 350, a signaling generation unit 360, and a frame builder 370.

Generally, a BICM device includes an error correction encoder, a bit interleaver, and a symbol mapper. Each of the core layer BICM unit 310 and the enhanced layer BICM unit 320 shown in FIG. 3 may include an error correction encoder, a bit interleaver, and a symbol mapper. In particular, each of the error correction encoders (the core layer FEC encoder, and the enhanced layer FEC encoder) shown in FIG. 3 may be formed by connecting a BCH encoder and an LDPC encoder in series. In this case, the input of the error correction encoder is input to the BCH encoder, the output of the BCH encoder is input to the LDPC encoder, and the output of the LDPC encoder may be the output of the error correction encoder.

As shown in FIG. 3, core layer data and enhanced layer data pass through respective different BICM units, and are then combined by the combiner 340. That is, the term "Layered Division Multiplexing (LDM)" used herein may refer to combining the pieces of data of a plurality of layers into a single piece of data using differences in power and then transmitting the combined data.

That is, the core layer data passes through the core layer BICM unit 310, the enhanced layer data passes through the enhanced layer BICM unit 320 and then the injection level controller 330, and the core layer data and the enhanced layer data are combined by the combiner 340. In this case, the enhanced layer BICM unit 320 may perform BICM encoding different from that of the core layer BICM unit 310. That is, the enhanced layer BICM unit 320 may perform higher bit rate error correction encoding or symbol mapping than the core layer BICM unit 310. Furthermore, the enhanced layer BICM unit 320 may perform less robust error correction encoding or symbol mapping than the core layer BICM unit 310.

For example, the core layer error correction encoder may exhibit a lower bit rate than the enhanced layer error correction encoder. In this case, the enhanced layer symbol mapper may be less robust than the core layer symbol mapper.

The combiner 340 may be viewed as functioning to combine the core layer signal and the enhanced layer signal. In this case, the combiner 340 may combine the core layer signal and the enhanced layer signal at different power levels. In an embodiment, power level adjustment may be performed on the core layer signal rather than the enhanced layer signal. In this case, the power of the core layer signal may be adjusted to be higher than the power of the enhanced layer signal.

The core layer data may use forward error correction (FEC) code having a low code rate in order to perform robust reception, while the enhanced layer data may use FEC code having a high code rate in order to achieve a high data transmission rate.

That is, the core layer data may have a broader coverage than the enhanced layer data in the same reception environment.

The enhanced layer data having passed through the enhanced layer BICM unit 320 is adjusted in gain (or power) by the injection level controller 330, and is combined with the core layer data by the combiner 340.

That is, the injection level controller 330 generates a power-reduced enhanced layer signal by reducing the power of the enhanced layer signal. In this case, the magnitude of the signal adjusted by the injection level controller 330 may be determined based on an injection level. In this case, an injection level in the case where signal B is inserted into signal A may be defined by Equation 1 below:

$$Injection level(\text{dB}) = -10\log_{10}\left(\frac{Signal power \text{ of } B}{Signal power \text{ of } A}\right) \quad (1)$$

For example, assuming that the injection level is 3 dB when the enhanced layer signal is inserted into the core layer signal, Equation 1 means that the enhanced layer signal has power corresponding to half of the power of the core layer signal.

In this case, the injection level controller 330 may adjust the power level of the enhanced layer signal from 0 dB to 25.0 dB in steps of 0.5 dB or 1 dB.

In general, transmission power that is assigned to the core layer is higher than transmission power that is assigned to the enhanced layer, which enables the receiver to decode core layer data first.

In this case, the combiner 340 may be viewed as generating a multiplexed signal by combining the core layer signal with the power-reduced enhanced layer signal.

The signal obtained by the combination of the combiner 340 is provided to the power normalizer 345 so that the power of the signal can be reduced by a power level corresponding to an increase in power caused by the combination of the core layer signal and the enhanced layer signal, and then power adjustment is performed. That is, the power normalizer 345 reduces the power of the signal, obtained by the multiplexing of the combiner 340, to a power level corresponding to the core layer signal. Since the level of the combined signal is higher than the level of one layer signal, the power normalizing of the power normalizer 345 is required in order to prevent amplitude clipping, etc. in the remaining portion of a broadcast signal transmission/reception system.

In this case, the power normalizer 345 may adjust the magnitude of the combined signal to an appropriate value by multiplying the magnitude of the combined signal by the normalizing factor of Equation 2 below. Injection level information used to calculate Equation 2 below may be transferred to the power normalizer 345 via a signaling flow:

$$\text{Normalizing factor} = (\sqrt{(1+10^{-Injectionlevel(dB)/10})})^{-1} \quad (2)$$

Assuming that the power levels of the core layer signal and the enhanced layer signal are normalized to 1 when an enhanced layer signal $S_E$ is injected into a core layer signal $S_C$ at a preset injection level, a combined signal may be expressed by $S_C + \alpha S_E$.

In this case, $\alpha$ is scaling factors corresponding to various injection levels. That is, the injection level controller 330 may correspond to the scaling factor.

For example, when the injection level of an enhanced layer is 3 dB, a combined signal may be expressed by $$S_C + \sqrt{\frac{1}{2}} S_E.$$

Since the power of a combined signal (a multiplexed signal) increases compared to a core layer signal, the power normalizer 345 needs to mitigate the increase in power.

The output of the power normalizer 345 may be expressed by $\beta(S_C + S_E)$.

In this case, $\beta$ is normalizing factors based on various injection levels of the enhanced layer.

When the injection level of the enhanced layer is 3 dB, the power of the combined signal is increased by 50% compared to that of the core layer signal. Accordingly, the output of the power normalizer 345 may be expressed by $$\sqrt{\frac{2}{3}} \left( S_C + \sqrt{\frac{1}{2}} S_E \right).$$

Table 1 below lists scaling factors $\alpha$ and normalizing factors $\beta$ for various injection levels (CL: Core Layer, EL: Enhanced Layer). The relationships among the injection level, the scaling factor $\alpha$ and the normalizing factor $\beta$ may be defined by Equation 3 below:

$$\begin{cases} \alpha = 10^{\left(\frac{-Injectionlevel}{20}\right)} \\ \beta = \dfrac{1}{\sqrt{1+\alpha^2}} \end{cases} \quad (3)$$

TABLE 1

| EL Injection level relative to CL | Scaling factor α | Normalizing factor β |
|---|---|---|
| 3.0 dB | 0.7079458 | 0.8161736 |
| 3.5 dB | 0.6683439 | 0.8314061 |
| 4.0 dB | 0.6309573 | 0.8457262 |
| 4.5 dB | 0.5956621 | 0.8591327 |
| 5.0 dB | 0.5623413 | 0.8716346 |
| 5.5 dB | 0.5308844 | 0.8832495 |

TABLE 1-continued

| EL Injection level relative to CL | Scaling factor α | Normalizing factor β |
|---|---|---|
| 6.0 dB | 0.5011872 | 0.8940022 |
| 6.5 dB | 0.4731513 | 0.9039241 |
| 7.0 dB | 0.4466836 | 0.9130512 |
| 7.5 dB | 0.4216965 | 0.9214231 |
| 8.0 dB | 0.3981072 | 0.9290819 |
| 8.5 dB | 0.3758374 | 0.9360712 |
| 9.0 dB | 0.3548134 | 0.9424353 |
| 9.5 dB | 0.3349654 | 0.9482180 |
| 10.0 dB | 0.3162278 | 0.9534626 |

According to the embodiments, the injection level may be a value from 0 dB to 25 dB. In case that the injection level is 0 dB, the core layer signal and the enhanced layer signal may be combined at the same power. In this case, the scaling factor may be 1, and the normalizing factor may be 0.7071068.

That is, the power normalizer 345 corresponds to the normalizing factor, and reduces the power of the multiplexed signal by a level by which the combiner 340 has increased the power.

In this case, each of the normalizing factor and the scaling factor may be a rational number that is larger than 0 and smaller than 1.

In this case, the scaling factor may decrease as a reduction in power corresponding to the injection level controller 330 becomes larger, and the normalizing factor may increase as a reduction in power corresponding to the injection level controller 330 becomes larger.

The power normalized signal passes through the time interleaver 350 for distributing burst errors occurring over a channel.

In this case, the time interleaver 350 may be viewed as performing interleaving that is applied to both the core layer signal and the enhanced layer signal. That is, the core layer and the enhanced layer share the time interleaver, thereby preventing the unnecessary use of memory and also reducing latency at the receiver.

Although will be described later in greater detail, the enhanced layer signal may correspond to enhanced layer data restored based on cancellation corresponding to the restoration of core layer data corresponding to the core layer signal. The combiner 340 may combine one or more extension layer signals having power levels lower than those of the core layer signal and the enhanced layer signal with the core layer signal and the enhanced layer signal.

Meanwhile, L1 signaling information including injection level information is encoded by the signaling generation unit 360 including signaling-dedicated BICM. In this case, the signaling generation unit 360 may receive injection level information IL INFO from the injection level controller 330, and may generate an L1 signaling signal.

In L1 signaling, L1 refers to Layer-1 in the lowest layer of the ISO 7 layer model. In this case, the L1 signaling may be included in a preamble.

In general, the L1 signaling may include an FFT size, a guard interval size, etc., i.e., the important parameters of the OFDM transmitter, a channel code rate, modulation information, etc., i.e., BICM important parameters. This L1 signaling signal is combined with data signal into a broadcast signal frame.

The frame builder 370 generates a broadcast signal frame by combining the L1 signaling signal with a data signal. In this case, the frame builder 370 may generate the broadcast signal frame including a preamble for signaling size information of Physical Layer Pipes (PLPs) and time interleaver information shared by the core layer signal and the enhanced layer signal, using the time interleaved signal. In this case, the broadcast signal frame may further include a bootstrap.

In this case, the frame builder 370 may generate the broadcast signal frame which includes a preamble for signaling a time interleaving mode corresponding to the time interleaver 350.

In this case, the time interleaving mode may be signaled for each of the physical layer pipes (PLPs).

In this case, the physical layer pipes may include one enhanced layer physical layer pipe and a plurality of core layer physical layer pipes which are layered-division multiplexed with the one enhanced layer physical layer pipe.

In this case, the time interleaving mode corresponding to the enhanced layer physical layer pipe may be the same as time interleaving modes corresponding to the core layer physical layer pipes with which the enhanced layer physical layer pipe is layered-division multiplexed.

In this case, the time interleaving modes corresponding to the core layer physical layer pipes with which the enhanced layer physical layer pipe is layered-division multiplexed may be all no time interleaving mode or all hybrid time interleaving mode.

In this case, the core layer physical layer pipes with which the enhanced layer physical layer pipe is layered-division multiplexed may all use an intra-subframe interleaving mode, when the time interleaving modes corresponding to the core layer physical layer pipes with which the enhanced layer physical layer pipe is layered-division multiplexed are all hybrid time interleaving mode.

In this case, each of core layer physical layer pipes with which the enhanced layer physical layer pipe is layered-division multiplexed may consist of an integer number of FEC blocks within each subframe, when the time interleaving modes corresponding to the core layer physical layer pipes with which the enhanced layer physical layer pipe is layered-division multiplexed are all no time interleaving mode.

In this case, all of available data cells of the subframe may be filled with dummy modulation values first and then the actual physical layer pipe data may be overwritten for generating the subframe.

In this case, the dummy modulation values may be generated by using a scrambling sequence generated using a generator polynomial corresponding to $1+X+X^3+X^6+X^7+X^{11}+X_{12}+X^{13}+X^{16}$.

In this case, the dummy modulation values may be generated by mapping a value of the scrambling sequence into one among two phases which are separated by 180 degrees.

In this case, the scrambling sequence may be generated by using eight bits which are generated by a third bit output ($x^{14}$), a fourth bit output ($x^{13}$), a fifth bit output ($x^{12}$), a sixth bit output ($x^{11}$), a tenth bit output ($x^7$), thirteenth bit output ($x^4$), fourteenth bit output ($x^3$) and a sixteenth bit output (x) of a shift register initialized by 0xF180 value.

The enhanced layer BICM unit 320, the injection level controller 330, the combiner 340 and the power normalizer 345 may be omitted in case of a single layer. In this case, the time interleaver 350 may generate the time-interleaved signal by performing time interleaving on the BICM output signal of the core layer BICM unit 310. Moreover, the frame builder 370 may generate the broadcast signal frame which includes a preamble for signaling a time interleaving mode corresponding to the time interleaver 350 for each of the physical layer pipes (PLPs).

In this case, the physical layer pipes may include a plurality of core layer physical layer pipes corresponding to one complete delivered product, and the core layer physical layer pipes may be not layered division multiplexed.

In this case, each of the core layer physical layer pipes may use either a no time interleaving mode or a hybrid time interleaving mode as the time interleaving mode, and may not use a convolutional interleaving mode.

In this case, all of the core layer physical layer pipes may use an intra-subframe interleaving mode or all of the core layer physical layer pipes may use an inter-subframe interleaving mode, when all of the core layer physical layer pipes use the hybrid time interleaving mode as the time interleaving mode.

In this case, all of the core layer physical layer pipes may be configured with the same value of L1D_plp_HTI_inter_subframe when all of the core layer physical layer pipes use the hybrid time interleaving mode as the time interleaving mode.

In this case, all of the core layer physical layer pipes may use the same time interleaving unit ($N_{IU}$) when all of the core layer physical layer pipes use the hybrid time interleaving mode as the time interleaving mode and the inter-subframe interleaving mode.

In this case, any of the core layer physical layer pipes configured with the hybrid time interleaving mode may use the intra-subframe interleaving mode when at least one of the core layer physical layer pipes uses the no time interleaving mode as the time interleaving mode.

In this case, the one complete delivered product may correspond to at least one subframe, and the subframe may be filled with dummy modulation values first and then the actual physical layer pipe data may be overwritten for generating the subframe.

In this case, the dummy modulation values may be generated by using a scrambling sequence generated using a generator polynomial corresponding to $1+X+X^3+X^6+X^7+X^{11}+X_{12}+X^{13}+X^{16}$.

In this case, the dummy modulation values may be generated by mapping a value of the scrambling sequence into one among two phases which are separated by 180 degrees.

In this case, the time interleaver 350 may use one of time interleaver groups, a boundary between the time interleaver groups may be a boundary between Physical Layer Pipes (PLPs) of a core layer corresponding to the core layer signal. That is, one of boundaries between Physical Layer Pipes (PLPs) of the core layer may be a boundary between the time interleaver groups.

In this case, enhanced layer data corresponding to the one of the time interleaver groups may include dummy values.

In this case, the dummy values may be inserted after the actual data cells of the last Enhanced PLP in a PLP group so that the total number of Enhanced Layer cells in the PLP group is the same as the total number of Core Layer cells in the PLP group.

In this case, the dummy values may be not inserted in core layer data.

In this case, the dummy values may be inserted after core layer and enhanced layer BICMs and before the core layer signal and the enhanced layer signal are combined.

In this case, the dummy values may correspond to a predetermined scrambling sequence.

In this case, the scrambling sequence may be modulated by using the same constellation mapping that is used for the last Enhanced PLP.

In this case, the dummy values may have the same power as the last Enhanced PLP.

In this case, the scrambling sequence may be generated by a 16-bit shift register corresponding to a predetermined generator polynomial.

In this case, the scrambling sequence may be generated by a generator polynomial corresponding to $1+X+X^3+X^6+X^7+X^{11}+X^{12}+X^{13}+X^{16}$.

In this case, the scrambling sequence may be generated by using eight bits which are generated by a third bit output ($x^{14}$), a fourth bit output ($x^{13}$), a fifth bit output ($x^{12}$), a sixth bit output ($x^{11}$), a tenth bit output (x), thirteenth bit output ($x^4$), fourteenth bit output ($x^3$) and a sixteenth bit output (x) of a shift register initialized by 0xF180 value.

In this case, the time interleaver information may be signaled on the basis of the core layer.

According to an embodiment, a part of the time interleaver information may be signaled on the basis of the core layer, and the other part of the time interleaver information may be signaled regardless of the layers.

That is, the time interleaver information may be signaled based on the layer identification information corresponding to the core layer.

In this case, the time interleaver 350 may correspond to a hybrid time interleaver. In this case, the Physical Layer Pipes (PLPs) of a core layer and an enhanced layer may include only complete FEC blocks.

In this case, the preamble may be for signaling information for identifying a part of a FEC block in the enhanced layer in case that the boundary between the time interleaver groups does not correspond to a boundary between FEC blocks in the enhanced layer, the FEC block corresponding to the boundary between the time interleaver groups.

In this case, the information for identifying the part of the FEC block may include at least one of start position information of a Physical Layer Pipe (PLP) in the core layer, start position information of a Physical Layer Pipe (PLP) in the enhanced layer, modulation information corresponding to the enhanced layer, and FEC type information corresponding to the enhanced layer.

In this case, the start position information of the Physical Layer Pipe (PLP) may correspond to an index of a first data cell of the Physical Layer Pipe (PLP).

In this case, the modulation information may be signaled only if the FEC type information satisfies a predetermined condition.

In this case, the enhanced layer signal may correspond to enhanced layer data that is restored based on cancellation corresponding to restoration of core layer data corresponding to the core layer signal.

In this case, the time interleaver 350 may correspond to a convolutional time interleaver, the time interleaver groups may include the Physical Layer Pipe (PLP) which includes an incomplete FEC block, and the preamble may be for signaling start position information of a first complete FEC block in the Physical Layer Pipe (PLP).

In this case, the time interleaver 350 may perform the interleaving by using one of a plurality of operation modes.

In this case, the operations modes may include a first mode (L1D_plp_TI_mode=00) corresponding to no time interleaving, a second mode (L1D_plp_TI_mode=01) for performing a Convolutional time interleaving and a third mode (L1D_plp_TI_mode=10) for performing a Hybrid time interleaving.

In this case, the preamble may include a field indicating a start position of a first complete FEC block corresponding to a current Physical Layer Pipe for the first mode and the second mode, and may not include the field indicating the start position of the first FEC block for the third mode.

In this case, the field indicating the start position of the first FEC block may be one of a first field (L1D_plp_fec_block_start) used in the first mode (L1D_plp_TI_mode=00) and a second field (L1D_plp_CTI_fec_block_start) used in the second mode (L1D_plp_TI_mode=01), and the first field and the second field may have different lengths. In this case, the first field (L1D_plp_fec_block_start) may indicate a start position of a first FEC block starting in a current Physical Layer Pipe during a current subframe and the second field (L1D_plp_CTI_fec_block_start) may indicate a start position of a first complete FEC block of a current Physical Layer Pipe leaving a Convolutional time interleaver in current or subsequent subframes. In this case, both the first field (L1D_plp_fec_block_start) and the second field (L1D_plp_CTI_fec_block_start) may be signaled based on after interleaving. In particular, in the case of the second field (L1D_plp_CTI_fec_block_start), the number of bits required for signaling may increase when the signaling is performed based on after interleaving.

In this case, the length of the second field may be longer than the length of the first field.

In this case, the length of the first field may be determined based on a length of a LDPC codeword and a modulation order and the length of the second field may be determined not only by the length of the LDPC codeword and the modulation order but also by further considering a depth of a Convolutional time interleaver.

In this case, the length of the first field may be 15 bits and the length of the second field may be 22 bits.

In this case, the first field and the second field may be separately signaled for each of a core layer corresponding to the core layer signal and an enhanced layer corresponding to the enhanced layer signal.

In this case, the frame builder 370 may include a bootstrap generator configured to generate the bootstrap, a preamble generator configured to generate the preamble, and a superimposed payload generator configured to generate a superimposed payload corresponding to the time-interleaved signal.

In this case, the bootstrap may be shorter than the preamble, and have a fixed-length.

In this case, the bootstrap may include a symbol representing a structure of the preamble, the symbol corresponding to a fixed-length bit string representing a combination of a modulation scheme/code rate, a FFT size, a guard interval length and a pilot pattern of the preamble.

In this case, the symbol may correspond to a lookup table in which a preamble structure corresponding to a second FFT size is allocated prior to a preamble structure corresponding to a first FFT size, the second FFT size being less than the first FFT size when the modulation scheme/code rates are the same, and a preamble structure corresponding to a second guard interval length is allocated prior to a preamble structure corresponding to a first guard interval length, the second guard interval length being longer than the first guard interval length when the modulation scheme/code rates are the same and the FFT sizes are the same.

The broadcast signal frame may be transmitted via the OFDM transmitter that is robust to a multi-path and the Doppler phenomenon. In this case, the OFDM transmitter may be viewed as being responsible for the transmission signal generation of the next generation broadcasting system.

In this case, the preamble may include a PLP identification information for identifying Physical Layer Pipes (PLPs); and a layer identification information for identifying layers corresponding to division of layers.

In this case, the PLP identification information and the layer identification information may be included in the preamble as fields different from each other.

In this case, the time interleaver information may be included in the preamble on the basis of a core layer.

In this case, the preamble may selectively include an injection level information corresponding to the injection level controller for each of the Physical Layer Pipes (PLPs) based on a result of comparing (IF(j>0)) the layer identification information with a predetermined value.

In this case, the preamble may include type information, start position information and size information of the Physical Layer Pipes.

In this case, the type information may be for identifying one among a first type corresponding to a non-dispersed physical layer pipe and a second type corresponding to a dispersed physical layer pipe.

In this case, the non-dispersed physical layer pipe may be assigned for contiguous data cell indices, and the dispersed physical layer pipe may include two or more subslices.

In this case, the type information may be selectively signaled according to a result of comparing the layer identification information with a predetermined value for each of the Physical Layer Pipes (PLPs).

In this case, the type information may be signaled only for the core layer.

In this case, the start position information may be identical to an index corresponding to the first data cell of the physical layer pipe.

In this case, the start position information may indicate the start position of the physical layer pipe using cell addressing scheme.

In this case, the start position information may be included in the preamble for each of the Physical Layer Pipes (PLPs) without checking a condition of a conditional statement corresponding to the layer identification information.

In this case, the size information may be generated based on the number of data cells assigned to the physical layer pipe.

In this case, the size information may be included in the preamble for each of the Physical Layer Pipes (PLPs) without checking a condition of a conditional statement corresponding to the layer identification information.

Figure 4:
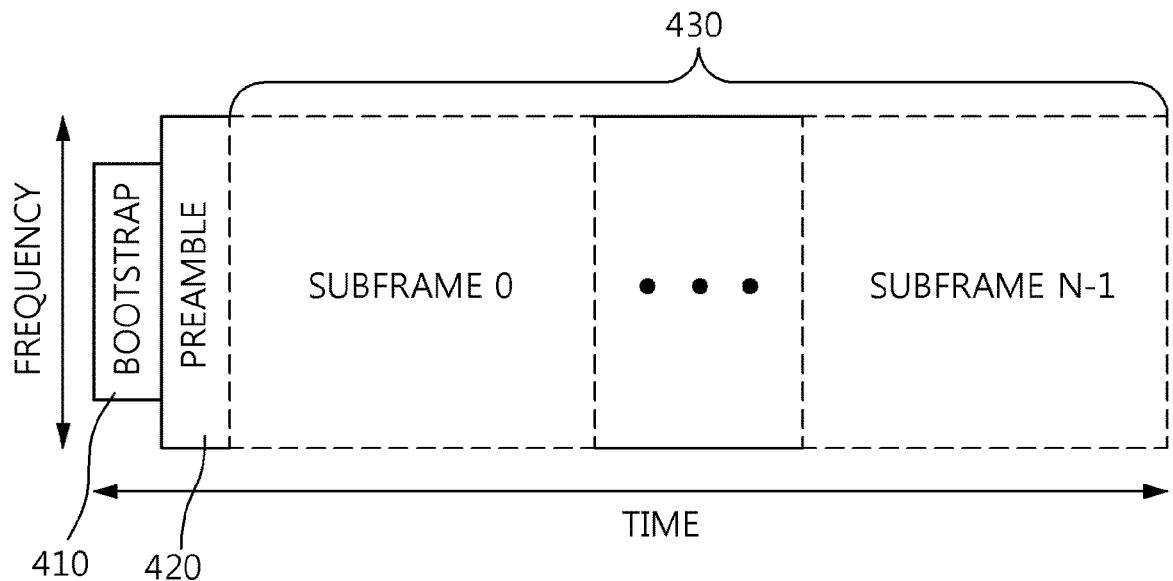
FIG. 4 is a diagram showing an example of the structure of a broadcast signal frame.

FIG. 4 is a diagram showing an example of the structure of a broadcast signal frame.

Referring to FIG. 4, a broadcast signal frame includes the bootstrap 410, the preamble 420 and the super-imposed payload 430.

The frame shown in FIG. 4, may be included in the super-frame.

In this case, the broadcast signal frame may include at least one of OFDM symbols. The broadcast signal frame may include a reference symbol or a pilot symbol.

The frame structure in which the Layered Division Multiplexing (LDM) is applied includes the bootstrap 410, the preamble 420 and the super-imposed payload 430 as shown in FIG. 4.

In this case, the bootstrap 410 and the preamble 420 may be seen as the two hierarchical preambles.

In this case, the bootstrap 410 may have a shorter length than the preamble 420 for the fast acquisition and detection. In this case, the bootstrap 410 may have a fixed-length. In this case, the bootstrap may include a fixed-length symbol. For example, the bootstrap 410 may consist of four OFDM symbols each of which has 0.5 ms length so that the bootstrap 410 may correspond to the fixed time length of 2 ms.

In this case, the bootstrap 410 may have a fixed bandwidth, and the preamble 420 and the super-imposed payload 430 may have a variable bandwidth wider than the bootstrap 410.

The preamble 420 may transmit detailed signaling information using a robust LDPC code. In this case, the length of the preamble 420 can be varied according to the signaling information.

In this case, both the bootstrap 410 and the payload 430 may be seen as a common signal which is shared by a plurality of layers.

The super-imposed payload 430 may correspond to a multiplexed signal of at least two layer signals. In this case, the super-imposed payload 430 may be generated by combining a core layer payload and an enhanced layer payload at different power levels. In this case, the core layer payload may include am in-band signaling section. In this case, the in-band signaling section may include signaling information for the enhanced layer service.

In this case, the bootstrap 410 may include a symbol representing a preamble structure.

In this case, the symbol which included in the bootstrap for representing the preamble structure may be set as shown in the Table 2 below.

TABLE 2

| preamble_structure | L1-Basic Mode | FFT Size | GI Length (samples) | Pilot Pattern (DX) |
|---|---|---|---|---|
| 0 | L1-Basic Mode 1 | 8192 | 2048 | 3 |
| 1 | L1-Basic Mode 1 | 8192 | 1536 | 4 |
| 2 | L1-Basic Mode 1 | 8192 | 1024 | 3 |
| 3 | L1-Basic Mode 1 | 8192 | 768 | 4 |
| 4 | L1-Basic Mode 1 | 16384 | 4096 | 3 |
| 5 | L1-Basic Mode 1 | 16384 | 3648 | 4 |
| 6 | L1-Basic Mode 1 | 16384 | 2432 | 3 |
| 7 | L1-Basic Mode 1 | 16384 | 1536 | 4 |
| 8 | L1-Basic Mode 1 | 16384 | 1024 | 6 |
| 9 | L1-Basic Mode 1 | 16384 | 768 | 8 |
| 10 | L1-Basic Mode 1 | 32768 | 4864 | 3 |
| 11 | L1-Basic Mode 1 | 32768 | 3648 | 3 |
| 12 | L1-Basic Mode 1 | 32768 | 3648 | 8 |
| 13 | L1-Basic Mode 1 | 32768 | 2432 | 6 |
| 14 | L1-Basic Mode 1 | 32768 | 1536 | 8 |
| 15 | L1-Basic Mode 1 | 32768 | 1024 | 12 |
| 16 | L1-Basic Mode 1 | 32768 | 768 | 16 |
| 17 | L1-Basic Mode 2 | 8192 | 2048 | 3 |
| 18 | L1-Basic Mode 2 | 8192 | 1536 | 4 |
| 19 | L1-Basic Mode 2 | 8192 | 1024 | 3 |
| 20 | L1-Basic Mode 2 | 8192 | 768 | 4 |
| 21 | L1-Basic Mode 2 | 16384 | 4096 | 3 |
| 22 | L1-Basic Mode 2 | 16384 | 3648 | 4 |
| 23 | L1-Basic Mode 2 | 16384 | 2432 | 3 |
| 24 | L1-Basic Mode 2 | 16384 | 1536 | 4 |
| 25 | L1-Basic Mode 2 | 16384 | 1024 | 6 |
| 26 | L1-Basic Mode 2 | 16384 | 768 | 8 |
| 27 | L1-Basic Mode 2 | 32768 | 4864 | 3 |
| 28 | L1-Basic Mode 2 | 32768 | 3648 | 3 |
| 29 | L1-Basic Mode 2 | 32768 | 3648 | 8 |
| 30 | L1-Basic Mode 2 | 32768 | 2432 | 6 |
| 31 | L1-Basic Mode 2 | 32768 | 1536 | 8 |
| 32 | L1-Basic Mode 2 | 32768 | 1024 | 12 |
| 33 | L1-Basic Mode 2 | 32768 | 768 | 16 |
| 34 | L1-Basic Mode 3 | 8192 | 2048 | 3 |
| 35 | L1-Basic Mode 3 | 8192 | 1536 | 4 |
| 36 | L1-Basic Mode 3 | 8192 | 1024 | 3 |
| 37 | L1-Basic Mode 3 | 8192 | 768 | 4 |

TABLE 2-continued

| pre-amble_structure | L1-Basic Mode | FFT Size | GI Length (samples) | Pilot Pattern (DX) |
|---|---|---|---|---|
| 38 | L1-Basic Mode 3 | 16384 | 4096 | 3 |
| 39 | L1-Basic Mode 3 | 16384 | 3648 | 4 |
| 40 | L1-Basic Mode 3 | 16384 | 2432 | 3 |
| 41 | L1-Basic Mode 3 | 16384 | 1536 | 4 |
| 42 | L1-Basic Mode 3 | 16384 | 1024 | 6 |
| 43 | L1-Basic Mode 3 | 16384 | 768 | 8 |
| 44 | L1-Basic Mode 3 | 32768 | 4864 | 3 |
| 45 | L1-Basic Mode 3 | 32768 | 3648 | 3 |
| 46 | L1-Basic Mode 3 | 32768 | 3648 | 8 |
| 47 | L1-Basic Mode 3 | 32768 | 2432 | 6 |
| 48 | L1-Basic Mode 3 | 32768 | 1536 | 8 |
| 49 | L1-Basic Mode 3 | 32768 | 1024 | 12 |
| 50 | L1-Basic Mode 3 | 32768 | 768 | 16 |
| 51 | L1-Basic Mode 4 | 8192 | 2048 | 3 |
| 52 | L1-Basic Mode 4 | 8192 | 1536 | 4 |
| 53 | L1-Basic Mode 4 | 8192 | 1024 | 3 |
| 54 | L1-Basic Mode 4 | 8192 | 768 | 4 |
| 55 | L1-Basic Mode 4 | 16384 | 4096 | 3 |
| 56 | L1-Basic Mode 4 | 16384 | 3648 | 4 |
| 57 | L1-Basic Mode 4 | 16384 | 2432 | 3 |
| 58 | L1-Basic Mode 4 | 16384 | 1536 | 4 |
| 59 | L1-Basic Mode 4 | 16384 | 1024 | 6 |
| 60 | L1-Basic Mode 4 | 16384 | 768 | 8 |
| 61 | L1-Basic Mode 4 | 32768 | 4864 | 3 |
| 62 | L1-Basic Mode 4 | 32768 | 3648 | 3 |
| 63 | L1-Basic Mode 4 | 32768 | 3648 | 8 |
| 64 | L1-Basic Mode 4 | 32768 | 2432 | 6 |
| 65 | L1-Basic Mode 4 | 32768 | 1536 | 8 |
| 66 | L1-Basic Mode 4 | 32768 | 1024 | 12 |
| 67 | L1-Basic Mode 4 | 32768 | 768 | 16 |
| 68 | L1-Basic Mode 5 | 8192 | 2048 | 3 |
| 69 | L1-Basic Mode 5 | 8192 | 1536 | 4 |
| 70 | L1-Basic Mode 5 | 8192 | 1024 | 3 |
| 71 | L1-Basic Mode 5 | 8192 | 768 | 4 |
| 72 | L1-Basic Mode 5 | 16384 | 4096 | 3 |
| 73 | L1-Basic Mode 5 | 16384 | 3648 | 4 |
| 74 | L1-Basic Mode 5 | 16384 | 2432 | 3 |
| 75 | L1-Basic Mode 5 | 16384 | 1536 | 4 |
| 76 | L1-Basic Mode 5 | 16384 | 1024 | 6 |
| 77 | L1-Basic Mode 5 | 16384 | 768 | 8 |
| 78 | L1-Basic Mode 5 | 32768 | 4864 | 3 |
| 79 | L1-Basic Mode 5 | 32768 | 3648 | 3 |
| 80 | L1-Basic Mode 5 | 32768 | 3648 | 8 |
| 81 | L1-Basic Mode 5 | 32768 | 2432 | 6 |
| 82 | L1-Basic Mode 5 | 32768 | 1536 | 8 |
| 83 | L1-Basic Mode 5 | 32768 | 1024 | 12 |
| 84 | L1-Basic Mode 5 | 32768 | 768 | 16 |
| 85 | L1-Basic Mode 6 | 8192 | 2048 | 3 |
| 86 | L1-Basic Mode 6 | 8192 | 1536 | 4 |
| 87 | L1-Basic Mode 6 | 8192 | 1024 | 3 |
| 88 | L1-Basic Mode 6 | 8192 | 768 | 4 |
| 89 | L1-Basic Mode 6 | 16384 | 4096 | 3 |
| 90 | L1-Basic Mode 6 | 16384 | 3648 | 4 |
| 91 | L1-Basic Mode 6 | 16384 | 2432 | 3 |
| 92 | L1-Basic Mode 6 | 16384 | 1536 | 4 |
| 93 | L1-Basic Mode 6 | 16384 | 1024 | 6 |
| 94 | L1-Basic Mode 6 | 16384 | 768 | 8 |
| 95 | L1-Basic Mode 6 | 32768 | 4864 | 3 |
| 96 | L1-Basic Mode 6 | 32768 | 3648 | 3 |
| 97 | L1-Basic Mode 6 | 32768 | 3648 | 8 |
| 98 | L1-Basic Mode 6 | 32768 | 2432 | 6 |
| 99 | L1-Basic Mode 6 | 32768 | 1536 | 8 |
| 100 | L1-Basic Mode 6 | 32768 | 1024 | 12 |
| 101 | L1-Basic Mode 6 | 32768 | 768 | 16 |
| 102 | L1-Basic Mode 7 | 8192 | 2048 | 3 |
| 103 | L1-Basic Mode 7 | 8192 | 1536 | 4 |
| 104 | L1-Basic Mode 7 | 8192 | 1024 | 3 |
| 105 | L1-Basic Mode 7 | 8192 | 768 | 4 |
| 106 | L1-Basic Mode 7 | 16384 | 4096 | 3 |
| 107 | L1-Basic Mode 7 | 16384 | 3648 | 4 |
| 108 | L1-Basic Mode 7 | 16384 | 2432 | 3 |
| 109 | L1-Basic Mode 7 | 16384 | 1536 | 4 |
| 110 | L1-Basic Mode 7 | 16384 | 1024 | 6 |
| 111 | L1-Basic Mode 7 | 16384 | 768 | 8 |
| 112 | L1-Basic Mode 7 | 32768 | 4864 | 3 |
| 113 | L1-Basic Mode 7 | 32768 | 3648 | 3 |
| 114 | L1-Basic Mode 7 | 32768 | 3648 | 8 |
| 115 | L1-Basic Mode 7 | 32768 | 2432 | 6 |
| 116 | L1-Basic Mode 7 | 32768 | 1536 | 8 |
| 117 | L1-Basic Mode 7 | 32768 | 1024 | 12 |
| 118 | L1-Basic Mode 7 | 32768 | 768 | 16 |
| 119 | Reserved | Reserved | Reserved | Reserved |
| 120 | Reserved | Reserved | Reserved | Reserved |
| 121 | Reserved | Reserved | Reserved | Reserved |
| 122 | Reserved | Reserved | Reserved | Reserved |
| 123 | Reserved | Reserved | Reserved | Reserved |
| 124 | Reserved | Reserved | Reserved | Reserved |
| 125 | Reserved | Reserved | Reserved | Reserved |
| 126 | Reserved | Reserved | Reserved | Reserved |
| 127 | Reserved | Reserved | Reserved | Reserved |

For example, a fixed-length symbol of 7-bit may be assigned for representing the preamble structure shown in the Table 2.

The L1-Basic Mode 1, L1-Basic Mode 2 and L1-Basic Mode 3 in the Table 2 may correspond to QPSK and 3/15 LDPC.

The L1 Basic Mode 4 in the Table 2 may correspond to 16-NUC (Non Uniform Constellation) and 3/15 LDPC.

The L1 Basic Mode 5 in the Table 2 may correspond to 64-NUC (Non Uniform Constellation) and 3/15 LDPC.

The L1-Basic Mode 6 and L1-Basic Mode 7 in the Table 2 may correspond to 256-NUC (Non Uniform Constellation) and 3/15 LDPC. Hereafter, the modulation scheme/code rate represents a combination of a modulation scheme and a code rate such as QPSK and 3/15 LDPC.

The FFT size in the Table 2 may represent a size of Fast Fourier Transform.

The GI length in the Table 2 may represent the Guard Interval Length, may represent a length of the guard interval which is not data in a time domain. In this case, the guard interval is longer, the system is more robust.

The Pilot Pattern in the Table 2 may represent Dx of the pilot pattern. Although it is not shown in the Table 2 explicitly, Dy may be all 1 in the example of Table 2. For example, Dx=3 may mean that one pilot for channel estimation is included in x-axis direction in every three symbols. For example, Dy=1 may mean the pilot is included every time in y-axis direction.

As shown in the Table 2, the preamble structure corresponding to a second modulation scheme/code rate which is more robust than a first modulation scheme/code rate may be allocated in the lookup table prior to the preamble structure corresponding to the first modulation scheme/code rate.

In this case, the being allocated prior to other preamble structure may mean being stored in the lookup table corresponding to a serial number less than the serial number of the other preamble structure.

Furthermore, the preamble structure corresponding to a second FFT size which is shorter than a first FFT size may be allocated in the lookup table prior to the preamble structure corresponding to a first FFT size in case of the same modulation scheme/code rate.

Furthermore, the preamble structure corresponding to a second guard interval which is longer than a first guard interval may be allocated in the lookup table prior to the preamble structure corresponding to the first guard interval in case of the same modulation scheme/code rate and the same FFT size.

As shown in the Table 2, the setting of the order in which the preamble structures are assigned in the lookup table may make the recognition of the preamble structure using the bootstrap more efficient.

Figure 5:
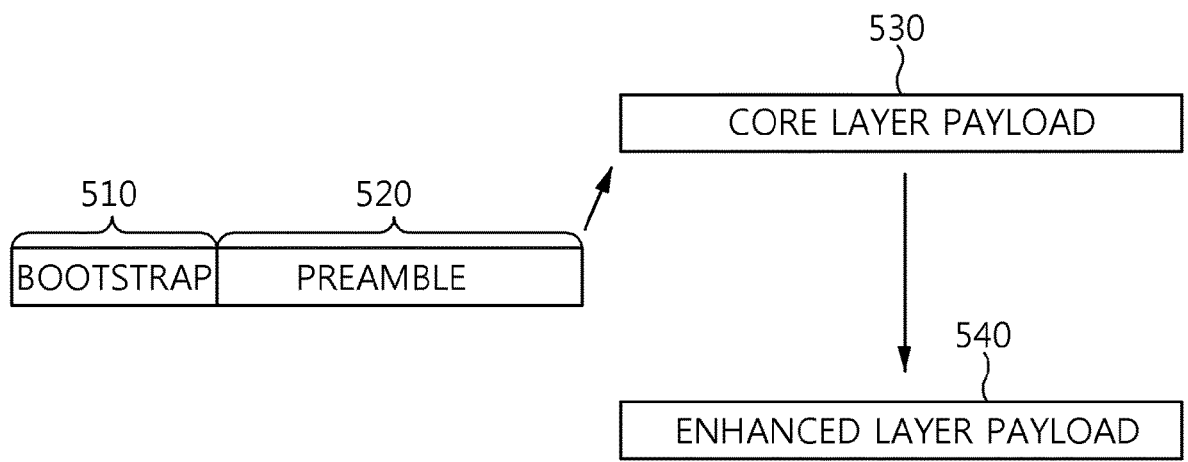
FIG. 5 is a diagram showing an example of the receiving process of the broadcast signal frame shown in FIG. 4.

FIG. 5 is a diagram showing an example of the receiving process of the broadcast signal frame shown in FIG. 4.

Referring to FIG. 5, the bootstrap 510 is detected and demodulated, and the signaling information is reconstructed by the demodulation of the preamble 520 using the demodulated information.

The core layer data 530 is demodulated using the signaling information and the enhanced layer signal is demodulated through the cancellation process corresponding to the core layer data. In this case, the cancellation corresponding to the core layer data will be described in detail later.

Figure 6:
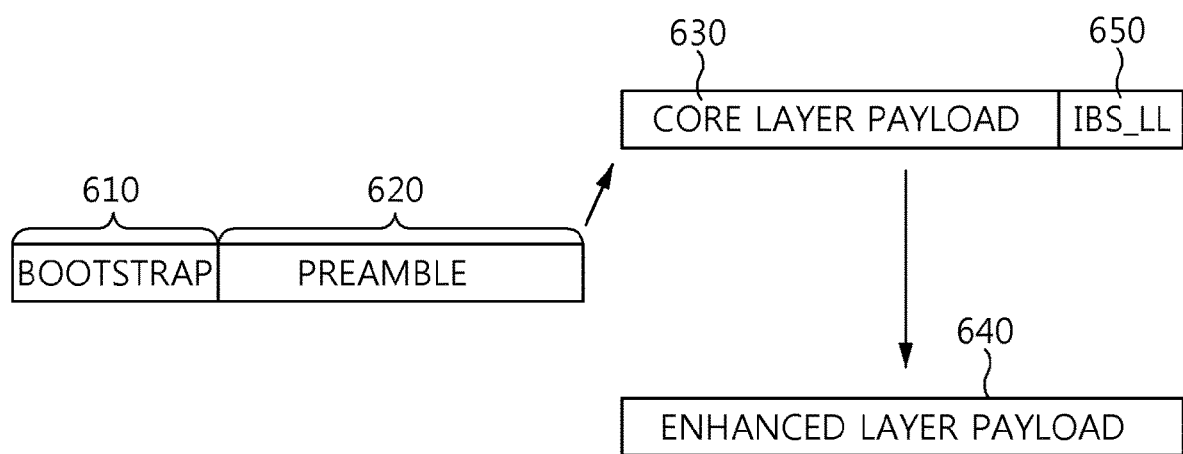
FIG. 6 is a diagram showing another example of the receiving process of the broadcast signal frame shown in FIG. 4.

FIG. 6 is a diagram showing another example of the receiving process of the broadcast signal frame shown in FIG. 4.

Referring to FIG. 6, the bootstrap 610 is detected and demodulated, and the signaling information is reconstructed by the demodulation of the preamble 620 using the demodulated information.

The core layer data 630 is demodulated using the signaling information. In this case, the core layer data 630 includes in-band signaling section 650. The in-band signaling section 650 includes signaling information for the enhanced layer service. The bandwidth is used more efficiently through the in-band signaling section 650. In this case, the in-band signaling section 650 may be included in the core layer which is more robust than the enhanced layer.

The basic signaling information and the information for the core layer service may be transferred through the preamble 620 and the signaling information for the enhanced layer service may be transferred through the in-band signaling section 650 in the example of the FIG. 6.

The enhanced layer signal is demodulated through the cancellation process corresponding to the core layer data.

In this case, the signaling information may be L1 (Layer-1) signaling information. The L1 signaling information may include information for physical layer parameters.

Referring to FIG. 4, a broadcast signal frame includes an L1 signaling signal and a data signal. For example, the broadcast signal frame may be an ATSC 3.0 frame.

Figure 7:
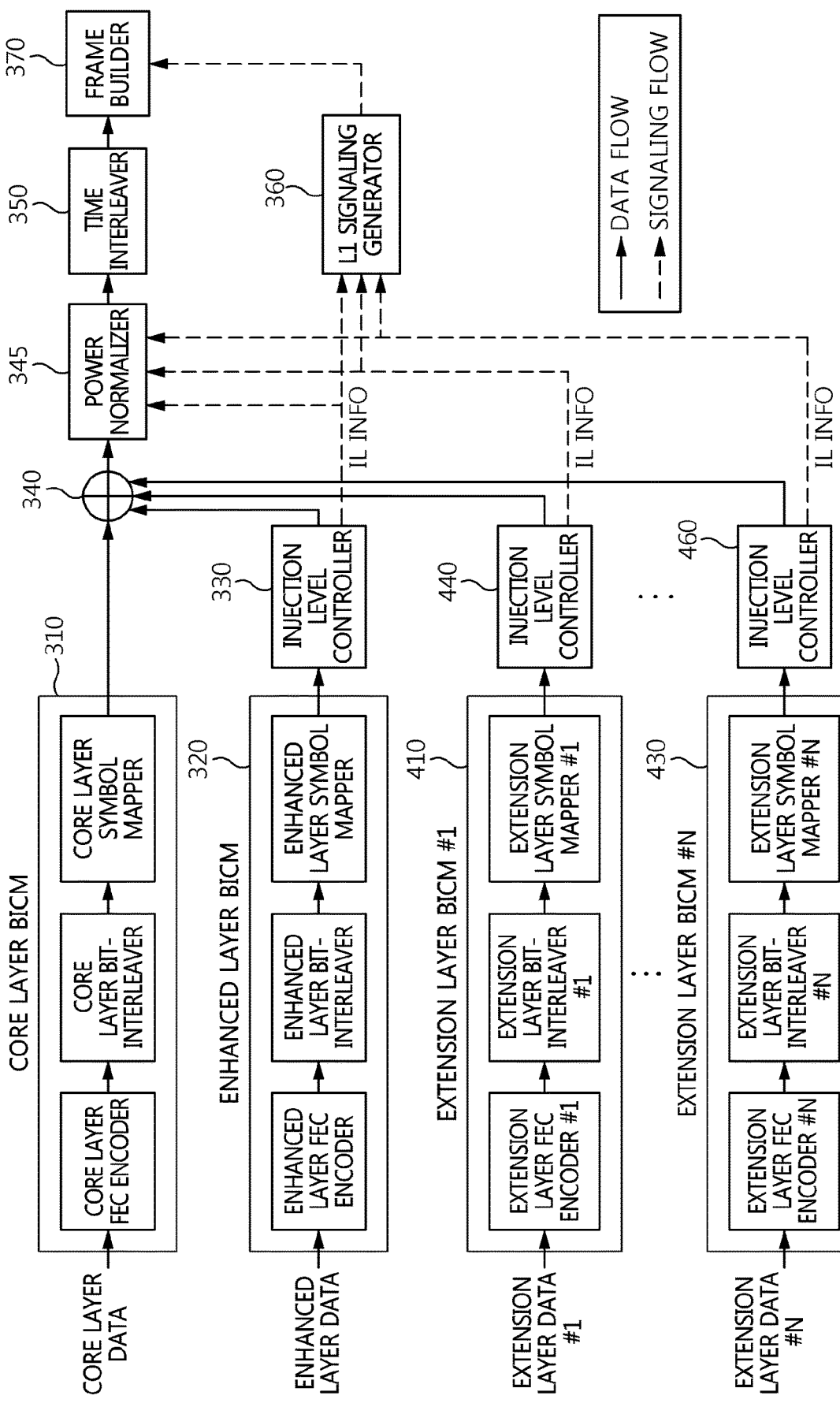
FIG. 7 is a block diagram showing another example of the apparatus for generating broadcast signal frame shown in FIG. 1.

FIG. 7 is a block diagram showing another example of the apparatus for generating broadcast signal frame shown in FIG. 1.

Referring to FIG. 7, it can be seen that an apparatus for generating broadcast signal frame multiplexes data corresponding to N (N is a natural number that is equal to or larger than 1) extension layers together in addition to core layer data and enhanced layer data.

That is, the apparatus for generating the broadcast signal frame in FIG. 7 includes N extension layer BICM units 410, . . . , 430 and injection level controllers 440, . . . , 460 in addition to a core layer BICM unit 310, an enhanced layer BICM unit 320, an injection level controller 330, a combiner 340, a power normalizer 345, a time interleaver 350, a signaling generation unit 360, and a frame builder 370.

The core layer BICM unit 310, enhanced layer BICM unit 320, injection level controller 330, combiner 340, power normalizer 345, time interleaver 350, signaling generation unit 360 and frame builder 370 shown in FIG. 7 have been described in detail with reference to FIG. 3.

Each of the N extension layer BICM units 410, . . . , 430 independently performs BICM encoding, and each of the injection level controllers 440, . . . , 460 performs power reduction corresponding to a corresponding extension layer, thereby enabling a power reduced extension layer signal to be combined with other layer signals via the combiner 340.

In this case, each of the error correction encoders of the extension layer BICM units 410, . . . , 430 may be formed by connecting a BCH encoder and an LDPC encoder in series.

In particular, it is preferred that a reduction in power corresponding to each of the injection level controllers 440, . . . , 460 be higher than the reduction in power of the injection level controller 330. That is, a lower one of the injection level controllers 330, 440, . . . , 460 shown in FIG. 7 may correspond to a larger reduction in power.

Injection level information provided by the injection level controllers 330, 440 and 460 shown in FIG. 7 is included in the broadcast signal frame of the frame builder 370 via the signaling generation unit 360, and is then transmitted to the receiver. That is, the injection level of each layer is contained in the L1 signaling information and then transferred to the receiver.

In the present invention, the adjustment of power may correspond to increasing or decreasing the power of an input signal, and may correspond to increasing or decreasing the gain of an input signal.

The power normalizer 345 mitigates an increase in power caused by the combination of a plurality of layer signals by means of the combiner 340.

In the example shown in FIG. 7, the power normalizer 345 may adjust the power of a signal to appropriate magnitude by multiplying the magnitude of a signal, into which the signals of the respective layers are combined, by a normalizing factor by using Equation 4 below:

$$\text{Normalizing factor} = \left( \sqrt{\begin{array}{c}(1 + 10^{-Injectionlevel\ \#1(dB)/10} + 10^{-Injectionlevel\ \#2(dB)/10} + \\ \ldots + 10^{-Injectionlevel\ \#(N+1)(dB)/10})\end{array}} \right)^{-1} \quad (4)$$

The time interleaver 350 performs interleaving equally applied to the signals of the layers by interleaving the signals combined by the combiner 340.

Figure 8:
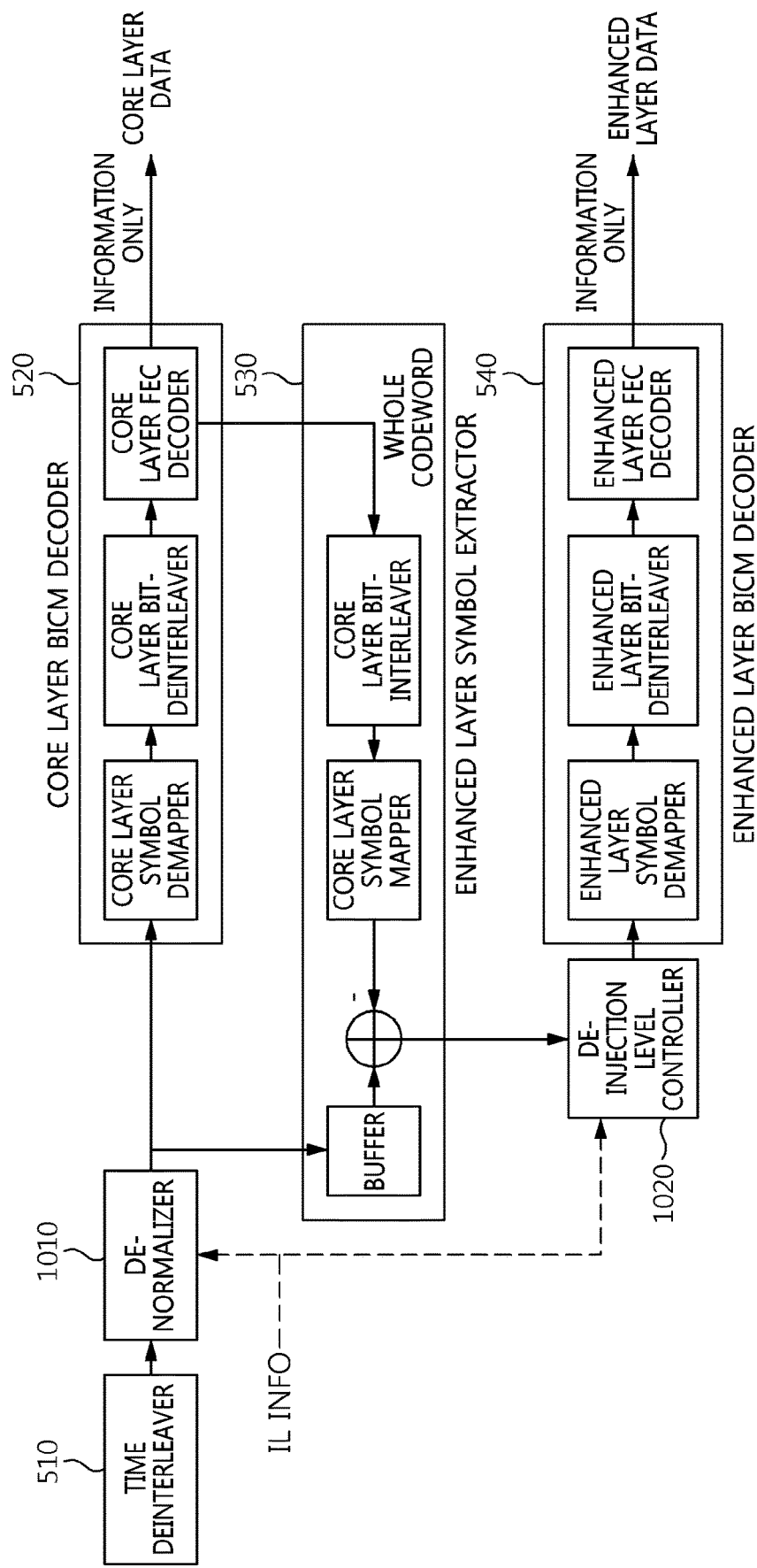
FIG. 8 is a block diagram showing an example of the signal demultiplexer shown in FIG. 1.

FIG. 8 is a block diagram showing still an example of the signal demultiplexer shown in FIG. 1.

Referring to FIG. 8, a signal demultiplexer according to an embodiment of the present invention includes a time deinterleaver 510, a de-normalizer 1010, core layer BICM decoder 520, an enhanced layer symbol extractor 530, a de-injection level controller 1020, and an enhanced layer BICM decoder 540.

In this case, the signal demultiplexer shown in FIG. 8 may correspond to the apparatus for generating the broadcast signal frame shown in FIG. 3.

The time deinterleaver 510 receives a received signal from an OFDM receiver for performing operations, such as time/frequency synchronization, channel estimation and equalization, and performs an operation related to the distribution of burst errors occurring over a channel. In this case, the L1 signaling information is decoded by the OFDM receiver first, and is then used for the decoding of data. In particular, the injection level information of the L1 signaling information may be transferred to the de-normalizer 1010 and the de-injection level controller 1020. In this case, the OFDM receiver may decode the received signal in the form of a broadcast signal frame, for example, an ATSC 3.0 frame, may extract the data symbol part of the frame, and may provide the extracted data symbol part to the time deinterleaver 510. That is, the time deinterleaver 510 distributes burst errors occurring over a channel by performing deinterleaving while passing a data symbol therethrough.

In this case, the time deinterleaver 510 may perform an operation corresponding to the time interleaver. In this case, the time deinterleaver 510 may perform the deinterleaving by using one of a plurality of operation modes and may perform the deinterleaving by using the time interleaver information signaled related to the operation of the time interleaver.

The de-normalizer 1010 corresponds to the power normalizer of the transmitter, and increases power by a level by which the power normalizer has decreased the power. That is, the de-normalizer 1010 divides the received signal by the normalizing factor of Equation 2.

Although the de-normalizer 1010 is illustrated as adjusting the power of the output signal of the time interleaver 510 in the example shown in FIG. 8, the de-normalizer 1010 may be located before the time interleaver 510 so that power adjustment is performed before interleaving in some embodiments.

That is, the de-normalizer 1010 may be viewed as being located before or after the time interleaver 510 and amplifying the magnitude of a signal for the purpose of the LLR calculation of the core layer symbol demapper.

The output of the time deinterleaver 510 (or the output of the de-normalizer 1010) is provided to the core layer BICM decoder 520, and the core layer BICM decoder 520 restores core layer data.

In this case, the core layer BICM decoder 520 includes a core layer symbol demapper, a core layer bit deinterleaver, and a core layer error correction decoder. The core layer symbol demapper calculates LLR values related to symbols, the core layer bit deinterleaver strongly mixes the calculated LLR values with burst errors, and the core layer error correction decoder corrects error occurring over a channel.

In this case, the core layer symbol demapper may calculate an LLR value for each bit using a predetermined constellation. In this case, the constellation used by the core layer symbol mapper may vary depending on the combination of the code rate and the modulation order that are used by the transmitter.

In this case, the core layer bit deinterleaver may perform deinterleaving on calculated LLR values on an LDPC code word basis.

In particular, the core layer error correction decoder may output only information bits, or may output all bits in which information bits have been mixed with parity bits. In this case, the core layer error correction decoder may output only information bits as core layer data, and may output all bits in which information bits have been mixed with parity bits to the enhanced layer symbol extractor 530.

The core layer error correction decoder may be formed by connecting a core layer LDPC decoder and a core layer BCH decoder in series. That is, the input of the core layer error correction decoder may be input to the core layer LDPC decoder, the output of the core layer LDPC decoder may be input to the core layer BCH decoder, and the output of the core layer BCH decoder may become the output of the core layer error correction decoder. In this case, the LDPC decoder performs LDPC decoding, and the BCH decoder performs BCH decoding.

Furthermore, the enhanced layer error correction decoder may be formed by connecting an enhanced layer LDPC decoder and an enhanced layer BCH decoder in series. That is, the input of the enhanced layer error correction decoder may be input to the enhanced layer LDPC decoder, the output of the enhanced layer LDPC decoder may be input to the enhanced layer BCH decoder, and the output of the enhanced layer BCH decoder may become the output of the enhanced layer error correction decoder.

The enhanced layer symbol extractor 530 may receive all bits from the core layer error correction decoder of the core layer BICM decoder 520, may extract enhanced layer symbols from the output signal of the time deinterleaver 510 or de-normalizer 1010. In an embodiment, the enhanced layer symbol extractor 530 may not be provided with all bits by the error correction decoder of the core layer BICM decoder 520, but may be provided with LDPC information bits or BCH information bits by the error correction decoder of the core layer BICM decoder 520.

In this case, the enhanced layer symbol extractor 530 includes a buffer, a subtracter, a core layer symbol mapper, and a core layer bit interleaver. The buffer stores the output signal of the time deinterleaver 510 or de-normalizer 1010. The core layer bit interleaver receives the all bits (information bits+parity bits) of the core layer BICM decoder, and performs the same core layer bit interleaving as the transmitter. The core layer symbol mapper generates core layer symbols, which are the same as the transmitter, from the interleaved signal. The subtracter obtains enhanced layer symbols by subtracting the output signal of the core layer symbol mapper from the signal stored in the buffer, and transfers the enhanced layer symbols to the de-injection level controller 1020. In particular, when LDPC information bits are provided, the enhanced layer symbol extractor 530 may further include a core layer LDPC encoder. Furthermore, when BCH information bits are provided, the enhanced layer symbol extractor 530 may further include not only a core layer LDPC encoder but also a core layer BCH encoder.

In this case, the core layer LDPC encoder, core layer BCH encoder, core layer bit interleaver and core layer symbol mapper included in the enhanced layer symbol extractor 530 may be the same as the LDPC encoder, BCH encoder, bit interleaver and symbol mapper of the core layer described with reference to FIG. 3.

The de-injection level controller 1020 receives the enhanced layer symbols, and increases the power of the input signal by a level by which the injection level controller of the transmitter has decreased the power. That is, the de-injection level controller 1020 amplifies the input signal, and provides the amplified input signal to the enhanced layer BICM decoder 540. For example, if at the transmitter, the power used to combine the enhanced layer signal is lower than the power used to combine the core layer signal by 3 dB, the de-injection level controller 1020 functions to increase the power of the input signal by 3 dB.

In this case, the de-injection level controller 1020 may be viewed as receiving injection level information from the OFDM receiver and multiplying an extracted enhanced layer signal by the enhanced layer gain of Equation 5:

$$\text{Enhanced layer gain} = (10^{-Injectionlevel(dB)/10})^{-1} \quad (5)$$

The enhanced layer BICM decoder 540 receives the enhanced layer symbol whose power has been increased by the de-injection level controller 1020, and restores the enhanced layer data.

In this case, the enhanced layer BICM decoder 540 may include an enhanced layer symbol demapper, an enhanced layer bit deinterleaver, and an enhanced layer error correction decoder. The enhanced layer symbol demapper calculates LLR values related to the enhanced layer symbols, the enhanced layer bit deinterleaver strongly mixes the calculated LLR values with burst errors, and the enhanced layer error correction decoder corrects error occurring over a channel.

Although the enhanced layer BICM decoder 540 performs a task similar to a task that is performed by the core layer BICM decoder 520, the enhanced layer LDPC decoder generally performs LDPC decoding related to a code rate equal to or higher than 6/15.

For example, the core layer may use LDPC code having a code rate equal to or higher than 5/15, and the enhanced layer may use LDPC code having a code rate equal to or higher than 6/15. In this case, in a reception environment in which enhanced layer data can be decoded, core layer data may be decoded using only a small number of LDPC decoding iterations. Using this characteristic, in the hardware of the receiver, a single LDPC decoder is shared by the core layer and the enhanced layer, and thus the cost required to implement the hardware can be reduced. In this case, the core layer LDPC decoder may use only some time resources (LDPC decoding iterations), and the enhanced layer LDPC decoder may use most time resources.

That is, the signal demultiplexer shown in FIG. 8 restores core layer data first, leaves only the enhanced layer symbols by cancellation the core layer symbols in the received signal symbols, and then restores enhanced layer data by increasing the power of the enhanced layer symbols. As described with reference to FIGS. 3 and 5, signals corresponding to respective layers are combined at different power levels, and thus data restoration having the smallest error can be achieved only if restoration starts with a signal combined with the strongest power.

Accordingly, in the example shown in FIG. 8, the signal demultiplexer may include the time deinterleaver 510 configured to generate a time-deinterleaved signal by applying time deinterleaving to a received signal; a de-normalizer 1010 configured to increase the power of the received signal or the time-deinterleaved signal by a level corresponding to a reduction in power by the power normalizer of the transmitter; the core layer BICM decoder 520 configured to restore core layer data from the signal power-adjusted by the de-normalizer 1010; the enhanced layer symbol extractor 530 configured to extract an enhanced layer signal by performing cancellation, corresponding to the core layer data, on the signal power-adjusted by the de-normalizer 1010 using the output signal of the core layer FEC decoder of the core layer BICM decoder 520; a de-injection level controller 1020 configured to increase the power of the enhanced layer signal by a level corresponding to a reduction in power by the injection power level controller of the transmitter; and an enhanced layer BICM decoder 540 configured to restore enhanced layer data using the output signal of the de-injection level controller 1020.

In this case, the enhanced layer symbol extractor may receive all code words from the core layer LDPC decoder of the core layer BICM decoder, and may immediately perform bit interleaving on the all code words.

In this case, the enhanced layer symbol extractor may receive information bits from the core layer LDPC decoder of the core layer BICM decoder, and may perform core layer LDPC encoding and then bit interleaving on the information bits.

In this case, the enhanced layer symbol extractor may receive information bits from the core layer BCH decoder of the core layer BICM decoder, and may perform core layer BCH encoding and core layer LDPC encoding and then bit interleaving on the information bits.

In this case, the de-normalizer and the de-injection level controller may receive injection level information IL INFO provided based on L1 signaling, and may perform power control based on the injection level information.

In this case, the core layer BICM decoder may have a bit rate lower than that of the enhanced layer BICM decoder, and may be more robust than the enhanced layer BICM decoder.

In this case, the de-normalizer may correspond to the reciprocal of the normalizing factor.

In this case, the de-injection level controller may correspond to the reciprocal of the scaling factor.

In this case, the enhanced layer data may be restored based on cancellation corresponding to the restoration of core layer data corresponding to the core layer signal.

In this case, the signal demultiplexer further may include one or more extension layer symbol extractors each configured to extract an extension layer signal by performing cancellation corresponding to previous layer data; one or more de-injection level controllers each configured to increase the power of the extension layer signal by a level corresponding to a reduction in power by the injection level controller of the transmitter; and one or more extension layer BICM decoders configured to restore one or more pieces of extension layer data using the output signals of the one or more de-injection level controllers.

From the configuration shown in FIG. 8, it can be seen that a signal demultiplexing method according to an embodiment of the present invention includes generating a time-deinterleaved signal by applying time deinterleaving to a received signal; increasing the power of the received signal or the time-deinterleaved signal by a level corresponding to a reduction in power by the power normalizer of the transmitter; restoring core layer data from the power-adjusted signal; extracting an enhanced layer signal by performing cancellation, corresponding to the core layer data, on the power-adjusted signal; increasing the power of the enhanced layer signal by a level corresponding to a reduction in power by the injection power level controller of the transmitter; and restoring enhanced layer data using the enhanced layer data.

In this case, extracting the enhanced layer signal may include receiving all code words from the core layer LDPC decoder of the core layer BICM decoder, and immediately performing bit interleaving on the all code words.

In this case, extracting the enhanced layer signal may include receiving information bits from the core layer LDPC decoder of the core layer BICM decoder, and performing core layer LDPC encoding and then bit interleaving on the information bits.

In this case, extracting the enhanced layer signal may include receiving information bits from the core layer BCH decoder of the core layer BICM decoder, and performing core layer BCH encoding and core layer LDPC encoding and then bit interleaving on the information bits.

Figure 9:
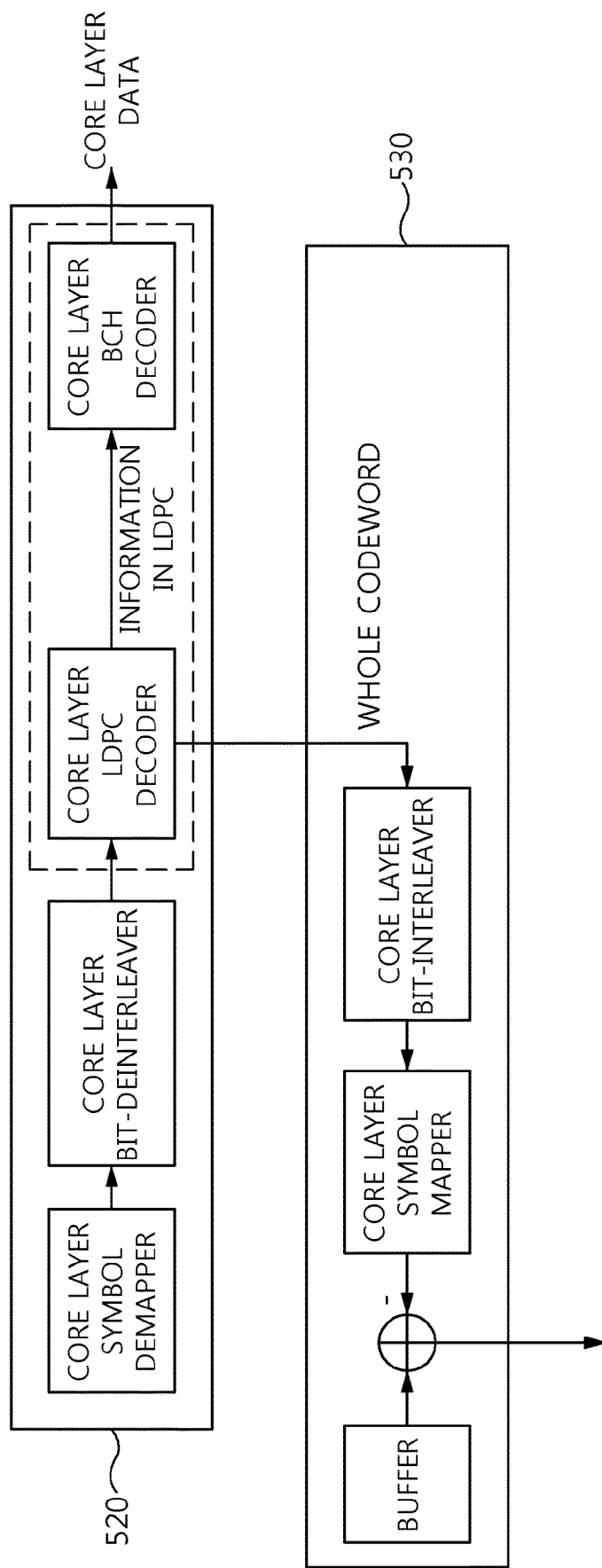
FIG. 9 is a block diagram showing an example of the core layer BICM decoder and the enhanced layer symbol extractor shown in FIG. 8.

FIG. 9 is a block diagram showing an example of the core layer BICM decoder 520 and the enhanced layer symbol extractor 530 shown in FIG. 8.

Referring to FIG. 9, the core layer BICM decoder 520 includes a core layer symbol demapper, a core layer bit deinterleaver, a core layer LDPC decoder, and a core layer BCH decoder.

That is, in the example shown in FIG. 9, the core layer error correction decoder includes the core layer LDPC decoder and the core layer BCH decoder.

Furthermore, in the example shown in FIG. 9, the core layer LDPC decoder provides all code words, including parity bits, to the enhanced layer symbol extractor 530. That is, although the LDPC decoder generally outputs only the information bits of all the LDPC code words, the LDPC decoder may output all the code words.

In this case, although the enhanced layer symbol extractor 530 may be easily implemented because it does not need to include a core layer LDPC encoder or a core layer BCH encoder, there is a possibility that a residual error may remain in the LDPC code parity part.

Figure 10:
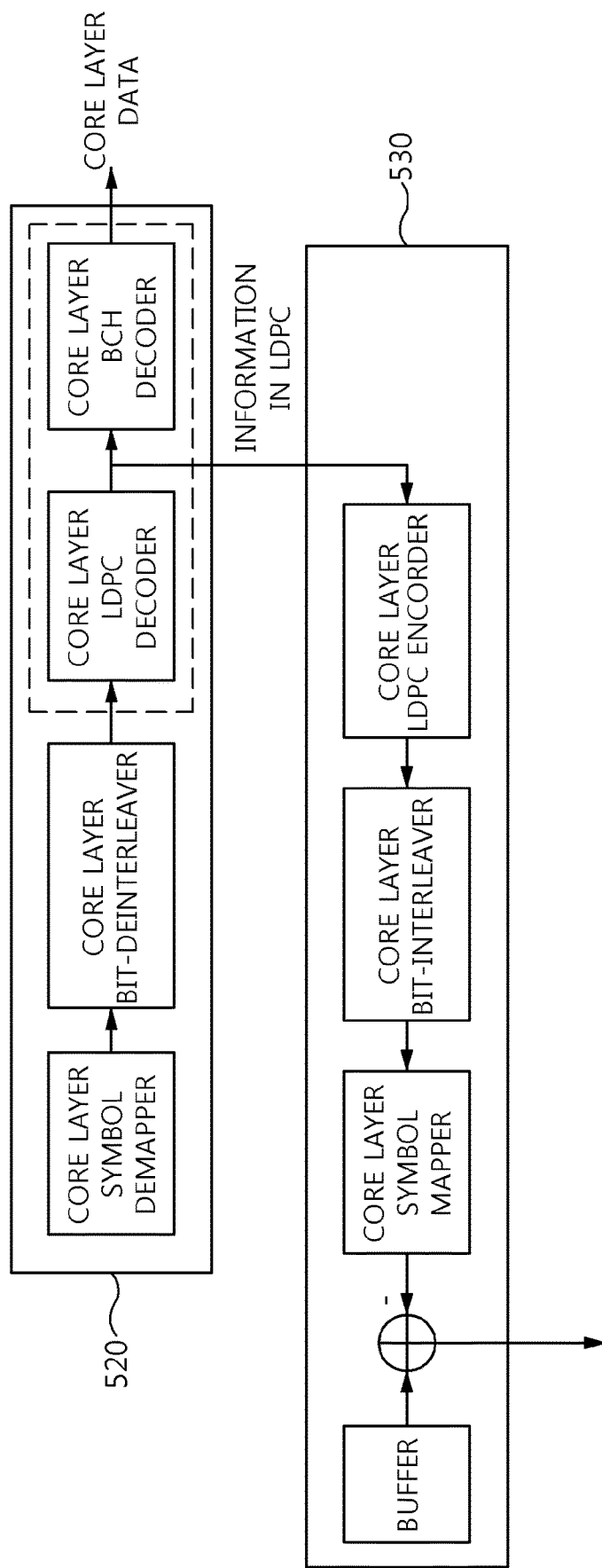
FIG. 10 is a block diagram showing another example of the core layer BICM decoder and the enhanced layer symbol extractor shown in FIG. 8.

FIG. 10 is a block diagram showing another example of the core layer BICM decoder 520 and the enhanced layer symbol extractor 530 shown in FIG. 8.

Referring to FIG. 10, the core layer BICM decoder 520 includes a core layer symbol demapper, a core layer bit deinterleaver, a core layer LDPC decoder, and a core layer BCH decoder.

That is, in the example shown in FIG. 10, the core layer error correction decoder includes the core layer LDPC decoder and the core layer BCH decoder.

Furthermore, in the example shown in FIG. 10, the core layer LDPC decoder provides information bits, excluding parity bits, to the enhanced layer symbol extractor 530.

In this case, although the enhanced layer symbol extractor 530 does not need to include a core layer BCH encoder, it must include a core layer LDPC encoder.

A residual error that may remain in the LDPC code parity part may be eliminated more desirably in the example shown in FIG. 10 than in the example shown in FIG. 9.

Figure 11:
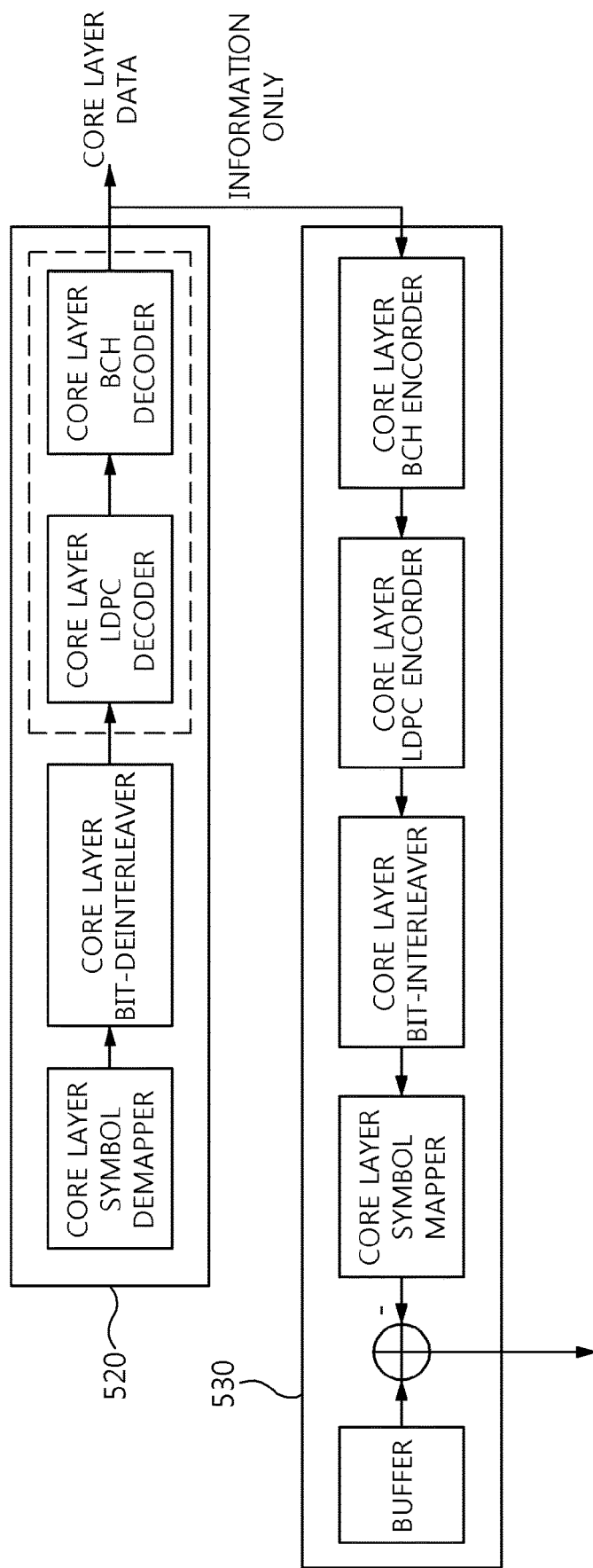
FIG. 11 is a block diagram showing still another example of the core layer BICM decoder and the enhanced layer symbol extractor shown in FIG. 8.

FIG. 11 is a block diagram showing still another example of the core layer BICM decoder 520 and the enhanced layer symbol extractor 530 shown in FIG. 8.

Referring to FIG. 11, the core layer BICM decoder 520 includes a core layer symbol demapper, a core layer bit deinterleaver, a core layer LDPC decoder, and a core layer BCH decoder.

That is, in the example shown in FIG. 11, the core layer error correction decoder includes the core layer LDPC decoder and the core layer BCH decoder.

In the example shown in FIG. 11, the output of the core layer BCH decoder corresponding to core layer data is provided to the enhanced layer symbol extractor 530.

In this case, although the enhanced layer symbol extractor 530 has high complexity because it must include both a core layer LDPC encoder and a core layer BCH encoder, it guarantees higher performance than those in the examples of FIGS. 9 and 10.

Figure 12:
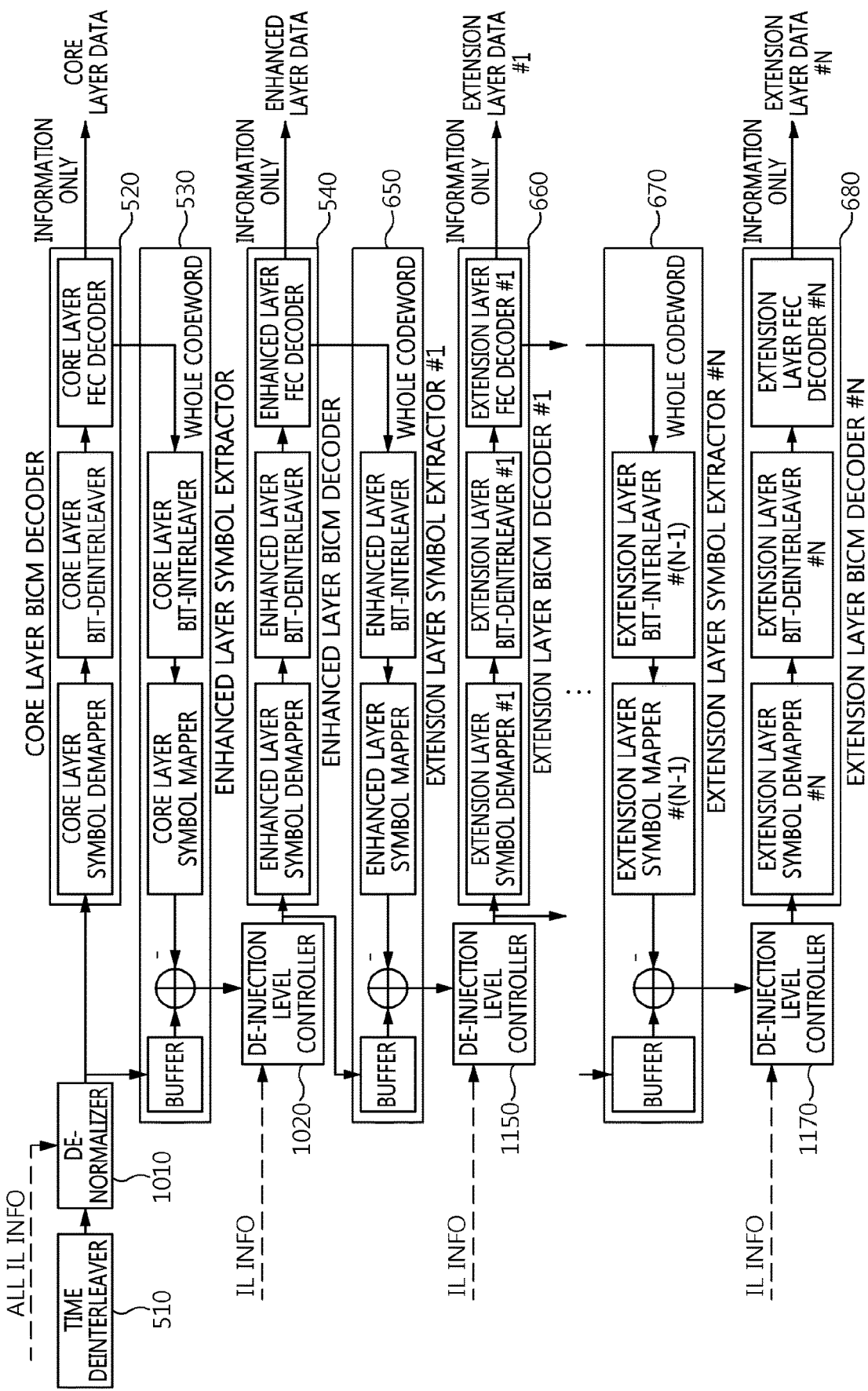
FIG. 12 is a block diagram showing another example of the signal demultiplexer shown in FIG. 1.

FIG. 12 is a block diagram showing another example of the signal demultiplexer shown in FIG. 1.

Referring to FIG. 12, a signal demultiplexer according to an embodiment of the present invention includes a time deinterleaver 510, a de-normalizer 1010, a core layer BICM decoder 520, an enhanced layer symbol extractor 530, an enhanced layer BICM decoder 540, one or more extension layer symbol extractors 650 and 670, one or more extension layer BICM decoders 660 and 680, and de-injection level controllers 1020, 1150 and 1170.

In this case, the signal demultiplexer shown in FIG. 12 may correspond to the apparatus for generating broadcast signal frame shown in FIG. 7.

The time deinterleaver 510 receives a received signal from an OFDM receiver for performing operations, such as synchronization, channel estimation and equalization, and performs an operation related to the distribution of burst errors occurring over a channel. In this case, L1 signaling information may be decoded by the OFDM receiver first, and then may be used for data decoding. In particular, the injection level information of the L1 signaling information may be transferred to the de-normalizer 1010 and the de-injection level controllers 1020, 1150 and 1170.

In this case, the de-normalizer 1010 may obtain the injection level information of all layers, may obtain a de-normalizing factor using Equation 6 below, and may multiply the input signal with the de-normalizing factor:

$$\text{De-Normalizing factor} = (\text{normalizing factor})^{-1} = \quad (6)$$
$$\left( \sqrt{\begin{array}{c}(1 + 10^{-Injectionlevel\,\#1(dB)/10} + 10^{-Injectionlevel\,\#2(dB)/10} + \\ \ldots + 10^{-Injectionlevel\,\#(N+1)(dB)/10})\end{array}} \right)$$

That is, the de-normalizing factor is the reciprocal of the normalizing factor expressed by Equation 4 above.

In an embodiment, when the N1 signaling includes not only injection level information but also normalizing factor information, the de-normalizer 1010 may simply obtain a de-normalizing factor by taking the reciprocal of a normalizing factor without the need to calculate the de-normalizing factor using an injection level.

The de-normalizer 1010 corresponds to the power normalizer of the transmitter, and increases power by a level by which the power normalizer has decreased the power.

Although the de-normalizer 1010 is illustrated as adjusting the power of the output signal of the time interleaver 510 in the example shown in FIG. 12, the de-normalizer 1010 may be located before the time interleaver 510 so that power adjustment can be performed before interleaving in an embodiment.

That is, the de-normalizer 1010 may be viewed as being located before or after the time interleaver 510 and amplifying the magnitude of a signal for the purpose of the LLR calculation of the core layer symbol demapper.

The output of the time deinterleaver 510 (or the output of the de-normalizer 1010) is provided to the core layer BICM decoder 520, and the core layer BICM decoder 520 restores core layer data.

In this case, the core layer BICM decoder 520 includes a core layer symbol demapper, a core layer bit deinterleaver, and a core layer error correction decoder. The core layer symbol demapper calculates LLR values related to symbols, the core layer bit deinterleaver strongly mixes the calculated LLR values with burst errors, and the core layer error correction decoder corrects error occurring over a channel.

In particular, the core layer error correction decoder may output only information bits, or may output all bits in which information bits have been combined with parity bits. In this case, the core layer error correction decoder may output only information bits as core layer data, and may output all bits in which information bits have been combined with parity bits to the enhanced layer symbol extractor 530.

The core layer error correction decoder may be formed by connecting a core layer LDPC decoder and a core layer BCH decoder in series. That is, the input of the core layer error correction decoder may be input to the core layer LDPC decoder, the output of the core layer LDPC decoder may be input to the core layer BCH decoder, and the output of the core layer BCH decoder may become the output of the core layer error correction decoder. In this case, the LDPC decoder performs LDPC decoding, and the BCH decoder performs BCH decoding.

The enhanced layer error correction decoder may be also formed by connecting an enhanced layer LDPC decoder and an enhanced layer BCH decoder in series. That is, the input of the enhanced layer error correction decoder may be input to the enhanced layer LDPC decoder, the output of the enhanced layer LDPC decoder may be input to the enhanced layer BCH decoder, and the output of the enhanced layer BCH decoder may become the output of the enhanced layer error correction decoder.

Moreover, the extension layer error correction decoder may be also formed by connecting an extension layer LDPC decoder and an extension layer BCH decoder in series. That is, the input of the extension layer error correction decoder may be input to the extension layer LDPC decoder, the output of the extension layer LDPC decoder may be input to the extension layer BCH decoder, and the output of the extension layer BCH decoder may become the output of the extension layer error correction decoder.

In particular, the tradeoff between the complexity of implementation, regarding which of the outputs of the error correction decoders will be used, which has been described with reference to FIGS. 9, 10 and 11, and performance is applied to not only the core layer BICM decoder 520 and enhanced layer symbol extractor 530 of FIG. 12 but also the extension layer symbol extractors 650 and 670 and the extension layer BICM decoders 660 and 680.

The enhanced layer symbol extractor 530 may receive the all bits from the core layer BICM decoder 520 of the core layer error correction decoder, and may extract enhanced layer symbols from the output signal of the time deinterleaver 510 or the denormalizer 1010. In an embodiment, the enhanced layer symbol extractor 530 may not receive all bits from the error correction decoder of the core layer BICM decoder 520, but may receive LDPC information bits or BCH information bits.

In this case, the enhanced layer symbol extractor 530 includes a buffer, a subtracter, a core layer symbol mapper, and a core layer bit interleaver. The buffer stores the output signal of the time deinterleaver 510 or de-normalizer 1010. The core layer bit interleaver receives the all bits (information bits+parity bits) of the core layer BICM decoder, and performs the same core layer bit interleaving as the transmitter. The core layer symbol mapper generates core layer symbols, which are the same as the transmitter, from the interleaved signal. The subtracter obtains enhanced layer symbols by subtracting the output signal of the core layer symbol mapper from the signal stored in the buffer, and transfers the enhanced layer symbols to the de-injection level controller 1020.

In this case, the core layer bit interleaver and core layer symbol mapper included in the enhanced layer symbol extractor 530 may be the same as the core layer bit interleaver and the core layer symbol mapper shown in FIG. 7.

The de-injection level controller 1020 receives the enhanced layer symbols, and increases the power of the input signal by a level by which the injection level controller of the transmitter has decreased the power. That is, the de-injection level controller 1020 amplifies the input signal, and provides the amplified input signal to the enhanced layer BICM decoder 540.

The enhanced layer BICM decoder 540 receives the enhanced layer symbol whose power has been increased by the de-injection level controller 1020, and restores the enhanced layer data.

In this case, the enhanced layer BICM decoder 540 may include an enhanced layer symbol demapper, an enhanced layer bit deinterleaver, and an enhanced layer error correction decoder. The enhanced layer symbol demapper calculates LLR values related to the enhanced layer symbols, the enhanced layer bit deinterleaver strongly mixes the calculated LLR values with burst errors, and the enhanced layer error correction decoder corrects error occurring over a channel.

In particular, the enhanced layer error correction decoder may output only information bits, and may output all bits in which information bits have been combined with parity bits. In this case, the enhanced layer error correction decoder may output only information bits as enhanced layer data, and may output all bits in which information bits have been mixed with parity bits to the extension layer symbol extractor 650.

The extension layer symbol extractor 650 receives all bits from the enhanced layer error correction decoder of the enhanced layer BICM decoder 540, and extracts extension layer symbols from the output signal of the de-injection level controller 1020.

In this case, the de-injection level controller 1020 may amplify the power of the output signal of the subtracter of the enhanced layer symbol extractor 530.

In this case, the extension layer symbol extractor 650 includes a buffer, a subtracter, an enhanced layer symbol mapper, and an enhanced layer bit interleaver. The buffer stores the output signal of the de-injection level controller 1020. The enhanced layer bit interleaver receives the all bits information (bits+parity bits) of the enhanced layer BICM decoder, and performs enhanced layer bit interleaving that is the same as that of the transmitter. The enhanced layer symbol mapper generates enhanced layer symbols, which are the same as those of the transmitter, from the interleaved signal. The subtracter obtains extension layer symbols by subtracting the output signal of the enhanced layer symbol mapper from the signal stored in the buffer, and transfers the extension layer symbols to the extension layer BICM decoder 660.

In this case, the enhanced layer bit interleaver and the enhanced layer symbol mapper included in the extension layer symbol extractor 650 may be the same as the enhanced layer bit interleaver and the enhanced layer symbol mapper shown in FIG. 7.

The de-injection level controller 1150 increases power by a level by which the injection level controller of a corresponding layer has decreased the power at the transmitter.

In this case, the de-injection level controller may be viewed as performing the operation of multiplying the extension layer gain of Equation 7 below. In this case, a 0-th injection level may be considered to be 0 dB:

$$n\text{-}th\ extensionlayergain = \frac{10^{-Injectionlevel\ \#(n-1)(dB)/10}}{10^{-Injectionlevel\ \#n(dB)/10}} \quad (7)$$

The extension layer BICM decoder 660 receives the extension layer symbols whose power has been increased by the de-injection level controller 1150, and restores extension layer data.

In this case, the extension layer BICM decoder 660 may include an extension layer symbol demapper, an extension layer bit deinterleaver, and an extension layer error correction decoder. The extension layer symbol demapper calculates LLR values related to the extension layer symbols, the extension layer bit deinterleaver strongly mixes the calculated LLR values with burst errors, and the extension layer error correction decoder corrects error occurring over a channel.

In particular, each of the extension layer symbol extractor and the extension layer BICM decoder may include two or more extractors or decoders if two or more extension layers are present.

That is, in the example shown in FIG. 12, the extension layer error correction decoder of the extension layer BICM decoder 660 may output only information bits, and may output all bits in which information bits have been combined with parity bits. In this case, the extension layer error correction decoder outputs only information bits as extension layer data, and may output all bits in which information bits have been mixed with parity bits to the subsequent extension layer symbol extractor 670.

The configuration and operation of the extension layer symbol extractor 670, the extension layer BICM decoder 680 and the de-injection level controller 1170 can be easily understood from the configuration and operation of the above-described extension layer symbol extractor 650, extension layer BICM decoder 660 and de-injection level controller 1150.

A lower one of the de-injection level controllers 1020, 1150 and 1170 shown in FIG. 12 may correspond to a larger increase in power. That is, the de-injection level controller 1150 may increase power more than the de-injection level controller 1020, and the de-injection level controller 1170 may increase power more than the de-injection level controller 1150.

It can be seen that the signal demultiplexer shown in FIG. 12 restores core layer data first, restores enhanced layer data using the cancellation of core layer symbols, and restores extension layer data using the cancellation of enhanced layer symbols. Two or more extension layers may be provided, in which case restoration starts with an extension layer combined at a higher power level.

Figure 13:
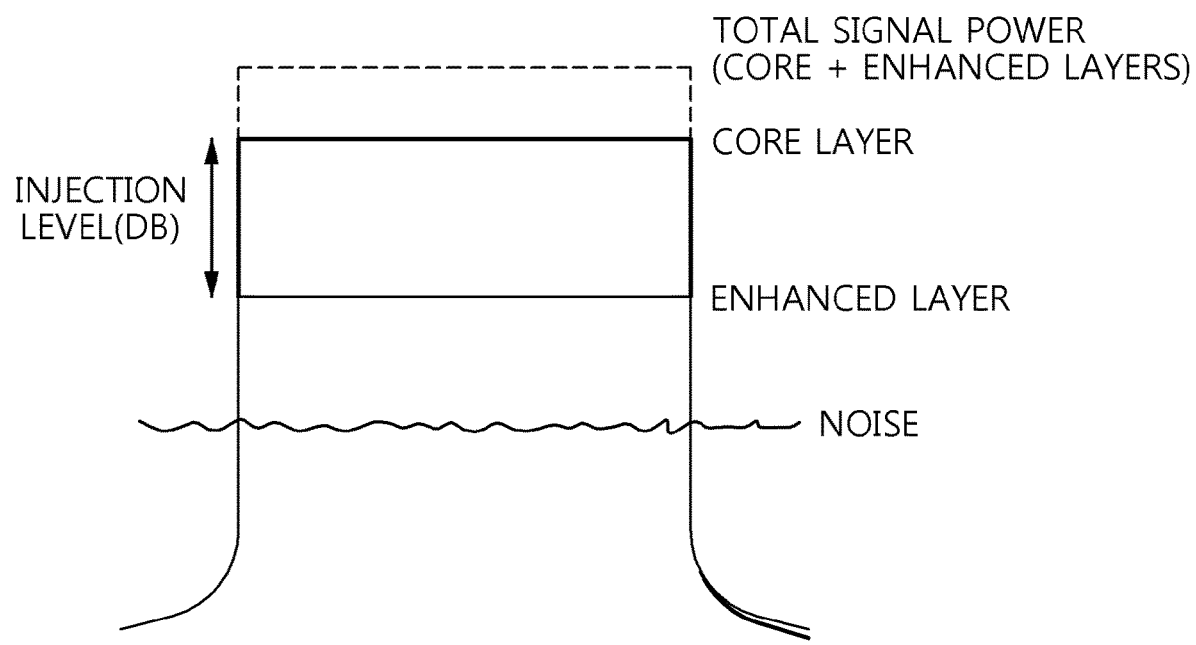
FIG. 13 is a diagram showing an increase in power attributable to the combination of a core layer signal and an enhanced layer signal.

FIG. 13 is a diagram showing in an increase in power attributable to the combination of a core layer signal and an enhanced layer signal.

Referring to FIG. 13, it can be seen that when a multiplexed signal is generated by combining a core layer signal with an enhanced layer signal whose power has been reduced by an injection level, the power level of the multiplexed signal is higher than the power level of the core layer signal or the enhanced layer signal.

In this case, the injection level that is adjusted by the injection level controllers shown in FIGS. 3 and 7 may be adjusted from 0 dB to 25.0 dB in steps of 0.5 dB or 1 dB. When the injection level is 3.0 dB, the power of the enhanced layer signal is lower than that of the core layer signal by 3 dB. When the injection level is 10.0 dB, the power of the enhanced layer signal is lower than that of the core layer signal by 10 dB. This relationship may be applied not only between a core layer signal and an enhanced layer signal but also between an enhanced layer signal and an extension layer signal or between extension layer signals.

The power normalizers shown in FIGS. 3 and 7 may adjust the power level after the combination, thereby solving problems, such as the distortion of the signal, that may be caused by an increase in power attributable to the combination.

Figure 14:
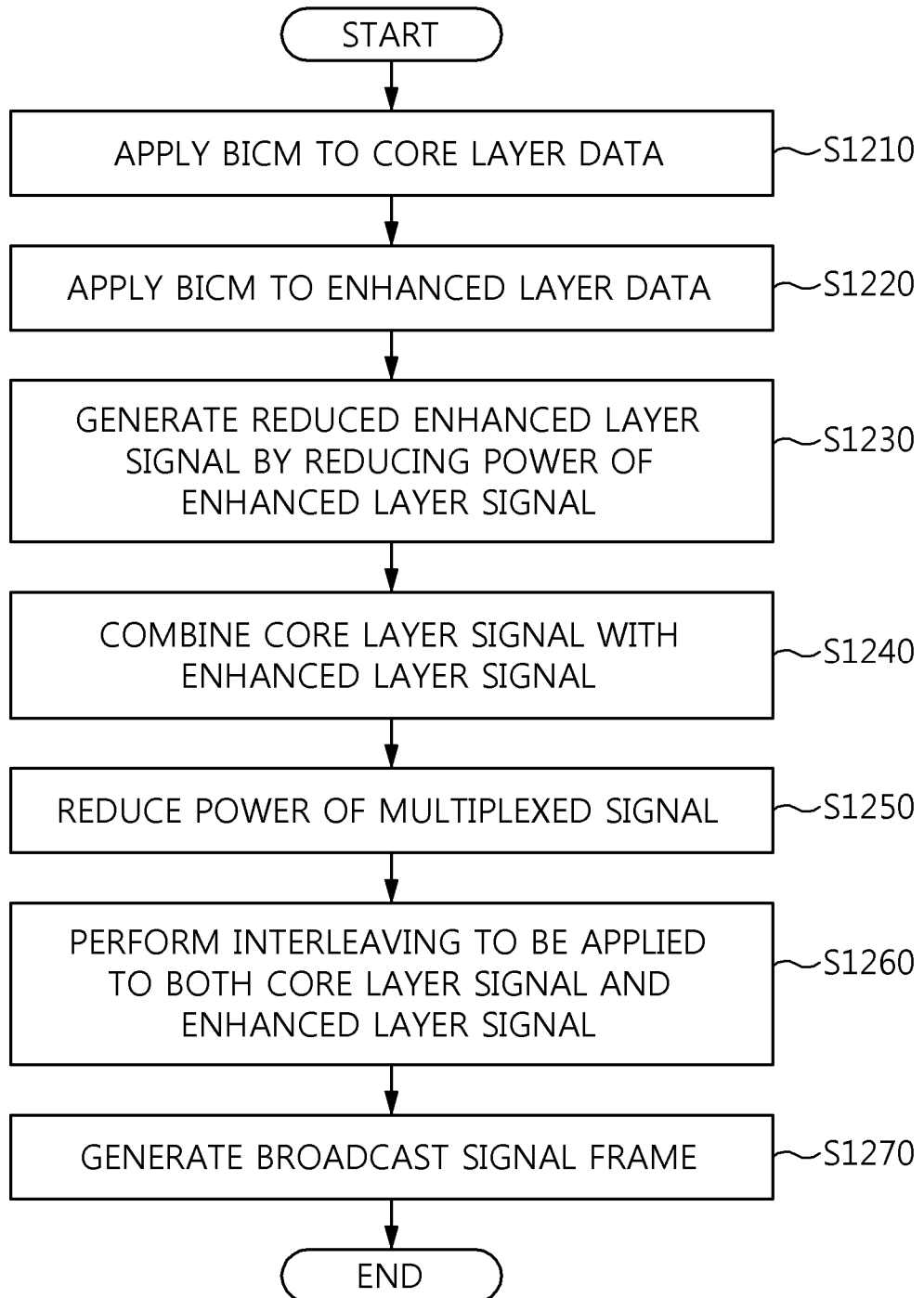
FIG. 14 is an operation flowchart showing a method of generating broadcast signal frame according to an embodiment of the present invention.

FIG. 14 is an operation flowchart showing a method of generating broadcast signal frame according to an embodiment of the present invention.

Referring to FIG. 14, in the method according to the embodiment of the present invention, BICM is applied to core layer data at step S1210.

Furthermore, in the method according to the embodiment of the present invention, BICM is applied to enhanced layer data at step S1220.

The BICM applied at step S1220 may be different from the BICM applied to step S1210. In this case, the BICM applied at step S1220 may be less robust than the BICM applied to step S1210. In this case, the bit rate of the BICM applied at step S1220 may be less robust than that of the BICM applied to step S1210.

In this case, an enhanced layer signal may correspond to the enhanced layer data that is restored based on cancellation corresponding to the restoration of the core layer data corresponding to a core layer signal.

Furthermore, in the method according to the embodiment of the present invention, a power-reduced enhanced layer signal is generated by reducing the power of the enhanced layer signal at step S1230.

In this case, at step S1230, an injection level may be changed from 00 dB to 25.0 dB in steps of 0.5 dB or 1 dB.

Furthermore, in the method according to the embodiment of the present invention, a multiplexed signal is generated by combining the core layer signal and the power-reduced enhanced layer signal at step S1240.

In this case, at step S1240, the core layer signal and the enhanced layer signal may be combined at different power levels so that the power level of the enhanced layer signal is lower than the power level of the core layer signal.

In this case, at step S1240, one or more extension layer signals having lower power levels than the core layer signal and the enhanced layer signal may be combined with the core layer signal and the enhanced layer signal.

Furthermore, in the method according to the embodiment of the present invention, the power-normalizing for reducing the power of the multiplexed signal is performed at step S1250.

In this case, at step S1250, the power of the multiplexed signal may be reduced to the power of the core layer signal. In this case, at step S1250, the power of the multiplexed signal may be reduced by a level by which the power has been increased at step S1240.

Furthermore, in the method according to the embodiment of the present invention, a time-interleaved signal is generated by performing time interleaving at step S1260.

According to an embodiment, the time-interleaved signal may be generated by performing time interleaving on the BICM output signal in case of a single layer at step S1260.

In this case, the step S1260 may use one of time interleaver groups, and a boundary between the time interleaver groups may be a boundary between Physical Layer Pipes (PLPs) of a core layer corresponding to the core layer signal.

In this case, the step S1260 may use a hybrid time interleaver for performing the interleaving. In this case, Physical Layer Pipes (PLPs) of a core layer and an enhanced layer may include only complete FEC blocks.

In this case, the step S1260 may use a convolutional time interleaver for performing the interleaving, the time interleaver groups may include the Physical Layer Pipe (PLP) which includes an incomplete FEC block, and the preamble may be for signaling start position information of a first complete FEC block in the Physical Layer Pipe (PLP).

In this case, the step S1260 may be performed by using one of a plurality of operation modes.

In this case, the operation modes may include a first mode corresponding to no time interleaving, a second mode for performing a Convolutional time interleaving and a third mode for performing a Hybrid time interleaving.

In this case, the operation mode may correspond to the time interleaving mode. In this case, the time interleaving mode corresponding to the time interleaving may be signaled for each physical layer pipe. In this case, the time interleaving mode may be included in the preamble.

Furthermore, in the method according to the embodiment of the present invention, a broadcast signal frame including a preamble for signaling the time interleaving mode corresponding to the time interleaving for each of the physical layer pipes (PLPs) is generated at step S1270.

In this case, the physical layer pipes may include a plurality of core layer physical layer pipes corresponding to one complete delivered product, and the core layer physical layer pipes may be not layered division multiplexed.

In this case, each of the core layer physical layer pipes may use either a no time interleaving mode or a hybrid time interleaving mode as the time interleaving mode, and may not use a convolutional interleaving mode.

In this case, all of the core layer physical layer pipes may use an intra-subframe interleaving mode or all of the core layer physical layer pipes may use an inter-subframe interleaving mode, when all of the core layer physical layer pipes use the hybrid time interleaving mode as the time interleaving mode.

In this case, all of the core layer physical layer pipes may be configured with the same value of L1D_plp_HTI_inter_subframe when all of the core layer physical layer pipes use the hybrid time interleaving mode as the time interleaving mode.

In this case, all of the core layer physical layer pipes may use the same time interleaving unit ($N_{IU}$) when all of the core layer physical layer pipes use the hybrid time interleaving mode as the time interleaving mode and the inter-subframe interleaving mode.

In this case, any of the core layer physical layer pipes configured with the hybrid time interleaving mode may use the intra-subframe interleaving mode when at least one of the core layer physical layer pipes uses the no time interleaving mode as the time interleaving mode.

In this case, the one complete delivered product may correspond to at least one subframe, and the subframe may be filled with dummy modulation values first and then the actual physical layer pipe data may be overwritten for generating the subframe.

In this case, the dummy modulation values may be generated by using a scrambling sequence generated using a generator polynomial corresponding to $1+X+X^3+X^6+X^7+X^{11}+X^{12}+X^{13}+X^{16}$.

In this case, the dummy modulation values may be generated by mapping a value of the scrambling sequence into one among two phases which are separated by 180 degrees.

In this case, the physical layer pipes may include one enhanced layer physical layer pipe and a plurality of core layer physical layer pipes which are layered-division multiplexed with the one enhanced layer physical layer pipe.

In this case, the time interleaving mode corresponding to the enhanced layer physical layer pipe may be the same as time interleaving modes corresponding to the core layer physical layer pipes with which the enhanced layer physical layer pipe is layered-division multiplexed.

In this case, the time interleaving modes corresponding to the core layer physical layer pipes with which the enhanced layer physical layer pipe is layered-division multiplexed may be all no time interleaving mode or all hybrid time interleaving mode.

In this case, the core layer physical layer pipes with which the enhanced layer physical layer pipe is layered-division multiplexed may all use an intra-subframe interleaving mode, when the time interleaving modes corresponding to the core layer physical layer pipes with which the enhanced layer physical layer pipe is layered-division multiplexed are all hybrid time interleaving mode.

In this case, each of core layer physical layer pipes with which the enhanced layer physical layer pipe is layered-division multiplexed may consist of an integer number of FEC blocks within each subframe, when the time interleaving modes corresponding to the core layer physical layer pipes with which the enhanced layer physical layer pipe is layered-division multiplexed are all no time interleaving mode.

In this case, all of available data cells of the subframe may be filled with dummy modulation values first and then the actual physical layer pipe data may be overwritten for generating the subframe.

In this case, the dummy modulation values may be generated by using a scrambling sequence generated using a generator polynomial corresponding to $1+X+X^3+X^6+X^7+X^{11}+X^{12}+X^{13}+X^{16}$.

In this case, the dummy modulation values may be generated by mapping a value of the scrambling sequence into one among two phases which are separated by 180 degrees.

In this case, the scrambling sequence may be generated by using eight bits which are generated by a third bit output ($x^{14}$), a fourth bit output ($x^{13}$), a fifth bit output ($x^{12}$), a sixth bit output ($x^{11}$), a tenth bit output ($x^7$), thirteenth bit output ($x^4$), fourteenth bit output ($x^3$) and a sixteenth bit output (x) of a shift register initialized by 0xF180 value.

In this case, the time interleaver information may be signaled on the basis of the core layer.

In this case, the preamble may be for signaling information for identifying a part of a FEC block of the enhanced layer in case that the boundary between the time interleaver groups does not correspond to a boundary between FEC blocks of the enhanced layer, the FEC block corresponding to the boundary between the time interleaver groups.

In this case, the information for identifying the part of the FEC block may include at least one of start position information of a Physical Layer Pipe (PLP) in the core layer, start position information of a Physical Layer Pipe (PLP) in the enhanced layer, modulation information corresponding to the enhanced layer, and FEC type information corresponding to the enhanced layer.

In this case, the start position information of the Physical Layer Pipe (PLP) may correspond to an index of a first data cell of the Physical Layer Pipe (PLP).

In this case, the modulation information may be signaled only if the FEC type information satisfies a predetermined condition.

In this case, the enhanced layer signal corresponds to enhanced layer data that may be restored based on cancellation corresponding to restoration of core layer data corresponding to the core layer signal.

In this case, the step S1270 may include generating the bootstrap; generating the preamble; and generating a superimposed payload corresponding to the time-interleaved signal.

In this case, the preamble may include a PLP identification information for identifying Physical Layer Pipes (PLPs); and a layer identification information for identifying layers corresponding to division of layers.

In this case, the PLP identification information and the layer identification information may be included in the preamble as fields different from each other.

In this case, the time interleaver information may be selectively included in the preamble for each of the Physical Layer Pipes (PLPs) based on a result of comparing (IF(j>0)) the layer identification information with a predetermined value.

In this case, the preamble may selectively include an injection level information corresponding to the injection level controller for each of the Physical Layer Pipes (PLPs) based on a result of comparing (IF(j>0)) the layer identification information with a predetermined value.

In this case, the bootstrap may be shorter than the preamble, and have a fixed-length.

In this case, the bootstrap may include a symbol representing a structure of the preamble, the symbol corresponding to a fixed-length bit string representing a combination of a modulation scheme/code rate, a FFT size, a guard interval length and a pilot pattern of the preamble.

In this case, the symbol may correspond to a lookup table in which a preamble structure corresponding to a second FFT size is allocated prior to a preamble structure corresponding to a first FFT size, the second FFT size being less than the first FFT size when the modulation scheme/code rates are the same, and a preamble structure corresponding to a second guard interval length is allocated prior to a preamble structure corresponding to a first guard interval length, the second guard interval length being longer than the first guard interval length when the modulation scheme/code rates are the same and the FFT sizes are the same.

In this case, the broadcast signal frame may be an ATSC 3.0 frame.

In this case, the L1 signaling information may include injection level information and/or normalizing factor information.

In this case, the preamble may include type information, start position information and size information of the Physical Layer Pipes.

In this case, the type information may be for identifying one among a first type corresponding to a non-dispersed physical layer pipe and a second type corresponding to a dispersed physical layer pipe.

In this case, the non-dispersed physical layer pipe may be assigned for contiguous data cell indices, and the dispersed physical layer pipe may include two or more subslices.

In this case, the type information may be selectively signaled according to a result of comparing the layer identification information with a predetermined value for each of the Physical Layer Pipes (PLPs).

In this case, the type information may be signaled only for the core layer.

In this case, the start position information may be identical to an index corresponding to the first data cell of the physical layer pipe.

In this case, the start position information may indicate the start position of the physical layer pipe using cell addressing scheme.

In this case, the start position information may be included in the preamble for each of the Physical Layer Pipes (PLPs) without checking a condition of a conditional statement corresponding to the layer identification information.

In this case, the size information may be generated based on the number of data cells assigned to the physical layer pipe.

In this case, the size information may be included in the preamble for each of the Physical Layer Pipes (PLPs) without checking a condition of a conditional statement corresponding to the layer identification information.

In this case, the preamble may include a field indicating a start position of a first complete FEC block corresponding to a current Physical Layer Pipe for the first mode and the second mode, and may not include the field indicating the start position of the first FEC block for the third mode.

In this case, the field indicating the start position of the first FEC block may be one of a first field used in the first mode and a second field used in the second mode, and the first field and the second field may have different lengths.

In this case, the length of the second field may be longer than the length of the first field.

In this case, the length of the first field may be determined based on a length of a LDPC codeword and a modulation order and the length of the second field may be determined not only by the length of the LDPC codeword and the modulation order but also by further considering a depth of a Convolutional time interleaver.

In this case, the length of the first field may be 15 bits and the length of the second field may be 22 bits.

In this case, the first field and the second field may be separately signaled for each of a core layer corresponding to the core layer signal and an enhanced layer corresponding to the enhanced layer signal.

Although not explicitly shown in FIG. 14, the method may further include the step of generating signaling information including injection level information corresponding to step S1230. In this case, the signaling information may be L1 signaling information.

The method of generating broadcast signal frame shown in FIG. 14 may correspond to step S210 shown in FIG. 2.

Although not explicitly shown in FIG. 14, the method may further include the step of inserting dummy values to the enhanced layer data between step S1220 and step S1230.

In this case, the dummy values may be inserted after the actual data cells of the last Enhanced PLP in a PLP group so that the total number of Enhanced Layer cells in the PLP group is the same as the total number of Core Layer cells in the PLP group.

In this case, the dummy values may be not inserted in core layer data.

In this case, the dummy values may be inserted after core layer and enhanced layer BICMs and before the core layer signal and the enhanced layer signal are combined.

In this case, the dummy values may correspond to a predetermined scrambling sequence.

In this case, the scrambling sequence may be modulated by using the same constellation mapping that is used for the last Enhanced PLP.

In this case, the dummy values may have the same power as the last Enhanced PLP.

In this case, the scrambling sequence may be generated by a 16-bit shift register corresponding to a predetermined generator polynomial.

In this case, the scrambling sequence may be generated by a generator polynomial corresponding to $1+X+X^3+X^6+X^7+X^{11}+X^{12}+X^{13}+X^{16}$.

In this case, the scrambling sequence may be generated by using eight bits which are generated by a third bit output ($x^{14}$), a fourth bit output ($x^{13}$), a fifth bit output ($x^{12}$), a sixth bit output ($x^{11}$), a tenth bit output ($x^7$), thirteenth bit output ($x^4$), fourteenth bit output ($x^3$) and a sixteenth bit output (x) of a shift register initialized by 0xF180 value.

Figure 15:
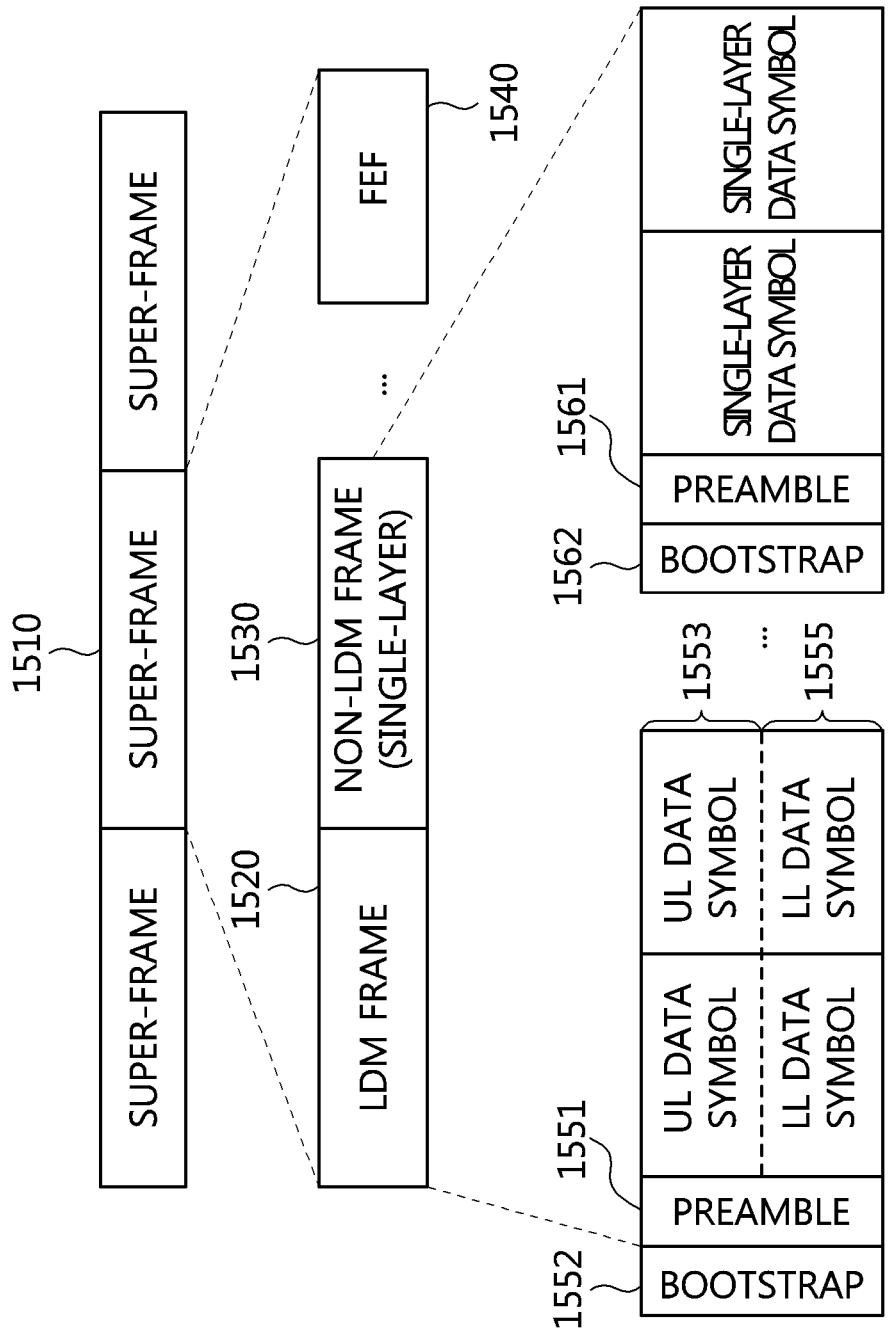
FIG. 15 is a diagram showing a structure of a super-frame which includes broadcast signal frames according to an embodiment of the present invention.

FIG. 15 is a diagram showing a structure of a super-frame which includes broadcast signal frames according to an embodiment of the present invention.

Referring to FIG. 15, the super-frame based on the Layered Division Multiplexing (LDM) configures at least one of frame, and each frame configures at least one of OFDM symbol.

In this case, each OFDM symbol may start with at least one preamble symbol. Moreover, the frame may include a reference symbol or a pilot symbol.

The super-frame 1510 illustrated in FIG. 15, may include a LDM frame 1520, a single layer frame without LDM 1530 and a Future Extension Frame (FEF) for future extensibility 1540 and may be configured using Time Division Multiplexing (TDM).

The LDM frame 1520 may include an Upper Layer (UL) 1553 and a Lower Layer (LL) 1555 when two layers are applied.

In this case, the upper layer 1553 may correspond to the core layer and the lower layer 1555 may correspond to the enhanced layer.

In this case, the LDM frame 1520 which includes the upper layer 1553 and the lower layer 1555 may a bootstrap 1552 and a preamble 1551.

In this case, the upper layer data and the lower layer data may share the time interleaver for reducing complexity and memory size and may use the same frame length and FFT size.

Moreover, the single-layer frame 1530 may include the bootstrap 1562 and the preamble 1561.

In this case, the single-layer frame 1530 may use a FFT size, time interleaver and frame length different from the LDM frame 1520. In this case, the single-layer frame 1530 may be multiplexed with the LDM frame 1520 in the super-frame 1510 based on TDM scheme.

Figure 16:
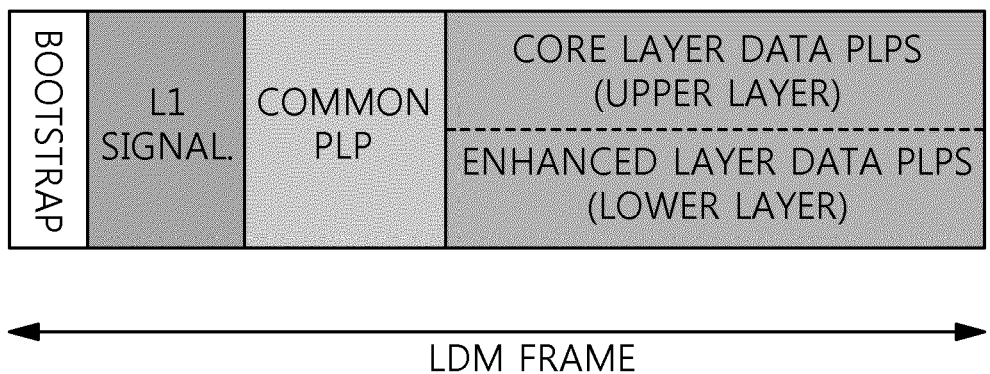
FIG. 16 is a diagram showing an example of a LDM frame including multiple-physical layer pipes and using LDM of two layers.

FIG. 16 is a diagram showing an example of a LDM frame using LDM of two layers and multiple-physical layer pipes.

Referring to FIG. 16, the LDM frame starts with a bootstrap signal including version information of the system or general signaling information. The L1 signaling signal which includes code rate, modulation information, number information of physical layer pipes may follows the bootstrap as a preamble.

The common Physical Layer Pipe (PLP) in a form of burst may be transferred following the preamble (L1 SIGNAL). In this case, the common physical layer pipe may transfer data which can be shared with other physical layer pipes in the frame.

The Multiple-Physical Layer Pipes for servicing broadcasting signals which are different from each other may be transferred using LDM scheme of two layers. In this case, the service (720p or 1080p HD, etc.) which needs robust reception performance such as indoor/mobile may use the core layer (upper layer) data physical layer pipes. In this case, the fixed reception service (4K-UHD or multiple HD, etc.) which needs high transfer rate may use the enhanced layer (lower layer) data physical layer pipes.

If the multiple physical layer pipes are layered-division-multiplexed, it can be seen that the total number of physical layer pipes increases.

In this case, the core layer data physical layer pipe and the enhanced layer data physical layer pipe may share the time interleaver for reducing complexity and memory size. In this case, the core layer data physical layer pipe and the enhanced layer data physical layer pipe may have the same physical layer pipe size (PLP size), and may have physical layer pipe sizes different from each other.

In accordance with the embodiments, the layered-divided PLPs may have PLP sizes different from one another, and information for identifying the stat position of the PLP or information for identifying the size of the PLP may be signaled.

Figure 17:
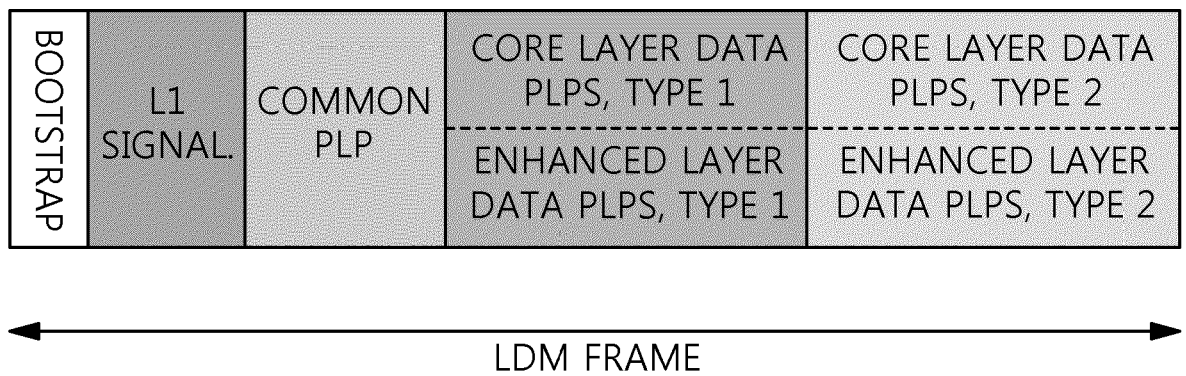
FIG. 17 is a diagram showing another example of a LDM frame including multiple-physical layer pipes and using LDM of two layers.

FIG. 17 is a diagram showing another example of a LDM frame using LDM of two layers and multiple-physical layer pipes.

Referring to FIG. 17, the LDM frame may include the common physical layer pipe after the bootstrap and the preamble (L1 SIGNAL). The core layer data physical layer pipes and the enhanced layer data physical layer pipes may be transferred using two-layer LDM scheme after the common physical layer pipe.

In particular, the core layer data physical layer pipes and the enhanced layer data physical layer pipes of FIG. 17 may correspond to one type among type 1 and type 2. The type 1 and the type 2 may be defined as follows:

Type 1 PLP
It is transferred after the common PLP if the common PLP exists
It is transferred in a form of burst (one slice) in the frame
Type 2 PLP
It is transferred after the type 1 PLP if the type 1 PLP exists
It is transferred in a form of two or more sub-slices in the frame
The time diversity and the power consumption increase as the number of sub-slices increases In this case, the type 1 PLP may correspond to a non-dispersed PLP, and the type 2 PLP may correspond to a dispersed PLP. In this case, the non-dispersed PLP may assigned for contiguous data cell indices. In this case, the dispersed PLP may assigned to two or more subslices.

Figure 18:
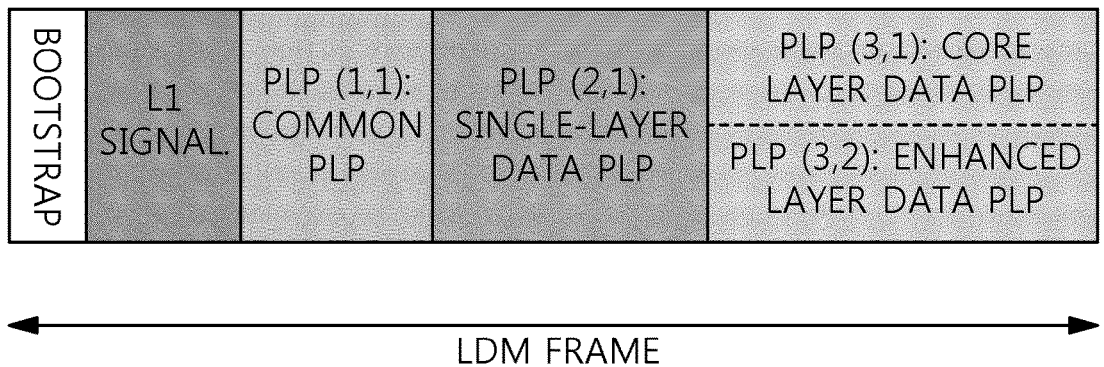
FIG. 18 is a diagram showing an application example of a LDM frame using multiple-physical layer pipes and LDM of two layers.

FIG. 18 is a diagram showing an application example of LDM frame using LDM of two layers and multiple physical layer pipes.

Referring to FIG. 18, the common physical layer pipe (PLP(1,1)) may be included after the bootstrap and the preamble in the LDM frame. The data physical layer pipe (PLP(2,1)) for robust audio service may be included in the LDM frame using the time-division scheme.

Moreover, the core layer data physical layer pipe (PLP(3,1)) for mobile/indoor service (720p or 1080p HD) and the enhanced layer data physical layer pipe (PLP(3,2)) for high data rate service (4K-UHD or multiple HD) may be transferred using 2-layer LDM scheme.

Figure 19:
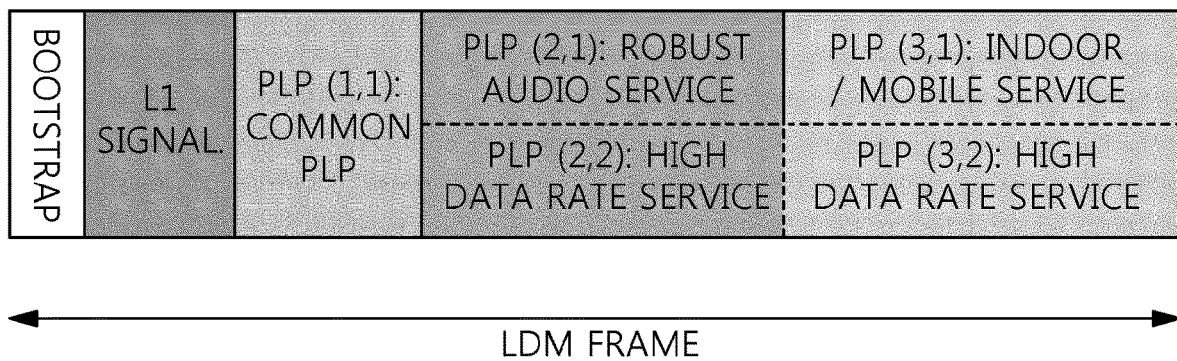
FIG. 19 is a diagram showing another application example of a LDM frame using multiple-physical layer pipes and LDM of two layers.

FIG. 19 is a diagram showing another application example of a LDM frame using LDM of two layers and multiple physical layer pipes.

Referring to FIG. 19, the LDM frame may include the bootstrap, the preamble, the common physical layer pipe (PLP(1,1)). In this case, the robust audio service and mobile/indoor service (720p or 1080p HD) may be transferred using core layer data physical layer pipes (PLP(2,1),PLP(3,1)), and the high data rate service (4K-UHD or multiple HD) may be transferred using the enhanced layer data physical layer pipes (PLP(2,2),PLP(3,2)).

In this case, the core layer data physical layer pipe and the enhanced layer data physical layer pipe may use the same time interleaver.

In this case, the physical layer pipes (PLP(2,2),PLP(3,2)) which provide the same service may be identified using the PLP_GROUP_ID indicating the same PLP group.

In accordance with the embodiment, the service can be identified using the start position and the size of each physical layer pipe without PLP_GROUP_ID when the physical layer pipes which have sizes different from each other for different LDM layers are used.

Although multiple physical layer pipes and layers corresponding to the layered division multiplexing are identified by PLP(i,j) in FIG. 18 and FIG. 19, the PLP identification information and the layer identification information may be signaled as fields different from each other.

In accordance with the embodiment, different layers may use PLPs having different sizes. In this case, each service may be identified using the PLP identifier.

The PLP start position and the PLP size may be signaled for each PLP when PLPs having different sizes are used for different layers.

The following pseudo code is for showing an example of fields included in the preamble according to an embodiment of the present invention. The following pseudo code may be included in the L1 signaling information of the preamble.

| [Pseudo Code] | |
|---|---|
| SUB_SLICES_PER_FRAME | (15 bits) |
| NUM_PLP | (8 bits) |
| NUM_AUX | (4 bits) |
| AUX_CONFIG_RFU | (8 bits) |
| for i=0.. NUM_RF-1 { | |
| RF_IDX | (3 bits) |
| FREQUENCY | (32 bits) |
| } | |
| IF S2=='xxx1' { | |
| FEF_TYPE | (4 bits) |
| FEF_LENGTH | (22 bits) |
| FEF_INTERVAL | (8 bits) |
| } | |
| for i=0 .. NUM_PLP-1 { | |
| NUM_LAYER | (2~3 bits) |
| for j=0 .. NUM_LAYER-1{ | |
| /* Signaling for each layer */ | |
| PLP_ID (i, j) | (8 bits) |
| PLP_GROUP_ID | (8 bits) |
| PLP_TYPE | (3 bits) |
| PLP_PAYLOAD_TYPE | (5 bits) |
| PLP_COD | (4 bits) |
| PLP_MOD | (3 bits) |
| PLP_SSD | (1 bit) |
| PLP_FEC_TYPE | (2 bits) |
| PLP_NUM_BLOCKS_MAX | (10 bits) |
| IN_BAND_A_FLAG | (1 bit) |
| IN_BAND_B_FLAG | (1 bit) |
| PLP_MODE | (2 bits) |
| STATIC_PADDING_FLAG | (1 bit) |
| IF (j > 0) | |
| LL_INJECTION_LEVEL | (3~8 bits) |
| } /* End of NUM_LAYER loop */ | |
| /* Common signaling for all layers */ | |
| FF_FLAG | (1 bit) |
| FIRST_RF_IDX | (3 bits) |
| FIRST_FRAME_IDX | (8 bits) |
| FRAME_INTERVAL | (8 bits) |
| TIME_IL_LENGTH | (8 bits) |
| TIME_IL_TYPE | (1 bit) |
| RESERVED_1 | (11 bits) |
| STATIC_FLAG | (1 bit) |
| PLP_START | (24 bits) |
| PLP_SIZE | (24 bits) |
| } /* End of NUM_PLP loop */ | |
| FEF_LENGTH_MSB | (2 bits) |
| RESERVED_2 | (30 bits) |
| for i=0 .. NUM_AUX-1 { | |
| AUX_STREAM_TYPE | (4 bits) |
| AUX_PRIVATE_CONF | (28 bits) |
| } | |

The NUM_LAYER may correspond to two bits or three bits in the above pseudo code. In this case, the NUM_LAYER may be a field for identifying the number of layers in each PLP which is divided in time. In this case, the NUM_LAYER may be defined in the NUM_PLP loop so that the number of the layers can be different for each PLP which is divided in time.

The LL_INJECTION_LEVEL may correspond to 3~8 bits. In this case, the LL_INJECTION_LEVEL may be a field for identifying the injection level of the lower layer (enhanced layer). In this case, the LL_INJECTION_LEVEL may correspond to the injection level information.

In this case, the LL_INJECTION_LEVEL may be defined from the second layer (j>0) when the number of layers is two or more.

The fields such as PLP_ID(i,j), PLP_GROUP_ID, PLP_TYPE, PLP_PAYLOAD_TYPE, PLP_COD, PLP_MOD, PLP_SSD, PLP_FEC_TYPE, PLP_NUM_BLOCKS_MAX, IN_BAND_A_FLAG, IN_BAND_B_FLAG, PLP_MODE, STATIC_PADDING_FLAG, etc. may correspond to parameters which are defined for each layer, and may be defined inside of the NUM_LAYER loop.

In this case, the PLP_ID(i,j) may correspond to the PLP identification information and the layer identification information. For example, the 'i' of the PLP_ID(i,j) may correspond to the PLP identification information and the 'j' of the PLP_ID(i,j) may correspond to the layer identification information.

In accordance with embodiments, the PLP identification information and the layer identification information may be included in the preamble as fields different from each other.

Moreover, the time interleaver information such as the TIME_IL_LENGTH and TIME_IL_TYPE, etc., the FRAME_INTERVAL which is related to the PLP size and fields such as FF_FLAG, FIRST_RF_IDX, FIRST_FRAME_IDX, RESERVED_1, STATIC_FLAG, etc. may be defined outside of the NUM_LAYER loop and inside of the NUM_PLP loop.

In particular, the PLP_TYPE corresponds to type information of the physical layer pipes and may correspond to 1 bit for identifying one among two types, type 1 and type 2. The PLP_TYPE is included in the preamble without checking a condition of a conditional statement corresponding to the layer identification information (j) in the above pseudo code, but the PLP_TYPE may be selectively signaled (transferred only for the core layer) based on a result (if(j=0)) of comparing the layer identification information (j) with a predetermined value (0).

The PLP_TYPE is defined in the NUM_LAYER loop in the above pseudo code, but the PLP_TYPE may be defined outside of the NUM_LAYER loop and inside of the NUM_PLP loop.

In the above pseudo code, the PLP_START corresponds to a start position of the corresponding physical layer pipe. In this case, the PLP_START may identify the start position using cell addressing scheme. In this case, the PLP_START may be an index corresponding to a first data cell of the corresponding PLP.

In particular, the PLP_START may be signaled for every physical layer pipe and may be used for identifying services using the multiple-physical layer pipes together with a field for signaling the size of the PLP.

The PLP_SIZE in the above pseudo code corresponds to size information of the physical layer pipes. In this case, the PLP_SIZE may be identical to the number of data cells assigned to the corresponding physical layer pipe.

That is, the PLP_TYPE may be signaled based on the layer identification information and the PLP_SIZE and the PLP_START may be signaled for every physical layer pipe without considering the layer identification information.

The combiner 340 shown in FIG. 3 and FIG. 7 functions to combine the core layer signal and the enhanced layer signal, and the combining may be performed on a time interleaver group basis shared by the core layer signal and the enhanced layer signal because the core layer signal and the enhanced layer signal share one time interleaver.

In this case, the time interleaver group may be set based on the core layer in terms of memory efficiency and system efficiency.

However, when a time interleaver group is set based on the core layer, there may exist a FEC block that is divided by the time interleaver group boundary in the enhanced layer. If such a FEC block which is divided exist, signaling of fields for identifying a portion of the FEC block corresponding to the time interleaver group boundary may be required.

The time interleaver for the Layered Division Multiplexing may be a convolutional time interleaver (CTI) or a hybrid time interleaver (HTI). In this case, the convolutional time interleaver may be used when there is one Physical Layer Pipe in the core layer, and the hybrid time interleaver may be used when there are two or more Physical Layer Pipes in the core layer. When the hybrid time interleaver is used, the Physical Layer Pipes may include only complete FEC blocks.

Figure 20:
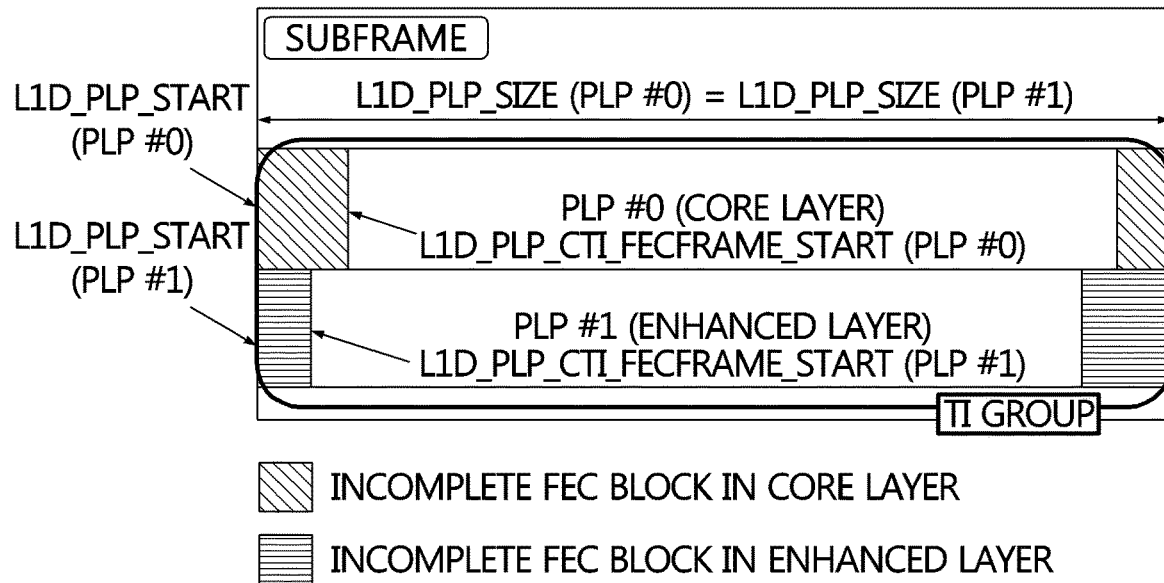
FIG. 20 is a diagram showing an example in which a convolutional time interleaver is used.

FIG. 20 is a diagram showing an example in which a convolutional time interleaver is used.

Referring to FIG. 20, the subframe includes two layers, the core layer and the enhanced layer.

As the subframe includes only one Physical Layer Pipe (PLP #0) in the core layer in the example shown in FIG. 20, the time interleaver corresponding to the subframe is a convolutional time interleaver. The Physical Layer Pipes in each layer may include an incomplete FEC block when the convolutional time interleaver is used.

Such an incomplete FEC block is located at the edge of the PLP and can be identified using a field such as "L1D_plp_CTI_fec_block_start" indicating the position of the first complete FEC block in each PLP.

In the example shown in FIG. 20, the Physical Layer Pipe (PLP #0) of the core layer and the Physical Layer Pipe (PLP #1) of the enhanced layer have the same start position and size.

In the example shown in FIG. 20, it can be seen that the time interleaver group (TI Group) corresponds to the Physical Layer Pipe (PLP #0) of the core layer. The time interleaver group is commonly applied to the core layer and the enhanced layer, and it is advantageous in terms of memory and system efficiency to be set corresponding to the core layer.

Figure 21:
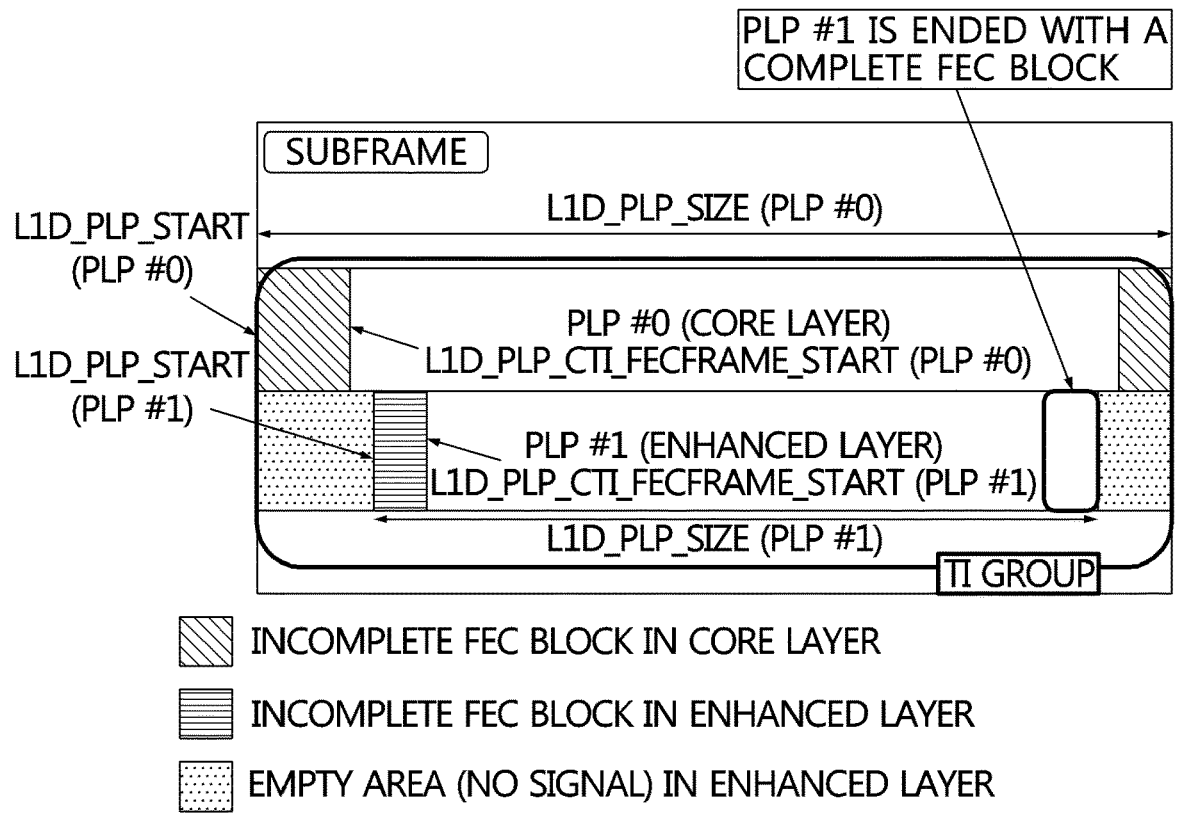
FIG. 21 is a diagram showing another example in which a convolutional time interleaver is used.

FIG. 21 is a diagram showing another example in which a convolutional time interleaver is used.

Referring to FIG. 21, it can be seen that the starting positions and sizes of the core layer physical layer pipe (PLP #0) and the enhanced layer physical layer pipe (PLP #1) are different.

If the start position and the size of the core layer physical layer pipe (PLP #0) and the start position and the size of the enhanced layer physical layer pipe (PLP #1) are different from each other, an empty area may be included in the enhanced layer.

As shown in FIG. 21, when the empty area is included at the rear end of the enhanced layer physical layer pipe (PLP #1), the enhanced layer physical layer pipe (PLP #1) is ended with a complete FEC block.

Figure 22:
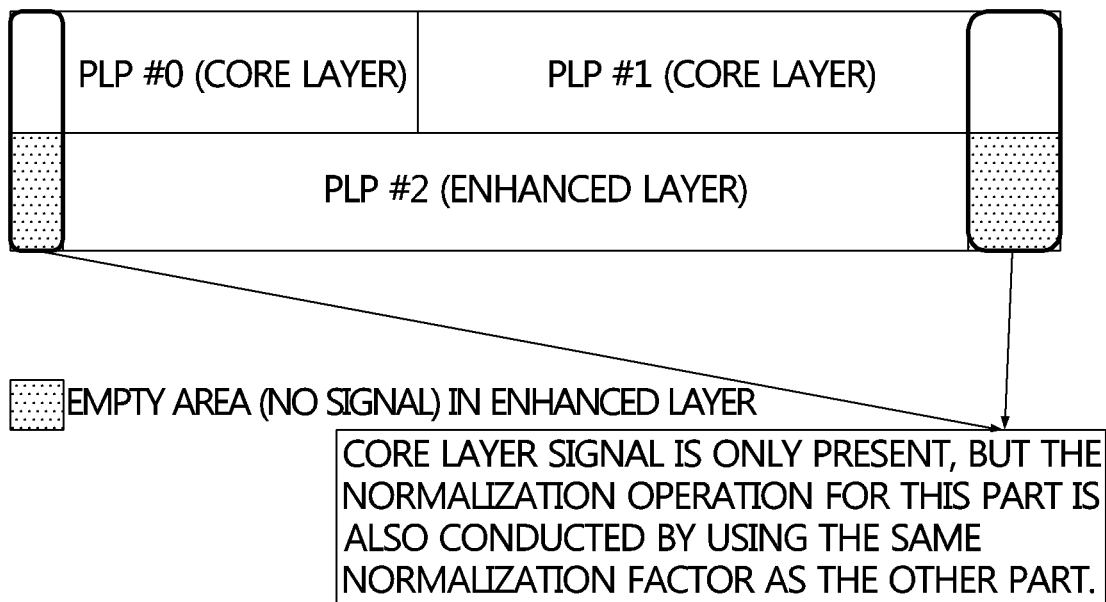
FIG. 22 is a diagram showing an example in which a hybrid time interleaver is used.

FIG. 22 is a diagram showing an example in which a hybrid time interleaver is used.

Referring to FIG. 22, two Physical Layer Pipes (PLP #0, PLP #1) are included in the core layer.

Thus, when the core layer is composed of multiple Physical Layer Pipes, a hybrid time interleaver is used.

When a hybrid time interleaver is used, all Physical Layer Pipes of the core layer and the enhanced layer include only complete FEC blocks.

In this case, some parts of the enhanced layer may be emptied for alignment with the core layer boundary.

Figure 23:
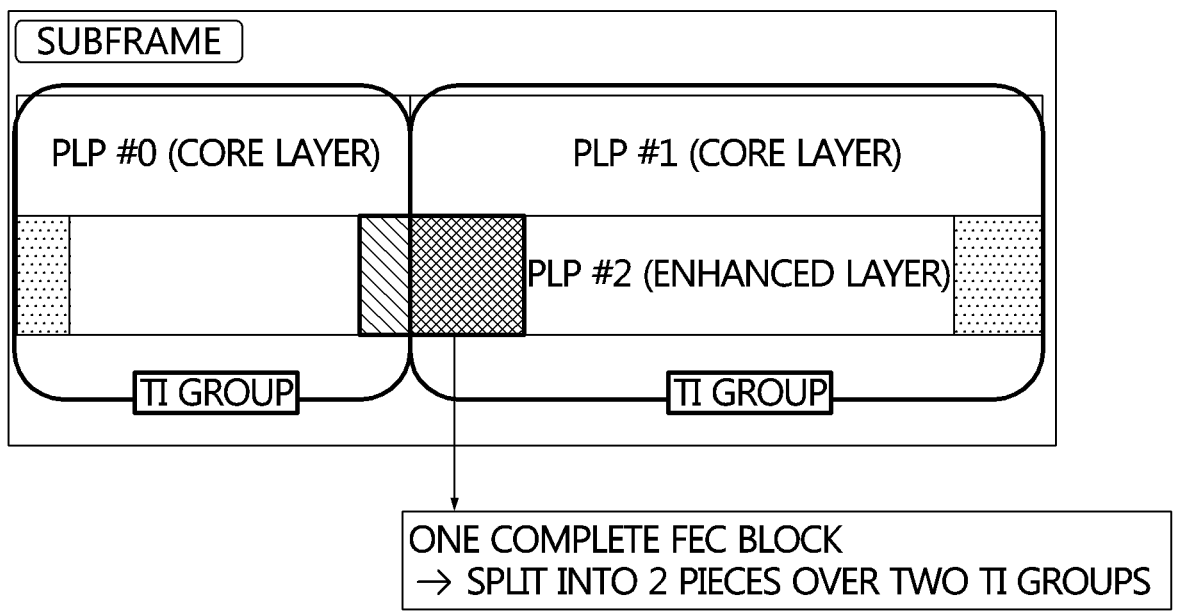
FIG. 23 is a diagram showing time interleaver groups in the example of FIG. 22.

FIG. 23 is a diagram showing time interleaver groups in the example of FIG. 22.

Referring to FIG. 23, it can be seen that the time interleaver group boundaries are set corresponding to the boundaries of the Physical Layer Pipes of the core layer.

Although the time interleaver group includes one core layer physical layer pipe in FIG. 23, according to an embodiment, the time interleaver group may include two or more core layer physical pipes.

In the example shown in FIG. 23, one FEC block of the enhanced layer may be divided by the time interleaver group boundary.

This is because time interleaver group partitioning is performed on a core layer basis, in which case it is possible to signal information for identifying an incomplete FEC block of the enhanced layer, the incomplete FEC block corresponding to the time interleaver group boundary.

Figure 24:
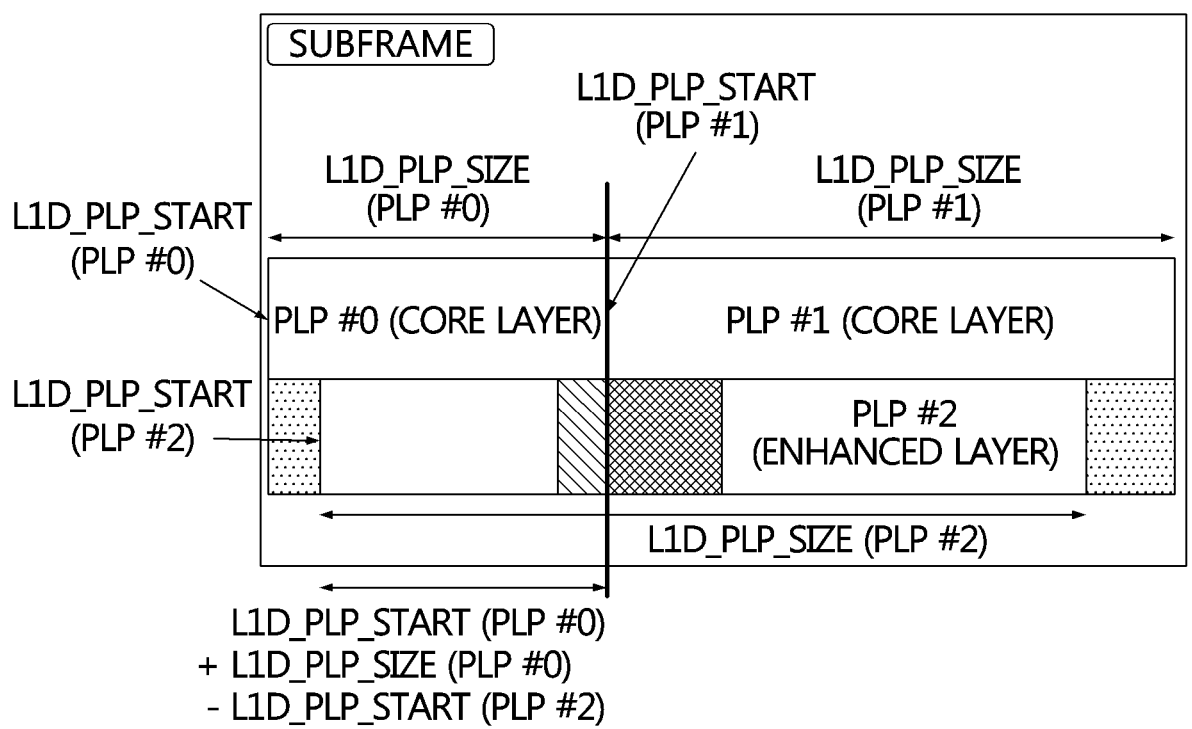
FIGS. 24-26 are diagrams showing a process for calculating a size of the incomplete FEC block in the example of FIG. 23.
Figure 25:
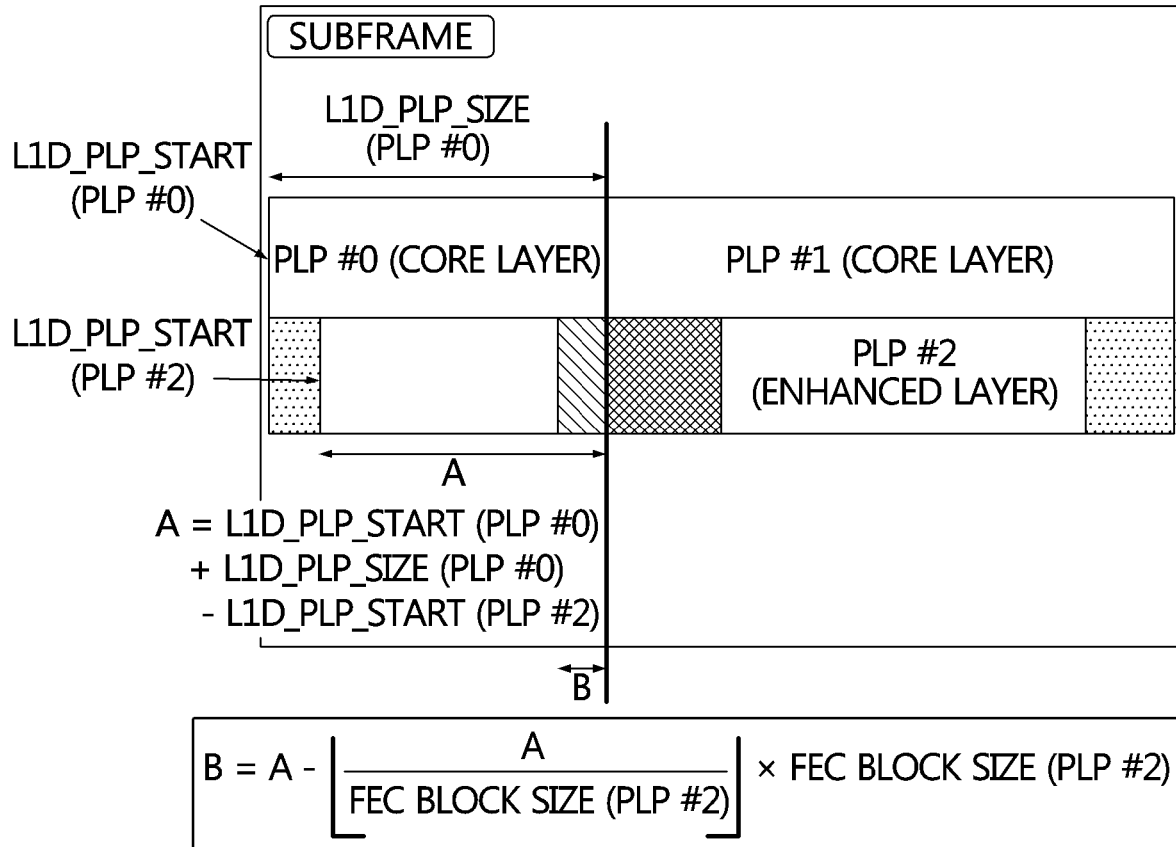
Figure 26:
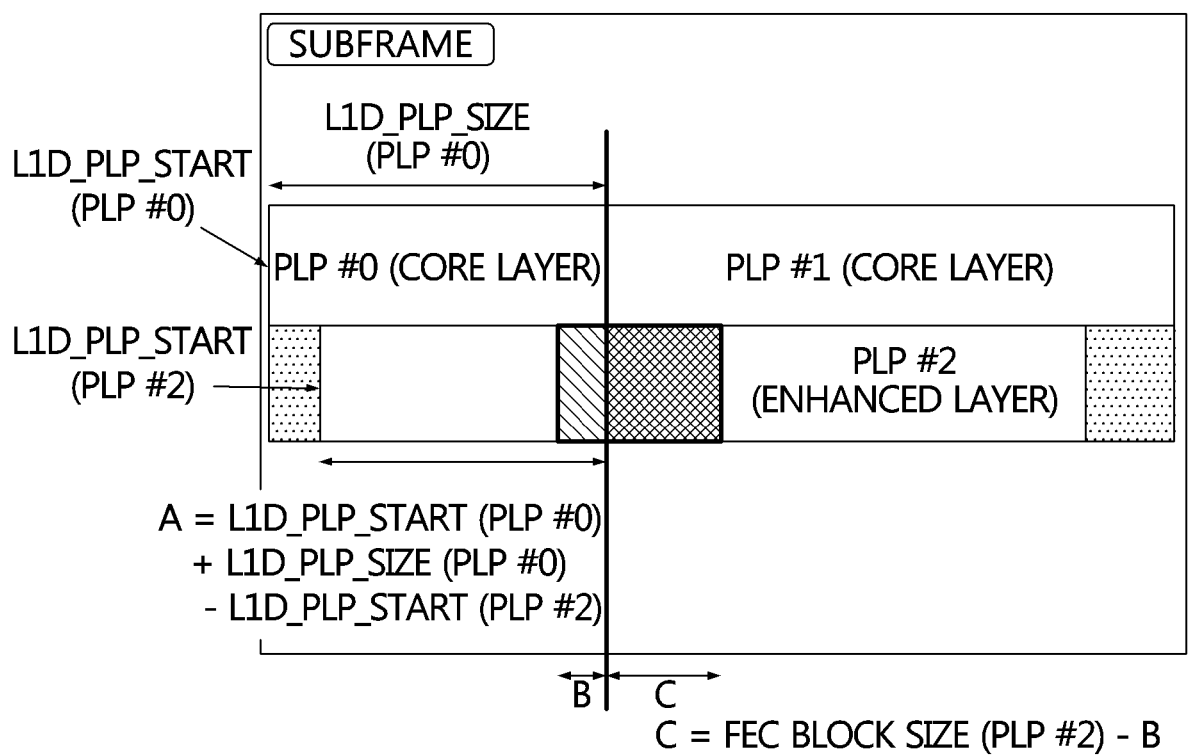

FIGS. 24 to 26 are diagrams showing a process of calculating the size of an incomplete FEC block in the example of FIG. 23.

Referring to FIG. 24, the distance (A) between the start position of the enhanced layer physical layer pipe (L1D_plp_start(PLP #2)) and the time interleaver group boundary is calculated using the start position of the core layer physical layer pipe (L1D_plp_start(PLP #0)), the size of the core layer physical layer pipe (L1D_plp_size(PLP #0)) and the start position of the enhanced layer physical layer pipe (L1D_plp_start(PLP #2)).

Referring to FIG. 25, the distance (B) between the start position of the divided FEC block and the time interleaver group boundary is calculated using the FEC block size of the enhanced layer.

In this case, the FEC block size may be decided by using the modulation information (L1D_plp_mod) corresponding to the enhanced layer and the FEC type information (L1D_plp_fec_type) corresponding to the enhanced layer.

Referring to FIG. 26, the part (C) of the FEC block of the enhanced layer corresponding to the boundary between the time interleaver groups is identified.

Table 3 below shows an example of L1-Detail fields of the preamble according to an embodiment of the present invention.

The preamble according to an embodiment of the present invention may include L1-Basic and L1-Detail.

TABLE 3

|  | # of bits |
|---|---|
| Syntax | |
| L1_Detail_signaling( ) { | |
|   L1D_version | 4 |
|   L1D_num_rf | 3 |
|   for L1D_rf_id=1 .. L1D_num_rf { | |
|     L1D_rf_frequency | 19 |
|   } | |
|   if ( L1B_time_info_flag != 00 ) { | |
|     L1D_time_sec | 32 |
|     L1D_time_msec | 10 |

TABLE 3-continued

| | # of bits |
|---|---|
|        if ( L1B_time_info_flag != 01 ) { | |
|           L1D_time_usec | 10 |
|           if ( L1B_time_info_flag != 10 ) { | |
|               L1D_time_nsec | 10 |
|           } | |
|        } | |
|    } | |
|    for i=0 .. L1B_num_subframes { | |
|        if (i > 0) { | |
|           L1D_mimo | 1 |
|           L1D_miso | 2 |
|           L1D_fft_size | 2 |
|           L1D_reduced_carriers | 3 |
|           L1D_guard_interval | 4 |
|           L1D_num_ofdm_symbols | 11 |
|           L1D_scattered_pilot_pattern | 5 |
|           L1D_scattered_pilot_boost | 3 |
|           L1D_sbs_first | 1 |
|           L1D_sbs_last | 1 |
|        } | |
|        if (L1B_num_subframes>0) { | |
|           L1D_subframe_multiplex | 1 |
|    } | |
|    L1D_frequency_interleaver | 1 |
|    L1D_num_plp | 6 |
|    for j=0 .. L1D_num_plp { | |
|        L1D_plp_id | 6 |
|        L1D_plp_lls_flag | 1 |
|        L1D_plp_layer | 2 |
|        L1D_plp_start | 24 |
|        L1D_plp_size | 24 |
|        L1D_plp_scrambler_type | 2 |
|        L1D_plp_fec_type | 4 |
|        if (L1D_plp_fec_type $\in$ {0,1,2,3,4,5}) { | |
|           L1D_plp_mod | 4 |
|           L1D_plp_cod | 4 |
|        } | |
|        L1D_plp_TI_mode | 2 |
|        if ( L1D_plp_TI_mode=00 ) { | |
|           L1D_plp_fec_block_start | 15 |
|        } | |
|        if ( L1D_plp_TI_mode=01 ) { | |
|           L1D_plp_CTI_fec_block_start | 22 |
|        } | |
|        if (L1D_num_rf>0) { | |
|           L1D_plp_num_channel_bonded | 3 |
|           if (L1D_plp_num_channel_bonded>0) { | |
|               L1D_plp_channel_bonding_format | 2 |
|               for k=0 .. L1D_plp_num_channel_bonded{ | |
|                   L1D_plp_bonded_rf_id | 3 |
|               } | |
|           } | |
|        } | |
|        if (i=0 && L1B_first_sub_mimo=1) \|\| (i >1 && L1D_mimo=1) { | |
|           L1D_plp_stream_combining | 1 |
|           L1D_plp_IQ_interleaving | 1 |
|           L1D_plp_PH | 1 |
|        } | |
|        if (L1D_plp_layer=0) { | |
|           L1D_plp_type | 1 |
|           if L1D_plp_type=1 { | |
|               L1D_plp_num_subslices | 14 |
|               L1D_plp_subslice_interval | 24 |
|           } | |
|           L1D_plp_TI_extended_interleaving | 1 |
|           if (L1D_plp_TI_mode=01) { | |
|               L1D_plp_CTI_depth | 3 |
|               L1D_plp_CTI_start_row | 11 |
|           } else if (L1D_plp_TI_mode=10) { | |
|               L1D_plp_HTI_inter_subframe | 1 |
|               L1D_plp_HTI_num_ti_blocks | 4 |
|               L1D_plp_HTI_num_fec_blocks_max | 12 |
|               if | |

TABLE 3-continued

| | # of bits |
|---|---|
| (L1D_plp_HTI_inter_subframe=0) { | |
|     L1D_plp_HTI_num_fec_blocks | 12 |
|   } else { | |
|     for (k=0.. | |
| L1D_plp_HTI_num_ti_blocks) { | |
|     L1D_plp_HTI_num_fec_blocks | 12 |
|     } | |
|   } | |
|     L1D_plp_HTI_cell_interleaver | 1 |
| } | |
| } else { | |
|   L1D_plp_ldm_injection_level | 5 |
| } | |
| } | |
| } | |
| L1D_reserved | as needed |
| L1D_crc | 32 |
| } | |

All fields corresponding to assigned bits in Table 3 may correspond to unsigned integer most significant bit first (uimsbf) format.

Among fields in Table 3, L1D_plp_layer may be a field for representing a layer corresponding to each physical layer pipe. L1D_plp_start may correspond to start position information of the current PLP, and may indicate an index of the first data cell of the current PLP. L1D_plp_size may correspond to size information of the current PLP, and may indicate the number of data cells allocated to the current PLP.

L1D_plp_fec_type may correspond to FEC type information of the current PLP, and may indicate the Forward Error Correction (FEC) method used for encoding the current PLP.

For example, L1D_plp_fec_type="0000" may correspond to BCH and 16200 LDPC, L1D_plp_fec_type="0001" may correspond to BCH and 64800 LDPC, L1D_plp_fec_type="0010" may correspond to CRC and 16200 LDPC, L1D_plp_fec_type="0011" may correspond to CRC and 64800 LDPC, L1D_plp_fec_type="0100" may correspond to 16200 LDPC, and L1D_plp_fec_type="0101" may correspond to 64800 LDPC.

L1D_plp_mod may indicate modulation information of the current PLP. In this case, L1D_plp_mod may be signaled only if L1D_plp_fec_type satisfies a predetermined condition as shown in Table 3.

For example, L1D_plp_mod="0000" may correspond to QPSK, L1D_plp_mod="0001" may correspond to 16QAM-NUC, L1D_plp_mod="0010" may correspond to 64QAM-NUC, L1D_plp_mod="0011" may correspond to 256QAM-NUC, L1D_plp_mod="0100" may correspond to 1024QAM-NUC and L1D_plp_mod="0101" may correspond to 4096QAM-NUC. In this case, L1D_plp_mod can be set to "0100" or "0101" only if L1D_plp_fec_type corresponds to 64800 LDPC.

L1D_plp_TI_mode indicates the time interleaving mode of the PLP.

For example, L1D_plp_TI_mode="00" may represent no time interleaving mode, L1D_plp_TI_mode="01" may represent convolutional time interleaving mode and L1D_plp_TI_mode="10" may represent hybrid time interleaving mode.

L1D_plp_fec_block_start may correspond to start position information of the first complete FEC block in the physical layer pipe. L1D_plp_fec_block_start may be signaled only if L1D_plp_TI_mode="00".

When the Layered Division Multiplexing is used, L1D_plp_fec_block_start may be signaled separately for each layer since the start positions of the first FEC blocks in each layer can be different.

L1D_plp_CTI_fec_block_start may correspond to start position information of the first complete block in the physical layer pipe. L1D_plp_CTI_fec_block_start may be signaled only if L1D_plp_TI_mode="01".

In this case, more bits may be allocated to L1D_plp_CTI_fec_block_start than L1D_plp_fec_block_start.

As described above, when L1D_plp_TI_mode="10", all PLPs include only the complete FEC blocks, so there is no need to separately signal the start position of the first FEC block.

L1D_plp_HTI_num_fec_blocks may correspond to the number of FEC blocks contained in the current interleaving frame for the physical layer pipe of the core layer.

In this case, it can be seen that each of fields (L1D_plp_CTI_depth, L1D_plp_CTI_start_row) corresponding to a Convolutional time interleaving and fields (L1D_plp_HTI_inter_subframe, L1D_plp_HTI_num_ti_blocks, L1D_plp_HTI_num_fec_blocks_max, L1D_plp_HTI_num_fec_blocks, L1D_plp_HTI_cell_interleaver, etc.) corresponding to a Hybrid time interleaving according to whether L1D_plp_TI_mode is 01 or 10 when L1D_plp_layer is 0 (core layer) are signaled as the time interleaver information.

In this case, L1D_plp_CTI_depth may indicate the number of rows used in the Convolutional time interleaver and L1D_plp_CTI_start_row may indicate the position of interleaver selector at the start of the subframe.

In this case, L1D_plp_HTI_inter_subframe may indicate the Hybrid time interleaving mode, and L1D_plp_HTI_num_ti_blocks may indicate the number of TI blocks per interleaving frame or the number of subframes over which cells from one TI block are carried, and L1D_plp_HTI_num_fec_blocks_max may indicate one less than the maximum number of FEC blocks per interleaving frame for the current Physical Layer Pipe, and L1D_plp_HTI_num_fec_blocks may indicate one less than the number of FEC blocks contained in the current interleaving frame for the current Physical Layer Pipe, and L1D_plp_HTI_cell_interleaver may indicate whether the cell interleaver is used or not.

In this case, a field such as L1D_plp_TI_mode may be signaled separately from the time interleaver information signaled based on the core layer.

Figure 27:
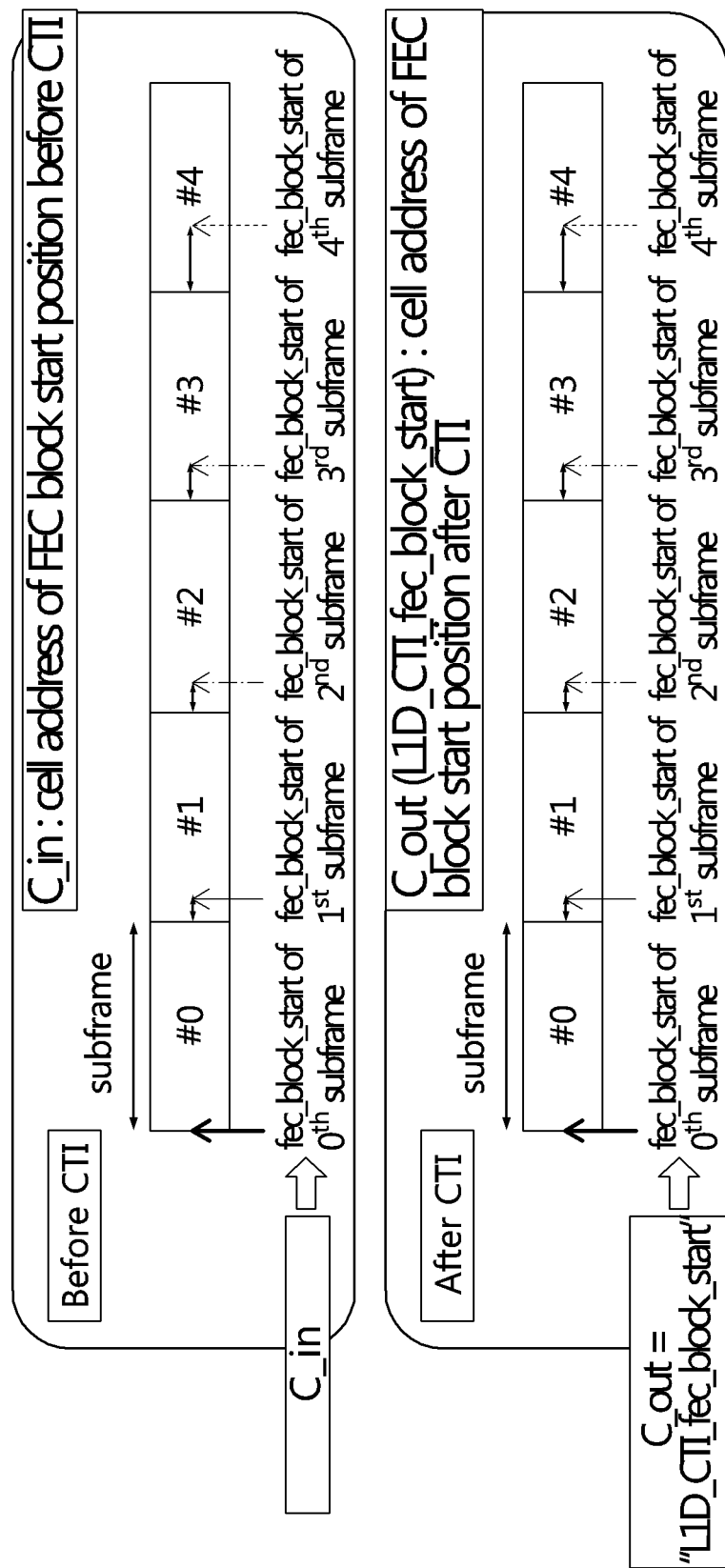
FIG. 27 is a diagram for explaining the number of bits required for L1D_plp_fec_block_start when L1D_plp_TI_mode="00"

FIG. 27 is a diagram for explaining the number of bits required for L1D_plp_fec_block_start when L1D_plp_TI_mode="00".

Referring to FIG. 27, it can be seen that cell address of FEC block_start position before time interleaving (C_in) and cell address of FEC block start position after time interleaving (C_out) are identical when L1D_plp_TI_mode="00" (no time interleaving).

In the case of no time interleaving as FIG. 27, it can be seen that the Convolutional interleaving is performed with a depth of 0.

In this case, L1D_plp_fec_block_start is defined after time interleaving so that C_out may be signaled as L1D_plp_fec_block_start for each Physical Layer Pipe in the subframe.

The longest FEC block may have a length of 64800/2=32400 when the LDPC codeword is 16200 or 64800 and the modulation order is 2, 4, 6, 8, 10 and 12.

As 32400 can be expressed by 15 bits, assigning 15 bits to L1D_plp_fec_block_start may cover the case of L1D_plp_TI_mode="00".

Figure 28:
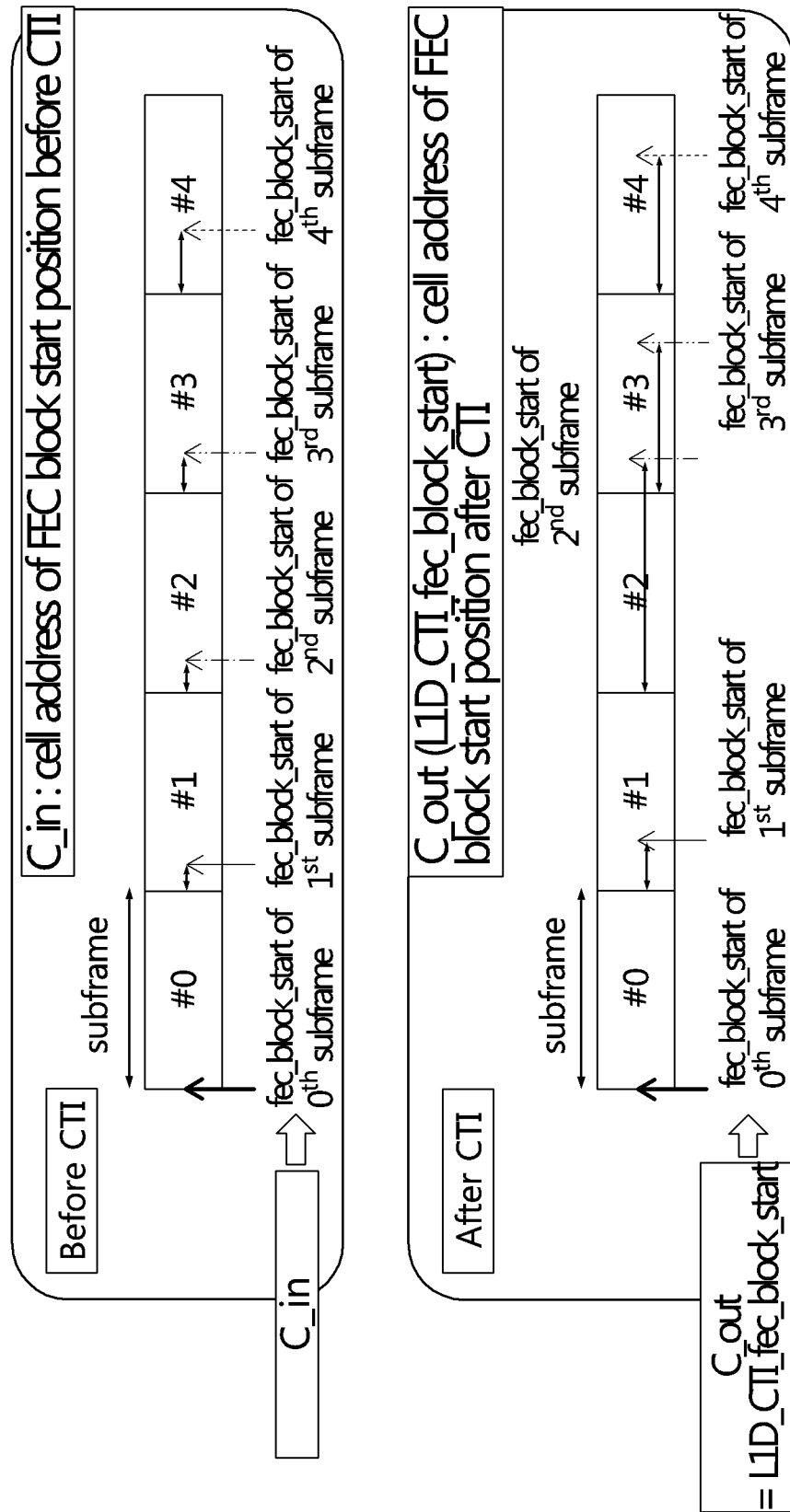
FIGS. 28 and 29 are diagrams for explaining the number of bits required for L1D_plp_CTI_fec_block_start when L1D_plp_TI_mode="01"
Figure 29:
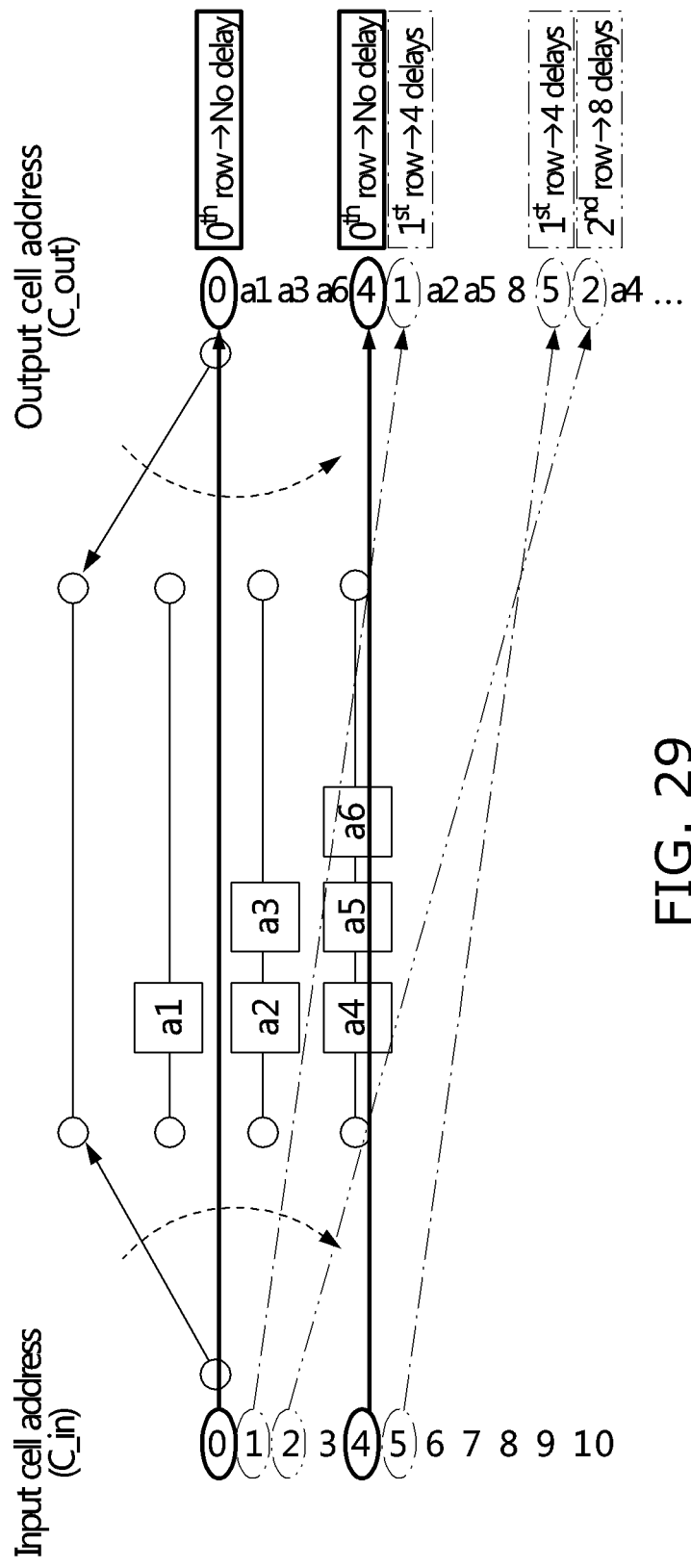

FIGS. 28 and 29 are diagrams for explaining the number of bits required for L1D_plp_CTI_fec_block_start when L1D_plp_TI_mode="01".

Referring to FIG. 28, it can be seen that cell address of FEC block start position before time interleaving (C_in) and cell address of FEC block start position after time interleaving (C_out) are different because of interleaving when L1D_plp_TI_mode="01" (Convolutional time interleaving).

In this case, L1D_plp_CTI_fec_block_start is defined after time interleaving so that C_out may be signaled as L1D_plp_CTI_fec_block_start for each Physical Layer Pipe in the subframe.

Referring to FIG. 29, it can be seen that a convolutional time interleaver having a depth of 4 operates with C_in as an input and C_out as an output.

In this case, 0 corresponds to the 0th row, 1 corresponds to the 1st row, 2 corresponds to the 2nd row, 3 corresponds to the 3rd row, 4 corresponds to the 0th row, 5 corresponds to the 1st row, 6 corresponds to the 2nd row, 7 corresponds to the 3rd row, 8 corresponds to the 0th row, 9 corresponds to the 1st row, 10 corresponds to the 2nd row in the case of the input.

At First, 0, 4, 8, etc. corresponding to the 0th row are output without delay.

1, 5, 9, etc. corresponding to the 1st row are output with 4 delays.

2, 6, 10, etc. corresponding to the 2nd row are output with 8 delays.

3, 7, etc. corresponding to the 3rd row are output with 12 delays.

That is, it can be seen that (n×4) delays occur for the n-th row.

Although the example of depth 4 (the number of rows of the time interleaver is 4) is explained in FIG. 29, the input corresponding to the n-th row is delayed by (n×N_row) when the number of rows of the time interleaver is N_row.

In this case, cell address of FEC block start position after time interleaving (L1D_plp_CTI_fec_block_start) may be calculated as (C_in +(n×N_row)). In this case, n is a row corresponding to C_in and may be determined by L1D_CTI_start_row among the time interleaving information signaled by L1-Detail. In this case, n may be ((L1D_CTI_start_row+C_in) % N_row). In this case, L1D_CTI_start_row may indicate the position of the interleaver selector at the start of the subframe.

That is, L1D_plp_CTI_fec_block_start can be calculated by adding a delay caused by time interleaving to C_in.

To calculate the number of bits required for signaling L1D_plp_CTI_fec_block_start, the maximum value of L1D_plp_CTI_fec_block_start is required. As already shown above, the maximum value of C_in is 32400, the maximum value of n is N_row−1 and N_row may be 1024 at most in the case of non-extended interleaving. In this case, the maximum value of L1D_plp_CTI_fec_block_start is (32400+(1024−1)×1024)=1079952. 1079952 can be signaled using at least 21 bits.

N_row may be 1448 at most in the case of extended interleaving. In this case, the maximum value of L1D_plp_CTI_fec_block_start is (32400+(1448−1)×1448)= 2127656. 2127656 can be signaled using at least 22 bits.

Accordingly, since the maximum value of L1D_plp_fec_block_start is identical to the maximum value of C_in when L1D_plp_TI_mode="00" and the maximum value of L1D_plp CTI_fec_block_start is the sum of the maximum value of C_in and the delay due to the interleaving when L1D_plp_TI_mode="01", an efficient signaling is possible when the number of bits used for signaling L1D_plp_CTI_fec_block_start is larger than the number of bits used for signaling L1D_plp_fec_block_start.

Since all Physical Layer Pipes of the core layer and the enhanced layer include only complete FEC blocks when L1D_plp_TI_mode="10", the start position of all Physical Layer Pipes becomes the start position of the first complete FEC block so that there is no need to signal the field such as L1D_plp_fec_block_start or L1D_plp_CTI_fec_block_start.

Figure 30:
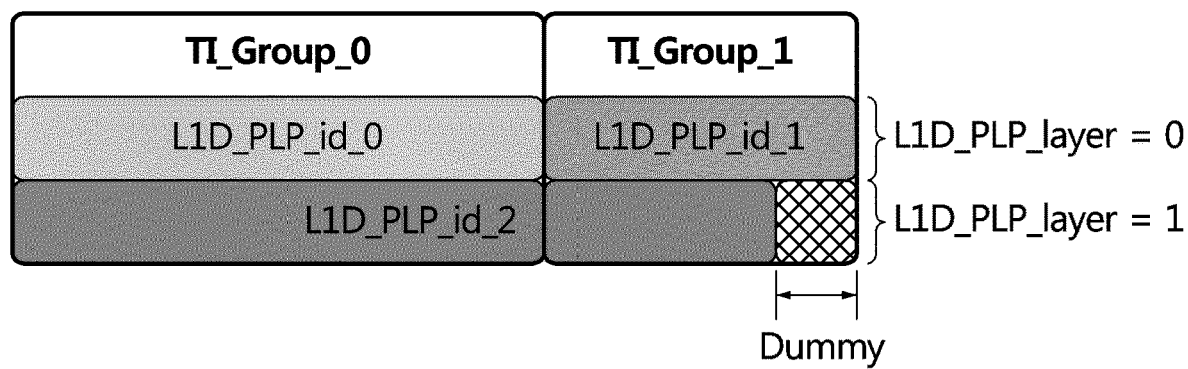
FIG. 30 is a diagram showing an insertion of Enhanced Layer dummy values when the HTI mode is used with Layered-Division Multiplexing.

FIG. 30 is a diagram showing an insertion of Enhanced Layer dummy values when the HTI mode is used with Layered-Division Multiplexing.

Referring to FIG. 30, the dummy values (Dummy) are inserted in the enhanced layer data (L1D_PLP_layer=1) of the time interleaver group (TI_Group_1).

Let a PLP group represent the complete set of PLPs associated with delivering a particular end product to receivers within a subframe.

A PLP group may contain at least one Core PLP and may also contain one or more Enhanced PLPs when Layered-Division Multiplexing is in use.

When time interleaving is configured as HTI mode, which uses an integer number of FEC Blocks for the actual PLP data, the total number of cells of Core PLP(s) may be different from that of Enhanced PLP(s) within a particular PLP group depending on ModCod configuration of each PLP. In such cases, Enhanced Layer dummy values may be inserted after the actual data cells of the last Enhanced PLP in the PLP group so that the total number of Enhanced Layer cells is the same as the total number of Core Layer cells in that PLP group. Dummy values may not be inserted in the Core Layer since time interleaver groups are configured with respect to Core PLP(s).

The insertion of Enhanced Layer dummy values may be performed after the BICM stages and before Core PLP(s) and Enhanced PLP(s) are combined. For the generation of Enhanced Layer dummy values, a scrambling sequence may be used and this scrambling sequence may be reinitialized for each relevant PLP group. Moreover, this sequence may be modulated by using the same constellation mapping that is used for the last Enhanced PLP in the current PLP group.

The Enhanced Layer dummy values may have the same power as the immediately preceding Enhanced PLP within the same PLP group so that the same scaling factor and normalizing factor which are used for the actual data are applied for the Enhanced Layer dummy values.

Figure 31:
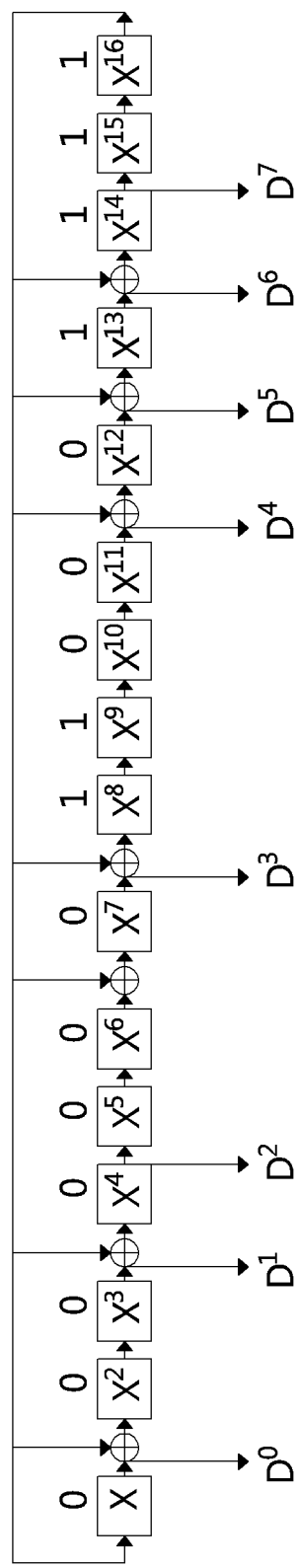
FIG. 31 is a diagram showing an example of the shift register used for generating the dummy values according to the exemplary embodiment of the present invention.

FIG. 31 is a diagram showing an example of the shift register used for generating the dummy values according to the exemplary embodiment of the present invention.

Referring to FIG. 31, the sequence is generated by the 16-bit shift register corresponding to the generator polynomial of $1+X+X^3+X^6+X^7+X^{11}+X^{12}+X^{13}+X^{16}$.

The register of FIG. 31 may be initialized by the initial sequence of 0xF180 (1111 0001 1000 0000). As explained above, the scrambling sequence may be reinitialized for each relevant PLP group.

In an example of FIG. 31, eight of the shift register outputs ($D^7$, $D^6$, . . . , $D^0$) may be output bits. After output of the output bits, the bits in the shift register may be shifted once. After the shift, the register $X^{14}$ stores 0 which corresponds to 1 exclusive or (XOR) 1, the register $X^{13}$ stores 1 which corresponds to 1 XOR 0, the register $X^{12}$ stores 1 which corresponds to 1 XOR 0, $X^{11}$ stores 0 which is previously stored in the register $X^{10}$, the register $X^7$ stores 1 which corresponds to 1 XOR 0, the register $X^4$ stores 1 which corresponds to 1 XOR 0, the register $X^3$ stores 0 which is previously stored in the register $X^2$, and the register X stores 1 which is previously stored in the register $X^{16}$.

Therefore, the output sequence (scrambling sequence) may be 1100 0000 0110 1101 0011 1111 . . . (MSB first, or $D^7$, $D^6$, . . . , $D^0$, $D^7$, $D^6$, . . . ) in the example of FIG. 31.

As explained above, each physical layer pipe (PLP) may be configured with one of the no time interleaving mode, convolutional time interleaving (CTI) mode or hybrid time interleaving (HTI) mode.

The time interleaving mode for a PLP may be indicated by L1D_plp_TI_mode, and the time interleaving mode indicated for an enhanced PLP shall be the same as the time interleaving mode indicated for the core PLP(s) with which the enhanced PLP is layered division multiplxed.

When a complete delivered product is composed of only a single constant-cell-rate PLP or is composed of a single constant-cell-rate core PLP and one or more constant-cell-rate enhanced PLPs layered division multiplexed with that core PLP, the PLP(s) comprising that complete delivered product may be configured with one of the no time interleaving mode, the convolutional time interleaving mode or the hybrid time interleaving mode.

When a complete delivered product is composed of PLPs having characteristics different from those described in the preceding paragraph, the PLPs comprising that complete delivered product may be configured with one of the no time interleaving mode or the hybrid time interleaving mode.

In this case, the complete delivered product may correspond to one service. That is, the complete delivered product may include all PLP data required for one service.

The time interleaving mode(s) for the PLPs of a particular complete delivered product may be configured independently of the time interleaving mode(s) for the PLP(s) of any other delivered products transmitted within the same RF channel. When a particular delivered product contains multiple core PLPs and/or PLPs that are not layered division multiplexed, those PLPs may be configured with the same or different time interleaving modes (i.e., no time interleaving mode and/or hybrid time interleaving mode) and/or the same or different time interleaver parameters.

Figure 32:
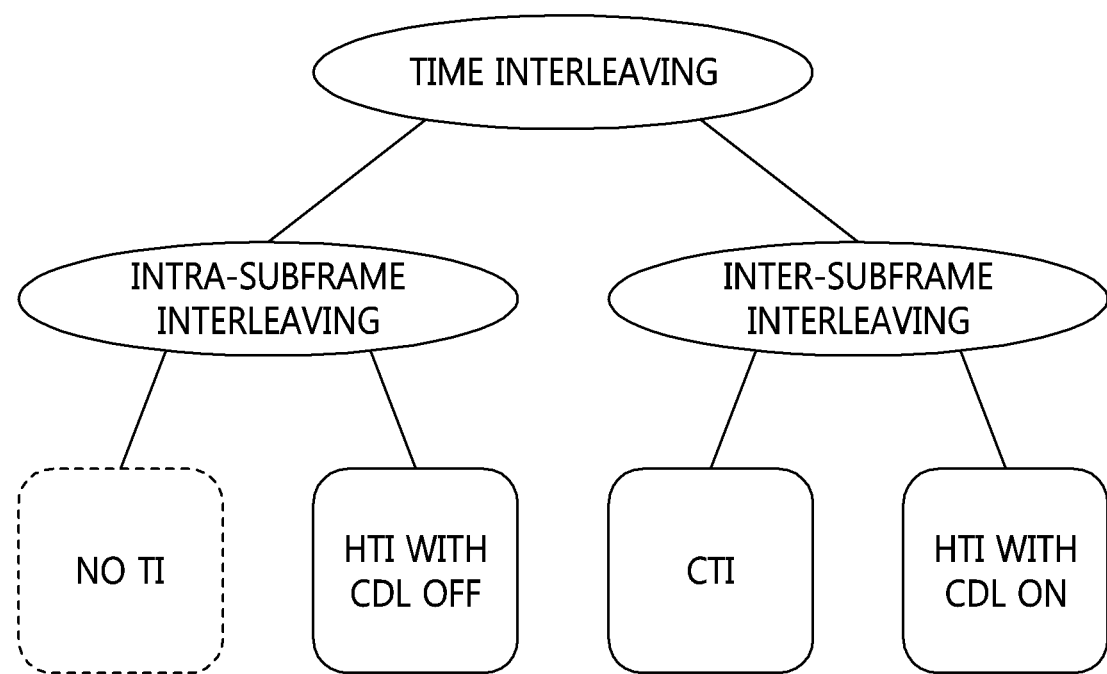
FIG. 32 is a diagram showing types of the time interleaving mode.

FIG. 32 is a diagram showing types of the time interleaving mode.

Referring to FIG. 32, the time interleaving mode is largely divided into intra-subframe interleaving and inter-subframe interleaving.

Intra-subframe interleaving corresponds to the case where interleaving occurs within a subframe. In this case, the interleaving frame is mapped to one subframe. That is, if intra-subframe interleaing is performed, the decoder may decode the corresponding physical layer pipe within the subframe.

Inter-subframe interleaving corresponds to the case where the interleaving is out of one subframe range. In this case, the interleaving frame is mapped to a plurality of subframes. That is, if inter-subframe interleaving is performed, the decoder may need data of subframes other than one subframe in order to decode the corresponding physical layer pipe.

As shown in FIG. 32, the no time interleaving mode (NO TI) corresponds to intra-subframe interleaving, and the convolutional time interleaving mode (CTI) corresponds to inter-subframe interleaving. In this case, the no time interleaving mode (NO TI) can be seen as an interleaving mode with an interleaving depth of 0.

The hybrid time interleaving mode (HTI) may correspond to intra-subframe interleaving or may correspond to inter-subframe interleaving. In case of CDL (Convolutional Delay Line) OFF, the hybrid time interleaving mode may correspond to intra-subframe interleaving. In case of CDL ON, the hybrid time interleaving mode may correspond to inter-subframe interleaving.

The field of L1D_plp_HTI_inter_subframe may be used for identifying intra-subframe interleaving or inter-subframe interleaving in case of the hybrid time interleaving mode. For example, the time interleaving mode corresponds to intra-subframe interleaving in case of L1D_plp_HTI_inter_subframe=0, and the time interleaving mode corresponds to inter-subframe interleaving in case of L1D_plp_HTI_inter_subframe=1.

The time interleaving mode or the parameters related to the time interleaving mode may be set for each core layer physical layer pipe. Therefore, the case where some of core layer physical layer pipes which are layered division multiplexed with one enhanced layer physical layer pipe use intra-subframe interleaving and others use inter-subframe interleaving can occur if a decoding process is not considered for setting the time interleaving mode or the parameters related to the time interleaving.

Figure 33:
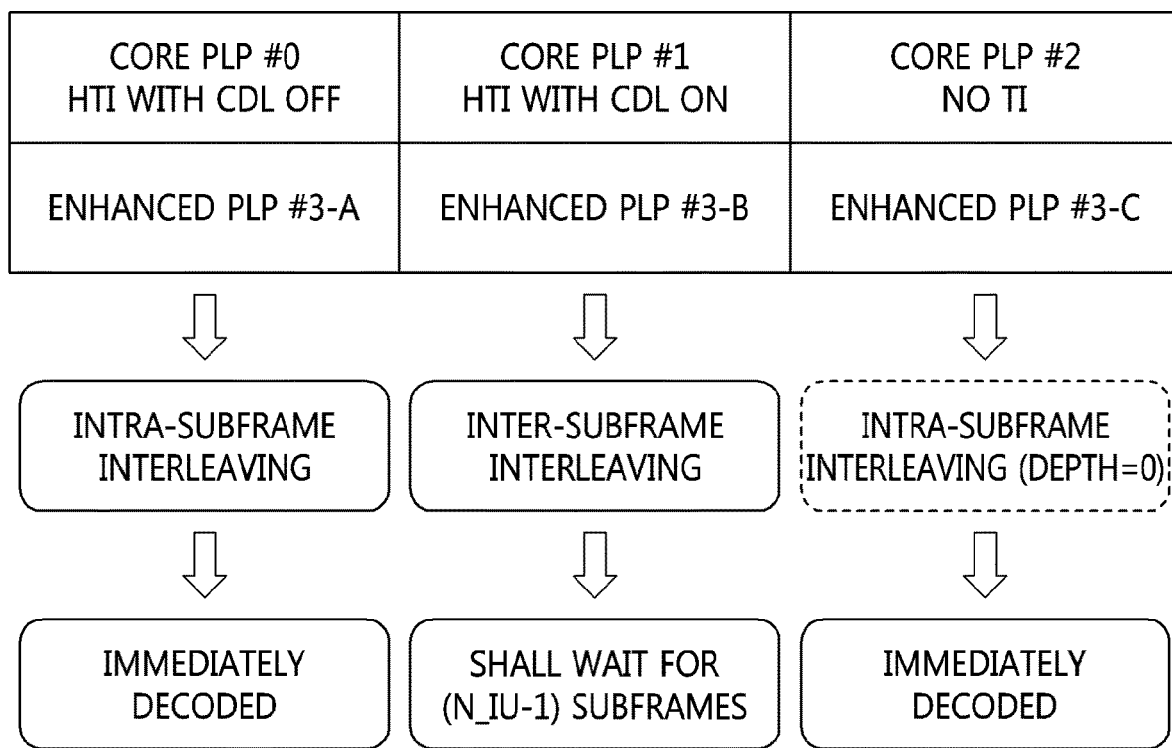
FIG. 33 is a diagram showing a case where the intra-subframe interleaving and the inter-subframe interleaving are used at the same time.

FIG. 33 is a diagram showing a case where the intra-subframe interleaving and the inter-subframe interleaving are used at the same time.

Referring to FIG. 33, three core layer physical layer pipes (CORE PLP #0, CORE PLP #1, CORE PLP #2) are layered division multiplexed with one enhanced layer physical layer pipe (ENHANCED PLP #3).

The first core layer physical layer pipe (CORE PLP #0) corresponds to intra-subframe interleaving because it corresponds to HTI mode with CDL OFF. The second core layer physical layer pipe (CORE PLP #1) corresponds to inter-subframe interleaving because it corresponds to HTI mode with CDL ON. The third core layer physical layer pipe (CORE PLP #2) corresponds to intra-subframe interleaving because it corresponds to NO TI mode.

Therefore, the first and the third core layer physical layer pipes (CORE PLP #0, CORE PLP #2) may be decoded immediately but the second core layer physical layer pipe (CORE PLP #1) can be decoded after waiting for decoding the number ($N_{IU}$−1) of subframes. In this case, the number corresponds to a time interleaving unit ($N_{IU}$). In this case, the time interleaving unit ($N_{IU}$) may be the number of subframes to which cells from one time interleaving block in case of inter-subframe interleaving.

In an example of FIG. 33, pieces of the enhanced layer physical layer pipe have different decoding timing and this means that additional latency and buffers are needed for decoding that enhanced layer physical layer pipe.

Figure 34:
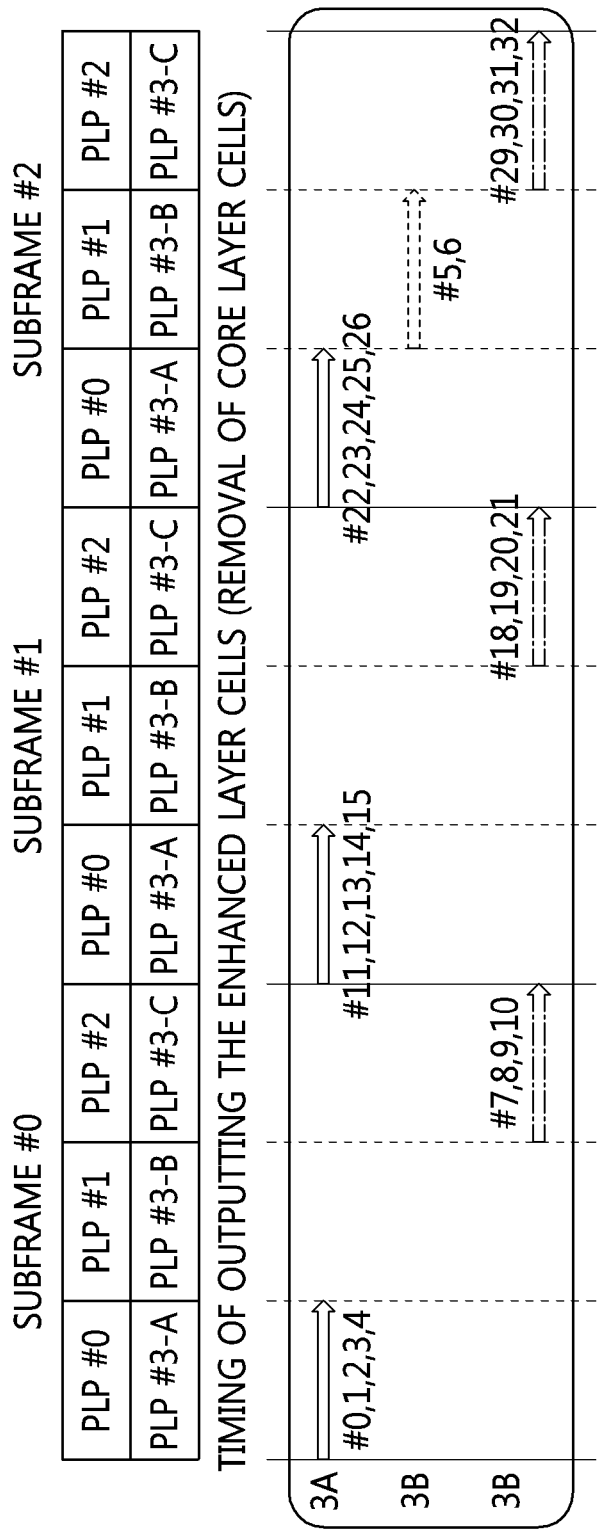
FIG. 34 is a diagram showing subframes in case that the intra-subframe interleaving and the inter-subframe interleaving are used at the same time.

FIG. 34 is a diagram showing subframes in case that the intra-subframe interleaving and the inter-subframe interleaving are used at the same time.

Referring to FIG. 34, three core layer physical layer pipes (PLP #0, PLP #1, PLP #2) are layered division multiplexed with one enhanced layer physical layer pipe (PLP #3) over three subframes.

In this case, pieces (PLP #3-A, PLP #3-B, PLP #3-C) of the enhanced layer physical layer pipe may have five, two and four FEC blocks, respectively and the time interleaving unit ($N_{IU}$) of the core layer physical layer pipe (PLP #1) may be 3. In this case, the enhanced layer physical layer pipe (PLP #3) has to wait for decoding subframes corresponding to the time interleaving unit ($N_{IU}$).

In an example of FIG. 34, timing of outputting the enhanced layer cells (removal of core layer cells) may be #0, 1, 2, 3, 4, 7, 8, 9, 10, 11, 12, 13, 14, 15, 18, 19, 20, 21, 22, 23, 24, 25, 26, 5, 6, 29, 30, 31, 32, . . . . Therefore, parts (#5, #6) of the first subframe (SUBFRAME #0) is output after waiting two subframes (SUBFRAME #1, SUBFRAME #2) and this may be a problem of decoding timing.

In order to solve such a problem of decoding timing, when a plurality of core layer physical layer pipes are layered division multiplexed with one enhanced layer physical layer pipe, it may be effective in solving the decoding timing problem and in reducing decoding complexity related to the decoding timing problem to use intra-subframe interleaving for all core layer physical layer pipes (which are layered division multiplexed with one enhanced layer physical layer pipe) or to use inter-subframe interleaving for all core layer physical layer pipes.

Even if a plurality of core layer physical layer pipes which are layered division multiplexed with one enhanced layer physical layer pipe all use inter-subframe interleaving, the time interleaving units ($N_{IUS}$) of the core layer physical layer pipes may be different from each other.

That is, decoding complexity may increase even if all core layer physical layer pipes which are layered division multiplexed with one enhanced layer physical layer pipe use inter-subframe interleaving.

Figure 35:
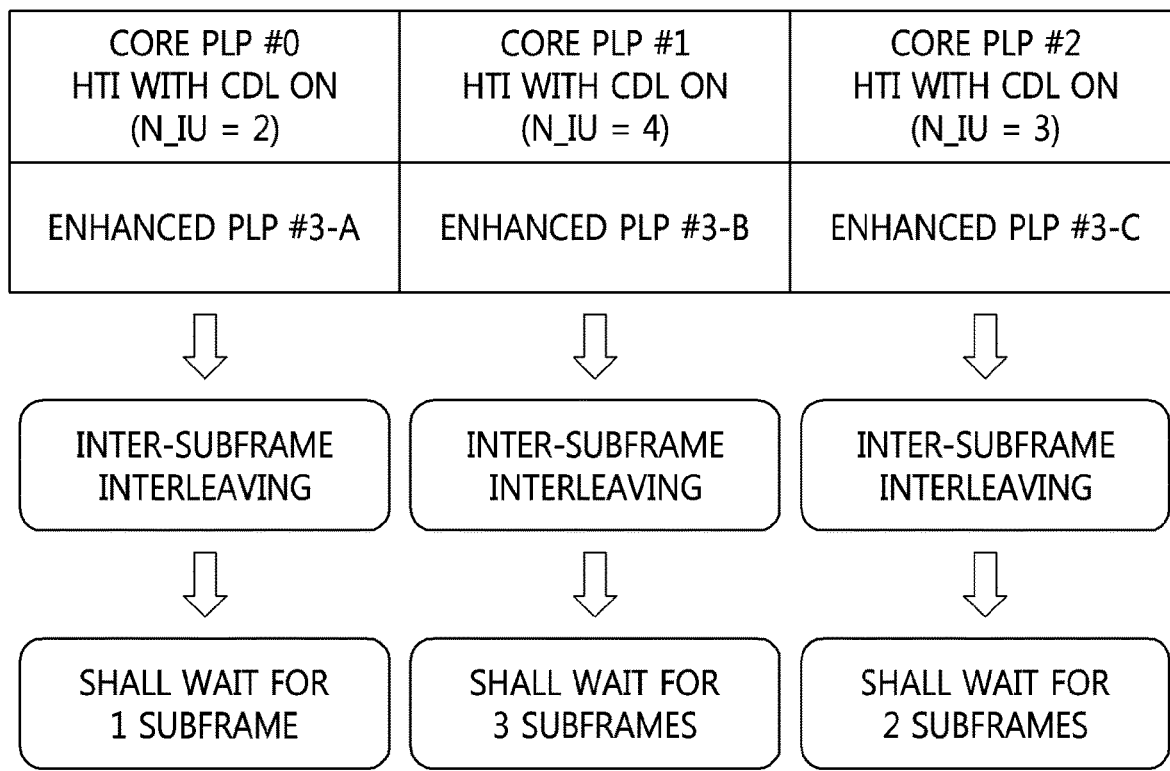
FIG. 35 is a diagram showing a case where time interleaving units which are different one another are used at the same time.

FIG. 35 is a diagram showing a case where time interleaving units which are different one another are used at the same time.

Referring to FIG. 35, three core layer physical layer pipes (CORE PLP #0, CORE PLP #1, CORE PLP #2) are layered division multiplexed with one enhanced layer physical layer pipe (ENHANCED PLP #3).

Three core layer physical layer pipes (CORE PLP #0, CORE PLP #1, CORE PLP #2) all use inter-subframe interleaving as these all correspond to hybrid time interleaving mode (HTI mode) with CDL ON. However, the time interleaving unit ($N_{IU}$) of the first core layer physical layer pipe (CORE PLP #0) is 2, the time interleaving unit ($N_{IU}$) of the second core layer physical layer pipe (CORE PLP #1) is 4, the time interleaving unit ($N_{IU}$) of the third core layer physical layer pipe (CORE PLP #2) is 3.

Therefore, the first core layer physical layer pipe (CORE PLP #0) shall wait for 1 subframe, the second core layer physical layer pipe (CORE PLP #1) shall wait 3 subframes, and the third core layer physical layer pipe (CORE PLP #2) shall wait for 2 subframes.

In an example of FIG. 35, pieces of the enhanced layer physical layer pipe have different decoding timing and this means that additional latency and buffers are needed for decoding that enhanced layer physical layer pipe.

Therefore, it may be effective in solving the decoding timing problem and in reducing decoding complexity related to the decoding timing problem to use inter-subframe interleaving and the same time interleaving unit for all core layer physical layer pipes which are layered division multiplexed with one enhanced layer physical layer pipe.

However, the decoding problem may occur according to the subframe structure even if all core layer physical layer pipes which are layered division multiplexed with one enhanced layer physical layer pipe use inter-subframe interleaving and the same time interleaving unit.

Figure 36:
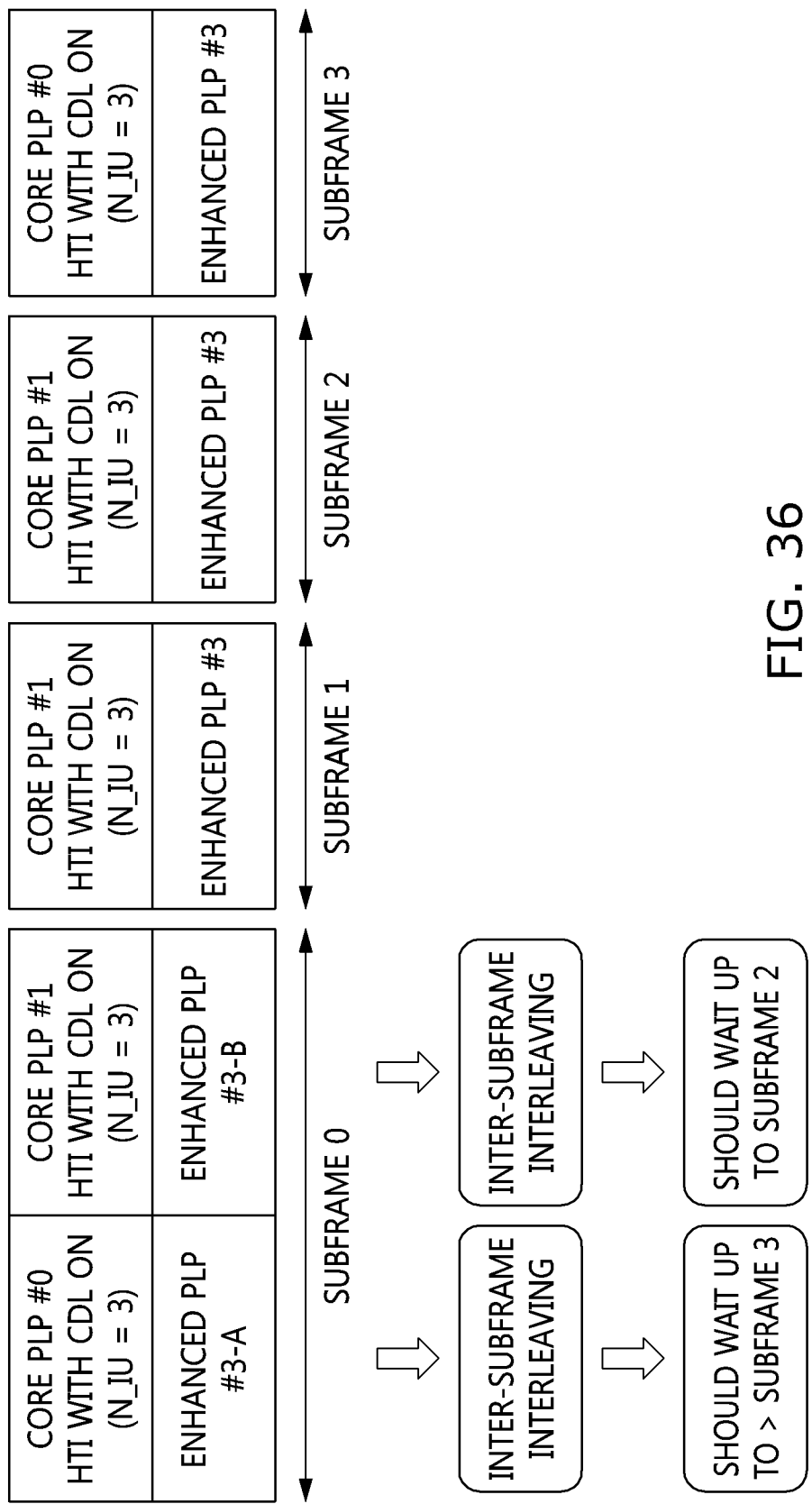
FIG. 36 is a diagram showing subframes in case that the same time interleaving unit is used at the same time.

FIG. 36 is a diagram showing subframes in case that the same time interleaving unit is used at the same time.

Referring to FIG. 36, two core layer physical layer pipes (CORE PLP #0, CORE PLP #1) are layered division multiplexed with one enhanced layer physical layer pipe (ENHANCED PLP #3) in the first subframe (SUBFRAME 0).

Moreover, one core layer physical layer pipe (CORE PLP #1) is layered division multiplexed with one enhanced layer physical layer pipe (ENHANCED PLP #3) in each of the second and the third subframes (SUBFRAME 1, 2).

Moreover, one core layer physical layer pipe (CORE PLP #0) is layered division multiplexed with one enhanced layer physical layer pipe (ENHANCED PLP #3) in the fourth subframe (SUBFRAME #3).

In this case, two core layer physical layer pipes (CORE PLP #0, CORE PLP #1) of the first subframe all correspond to inter-subframe interleaving and use the same time interleaving unit ($N_{IU}$=3).

The core layer physical layer pipe (CORE PLP #1) shall wait up to the third subframe (SUBFRAME 2) but the core layer physical layer pipe (CORE PLP #0) shall wait after the fourth subframe (SUBFRAME 3). It is because the structure of the subframes after the first subframe (SUBFRAME 0) is different from each other.

In an example of FIG. 36, pieces of the enhanced layer physical layer pipe have different decoding timing in spite of the same time interleaving unit and this means that additional latency and buffers are needed for decoding that enhanced layer physical layer pipe.

As explained with reference to FIG. 33 FIG. 36, the decoding problem occurs because pieces of one enhanced layer physical layer pipes have different decoding timing when a plurality of core layer physical layer pipes are layered division multiplexed with the enhanced layer physical layer pipe.

When an enhanced layer physical layer pipe is spread over multiple time interleaving groups, all core layer physical layer pipes associated with that enhanced layer physical layer pipe may use the same time interleaving mode. In this case, either all core layer physical layer pipes associated with that enhanced layer physical layer pipe shall use the hybrid time interleaving mode or else all core physical layer physical layer pipes associated with that enhanced layer physical layer pipe shall use the no time interleaving mode.

That is, in this case all core layer physical layer pipes use the same time interleaving mode, but the use of the convolutional time interleaving mode may be prohibited.

According to the embodiments, when all core layer physical layer pipes associated with that enhanced layer physical layer pipe use the convolutional time interleaving mode, the interleaving depths (L1D_plp_CTI_depth) of all core layer physical layer pipes may be the same.

In this case, when all core layer physical layer pipes associated with that enhanced layer physical layer pipe use the hybrid time interleaving mode, each such core layer physical layer pipe may use intra-subframe interleaving mode (i.e., L1D_plp_HTI_inter_subframe=0). That is, inter-subframe interleaving may be prohibited when all core layer physical layer pipes associated with that enhanced layer physical layer pipe use the hybrid time interleaving mode.

According to the embodiment, when core layer physical layer pipes associate with that enhanced layer physical layer pipe use the hybrid time interleaving mode corresponding to inter-subframe interleaving, all core layer physical layer pipes may use the same time interleaving unit.

In this case, when all core layer physical layer pipes associated with that enhanced layer physical layer pipe use no time interleaving mode, each such core layer physical layer pipe may consist of an integer number of FEC blocks within each subframe.

In this case, dummy modulation values may be used in order to achieve an integer number of FEC blocks per subframe.

Depending upon the exact subframe configuration and physical layer pipe multiplexing parameters, the available data cells of a subframe may be fully or partially occupied by physical layer pipe data. In the event that not all of the available data cells have physical layer pipe data mapped to them, it is important that these unoccupied data cells are modulated rather than remaining as unmodulated null cells in order to ensure a constant transmit power. This may be accomplished by assigning pseudo-random dummy modulation values to the unoccupied data cells.

Unoccupied data cells could conceivably occur anywhere within a subframe, depending upon the exact physical layer pipe multiplexing parameters. Therefore, all of the available data cells of a subframe may first be filled with dummy modulation values, and then the cell multiplexing process may overwrite the dummy modulation values of occupied data cells with actual physical layer pipe data. This approach ensures that every available data cell in a subframe is modulated either by a physical layer pipe cell or by a dummy modulate value.

$N_{cell}$ may be the total number of available data cells in a subframe so that those data cells are indexed from 0 to $N_{cell}-1$. $d_i$ may be the dummy modulation value for the data cell with index i ($0 \le i < N_{cell}$) and $b_i$ ($0 \le i < N_{cell}$) may represent the ith value of the scrambling sequence explained with FIG. 31.

In this case, the real value of the dummy modulation value for the data cell with index i ($0 \le i < N_{cell}$) may be ($1-2*b_i$) and the imaginary value of the dummy modulation value may be 0. That is, the dummy modulation values are generated by mapping a value of the scrambling sequence into one of two phases which are separated by 180 degrees.

Each of the $N_{cell}$ available data cells in the subframe may have its corresponding dummy modulation value assigned to it prior to any physical layer pipe data being multiplexed into the subframe. Following the insertion of these dummy modulation values, physical layer pipe data belonging to the current subframe may be mapped to the corresponding data cells allocated for that physical layer pipe data and may overwrite the dummy modulation values previously assigned to those data cells.

Decoding timing mismatch may be a problem not only for a plurality of core layer physical layer pipes that are layered division multiplexed with one enhanced layer physical layer pipe but also for core layer physical layer pipes that are not layered-division multiplexed.

Figure 37:
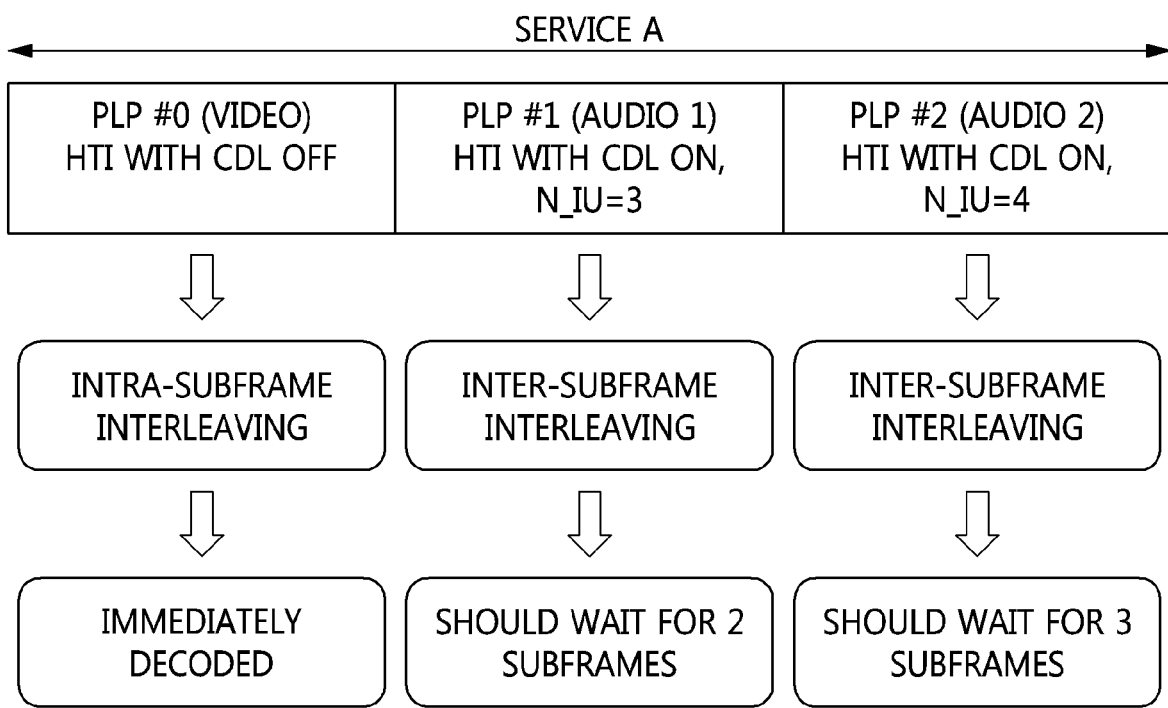
FIG. 37 is a diagram showing a case where one complete delivered product is composed of a plurality of physical layer pipes.

FIG. 37 is a diagram showing a case where one complete delivered product is composed of a plurality of physical layer pipes.

Referring to FIG. 37, one complete delivered product includes three core layer physical layer pipes (PLP #0, PLP #1, PLP #2). In this case, one complete delivered product may correspond to one service (SERVICE A). In this case, the core layer physical layer pipes (PLP #0, PLP #1, PLP #2) may not layered division multiplexed.

In this case, the first core layer physical layer pipe (PLP #0) may correspond to video data of the service (SERVICE A), the second core layer physical layer pipe (PLP #1) may correspond to the first audio data of the service (SERVICE A) and the third core layer physical layer pipe (PLP #2) may correspond to the second audio data of the service (SERVICE A).

The first core layer physical layer pipe (PLP #0) may correspond to a hybrid time interleaving mode with CDL OFF, the second core layer physical layer pipe (PLP #1) may correspond to a hybrid time interleaving mode with CDL ON and the third core layer physical layer pipe (PLP #2) may correspond to a hybrid time interleaving mode with CDL ON because the characteristics of corresponding data are different for each of the core layer physical layer pipes consisting of one complete delivered product. In this case, the time interleaving unit ($N_{IU}$) of the core layer physical layer pipe (PLP #1) may be 3 and the time interleaving unit ($N_{IU}$) of the core layer physical layer pipe (PLP #2) may be 4 as shown in FIG. 37.

The core layer physical layer pipe corresponding to intra-subframe interleaving may be decoded immediately but the core layer physical layer pipe corresponding to inter-subframe interleaving shall wait for other subframes in case that some of core layer physical layer pipes comprising one complete delivered product correspond to intra-subframe interleaving and other some of core layer physical layer pipes comprising the complete delivered product correspond to inter-subframe interleaving.

Moreover, even if both of the core layer physical layer pipes use inter-subframe interleaving, the decoding timing is mismatched when the time interleaving units ($N_{IUS}$) of the corer layer physical layer pipes are different from each other.

In an example of FIG. 37, the first physical layer pipe (PLP #0) may be decoded immediately because it corresponds to intra-subframe interleaving. The second physical layer pipe (PLP #1) shall wait for two subframes because it corresponds to inter-subframe interleaving with the time interleaving unit ($N_{IU}$) of 3. The third physical layer pipe (PLP #2) shall wait for three subframes because it corresponds to inter-subframe interleaving with the time interleaving unit ($N_{IU}$) of 4.

In an example of FIG. 37, three core layer physical layer pipes have different decoding timing. In this case, the first core layer physical layer pipe (PLP #0) and the second core layer physical layer pipe (PLP #1) shall be synchronized with the third core layer physical layer pipe (PLP #2) for the service (SERVICE A). Therefore, the first and the second core layer physical layer pipes (PLP #0, PLP #1) shall wait three subframes and this causes unnecessary decoding complexity.

For reducing decoding complexity, when a particular complete delivered product contains multiple core layer physical layer pipes that are not layered-division multiplexed and all of those core layer physical layer pipes use the hybrid time interleaving mode, either all of those core layer physical layer pipes may use intra-subframe interleaving or else all of those core layer physical layer pipes may use inter-subframe interleaving. That is, all of those core layer physical layer pipes may be configured with the same value of L1D_plp_HTI_inter_subframe (L1D_plp_HTI_inter_subframe=0 represents intra-subframe interleaving and L1D_plp_HTI_inter_subframe=1 represents inter-subframe interleaving).

When inter-subframe interleaving is used for those core layer physical layer pipes (L1D_plp_HTI_inter_subframe=1), then all of those core layer physical layer pipes may use the same time interleaving unit ($N_{IU}$).

When a particular complete delivered product contains multiple core layer physical layer pipes that are not layered-division multiplexed and at least one of those core layer physical layer pipes uses the no time interleaving mode, any of those core layer physical layer pipes configured with the hybrid time interleaving mode shall use the intra-subframe interleaving mode (L1D_plp_HTI_inter_subframe=0). That is, the use of inter-subframe interleaving mode may be prohibited for any of those core layer physical layer pipes corresponding to the hybrid time interleaving mode when a particular complete delivered product contains multiple core layer physical layer pipes that are not layered-division multiplexed and at least one of those core layer physical layer pipes uses the no time interleaving mode.

Figure 38:
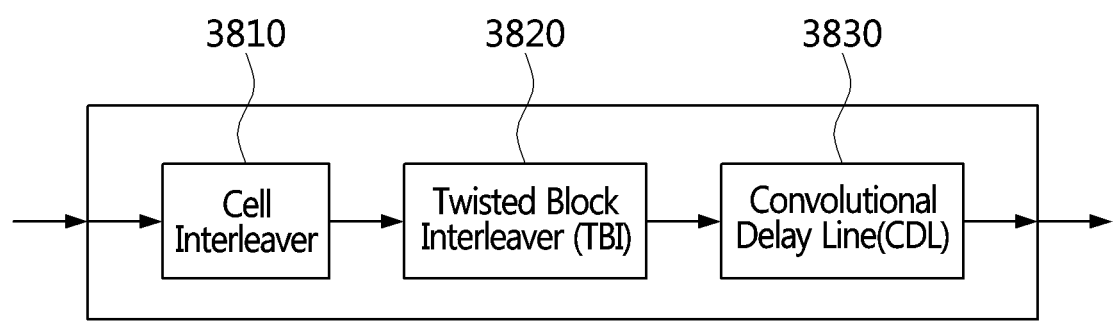
FIG. 38 is a block diagram showing an example of the time interleaver in FIG. 3 or FIG. 7.

FIG. 38 is a block diagram showing an example of the time interleaver in FIG. 3 or FIG. 7.

Referring to FIG. 38, the time interleaver according to an embodiment of the present invention includes a cell interleaver 3810, a twisted block interleaver 3820 and a convolutional delay line 3830.

The cell interleaver 3810 interleaves cells in the time interleaving block.

In this case, the cell interleaver 3810 may arrange input cells in FEC blocks into time interleaving blocks. In this case, the time interleaving block may be composed of one or more FEC blocks.

In this case, the time interleaving block may be a basic unit for operations of the cell interleaver 3810, the twisted block interleaver 3820 and the convolutional delay line 3830.

In this case, the time interleaving blocks may include different number of FEC blocks.

In this case, the cell interleaver 3810 may interleave cells within each FEC block.

In this case, the cell interleaver 3810 may perform cell interleaving by writing a FEC block into memory and reading the FEC block pseudo-randomly.

According to the embodiment, the cell interleaver 3810 may be omitted.

The twisted block interleaver 3820 performs intra-subframe interleaving corresponding to the time interleaving blocks.

The convolutional delay line 3830 performs inter-subframe interleaving using an output of the twisted block interleaver 3820. That is, the convolutional delay line 3830 spreads a block-interleaved time interleaving block over multiple subframes.

In this case, the twisted block interleaver 3820 may perform the intra-subframe interleaving by performing a column-wise writing operation and a diagonal-wise reading operation.

In this case, the convolutional delay line 3830 may read only data cells except for virtual cells from the twisted block interleaver 3820.

In this case, the convolutional delay line 3830 may generate (store) new virtual cells prior to switches moving to a next branch, after each row of the data cells is written from the twisted block interleaver 3820.

In this case, the new virtual cells may correspond to the number obtained by subtracting the number of FEC blocks ($N_{FEC\_TI}$) in a time interleaving block of an interleaving frame from the maximum number of the FEC blocks ($N_{FEC\_TI\_MAX}$) corresponding to the time interleaving block of the interleaving frame for each branch.

In this case, the new virtual cells may not be outputted from the apparatus for time interleaving (the time interleaver).

In this case, the convolutional delay line 3830 may include branches corresponding to a time interleaving unit ($N_{IU}$), and each of remaining branches except for the first branch of the branches may include at least one FIFO register.

In this case, the convolutional delay line 3830 may output only a part of initial values stored in the FIFO register.

In this case, the part of the initial values may correspond to one initialization cell for each of the remaining branches.

Figure 39:
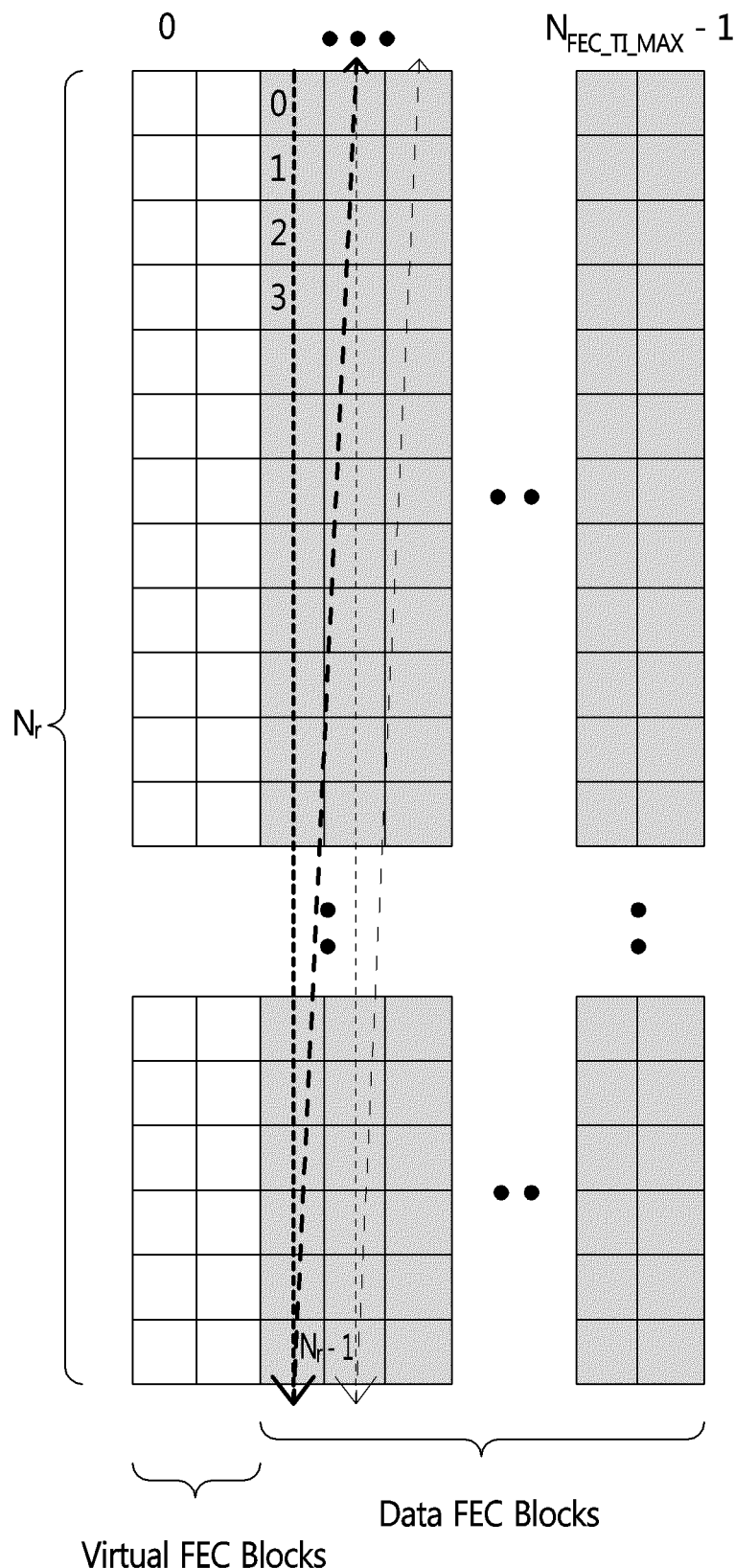
FIG. 39 is a diagram showing a writing operation of the twisted block interleaver in FIG. 38.

FIG. 39 is a diagram showing a writing operation of the twisted block interleaver in FIG. 38.

Referring to FIG. 39, the cells of the FEC blocks included in the time interleaving block are serially written column-wise into the memory.

Figure 40:
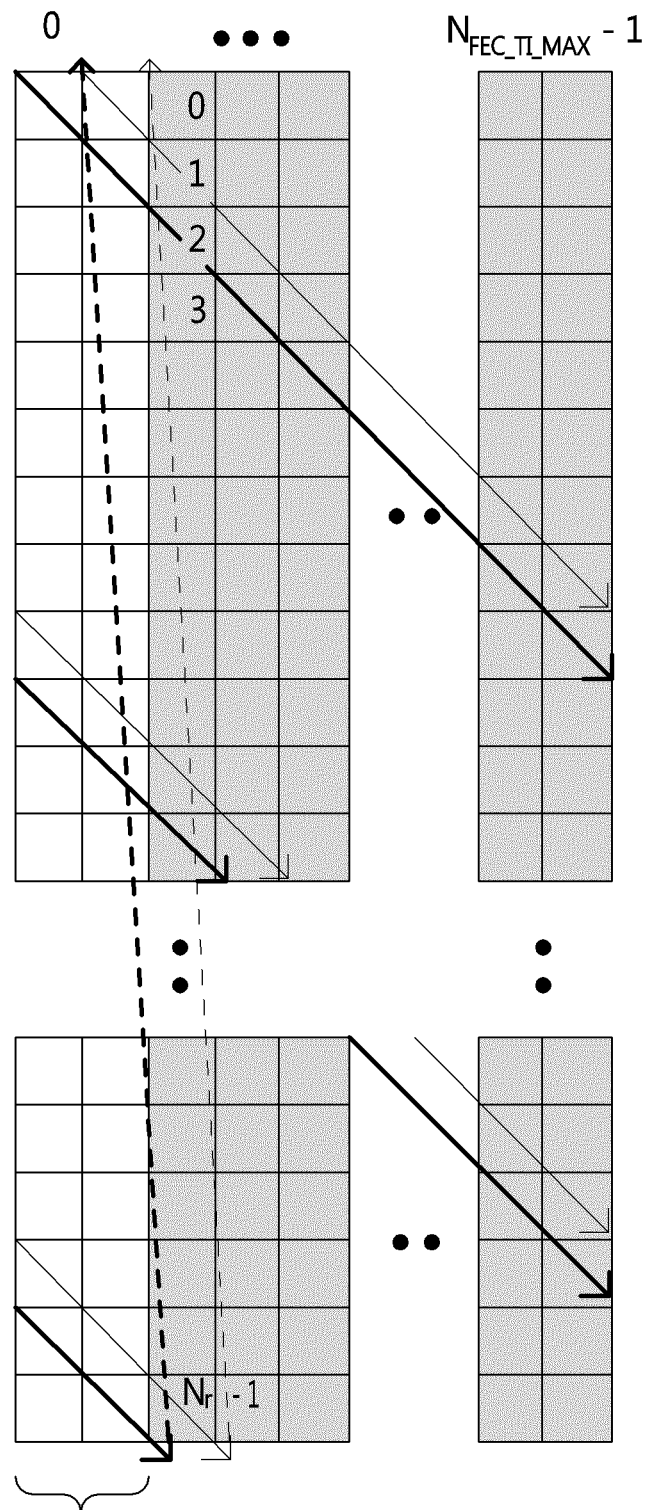
FIG. 40 is a diagram showing a reading operation of the twisted block interleaver in FIG. 38.

FIG. 40 is a diagram showing a reading operation of the twisted block interleaver in FIG. 38.

Referring to FIG. 40, the cells of the FEC blocks included in the time interleaving block are read out diagonal-wise from the memory.

In the embodiment of FIG. 39 and FIG. 40, $N_{FEC\_TI\_MAX}$ represents the maximum number of FEC blocks in the time interleaving block of the interleaving frame, and $N_r$ represents the number of cells included in each FEC block.

As shown in FIG. 39 and FIG. 40, the twisted block interleaver may perform the intra-subframe interleaving by performing the column-wise writing operation and the diagonal-wise reading operation.

In this case, the twisted block interleaver may skip the virtual FEC cells during the reading process as shown in FIG. 40.

Figure 41:
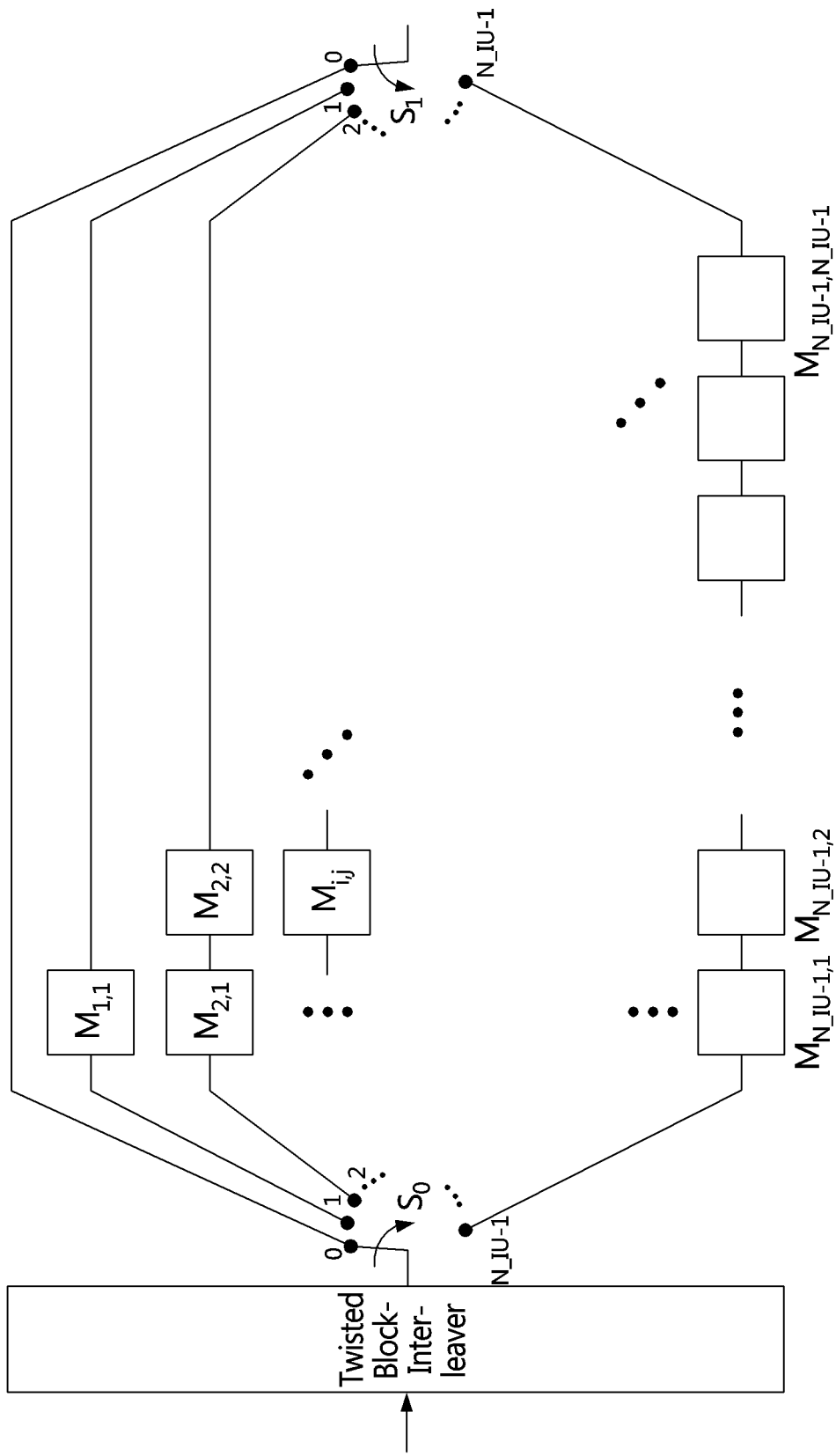
FIG. 41 is a block diagram showing an example of the convolutional delay line in FIG. 38.

FIG. 41 is a block diagram showing an example of the convolutional delay line in FIG. 38.

Referring to FIG. 41, the convolutional delay line according to the embodiment of the present invention consists of $N_{IU}$ branches. That is, the convolutional delay line split a time interleaving block into $N_{IU}$ interleaving units and spread these interleaving units over $N_{IU}$ subframes.

Switch $S_0$ may connect the twisted block interleaver to the convolutional delay line. Switch $S_1$ may connect the convolutional delay line to the framing block such as the frame builder in FIG. 3 or FIG. 7.

In this case, the movement of the switches $S_0$ and $S_1$ may be synchronized. That is, the switches may always point to identical branches of the convolutional delay line.

From the last branch of the convolutional delay line the switches may then move back to the first branch of the convolutional delay line.

Both switches ($S_0$ and $S_1$) may move from branch n (n is an integer of $0<=n<N_{IU}-1$) of the convolutional delay line to the immediately subjacent branch n+1 of the convolutional delay line when $N_{FEC\_TI\_MAX}$ cells, consisting of $N_{FEC\_TI}$ data cells and ($N_{FEC\_TI\_MAX}-N_{FEC\_TI}$) virtual cells, are written to the convolutional delay line. In this case, $N_{FEC\_TI\_MAX}$ may represent the maximum number of the FEC blocks in the time interleaving block of the interleaving frame, $N_{FEC\_TI}$ may represent the number of FEC blocks corresponding to data in the time interleaving block of the interleaving frame, and $N_{IU}$ may represent the time interleaving unit. In this case, $(N_{FEC\_TI\_MAX}-N_{FEC\_TI})$ virtual cells may not be read from the twisted block interleaver but may be new virtual cells for the convolutional delay line. That is, the new virtual cells may be independent of the twisted block interleaver and may be newly generated in the convolutional delay line.

In this case, two switches ($S_0$ and $S_1$) may be reset to the first branch of the convolutional delay line (branch 0) at the start of every subframe.

In this case, virtual cells may not be read from the twisted block interleaver and may not be passed on to the convolutional delay line.

However, after each row of $N_{FEC\_TI}$ data cells is written from the twisted block interleaver to the convolutional delay line, a set of $(N_{FEC\_TI\_MAX}-N_{FEC\_TI})$ new virtual cells for the convolutional delay line may then be input to the convolutional delay line prior to switches $S_0$ and $S_1$ moving to the next branch of the convolution delay line.

In this case, virtual cells may not be written to the time interleaver output, neither from the twisted block interleaver nor from the convolutional delay line.

Figure 42:
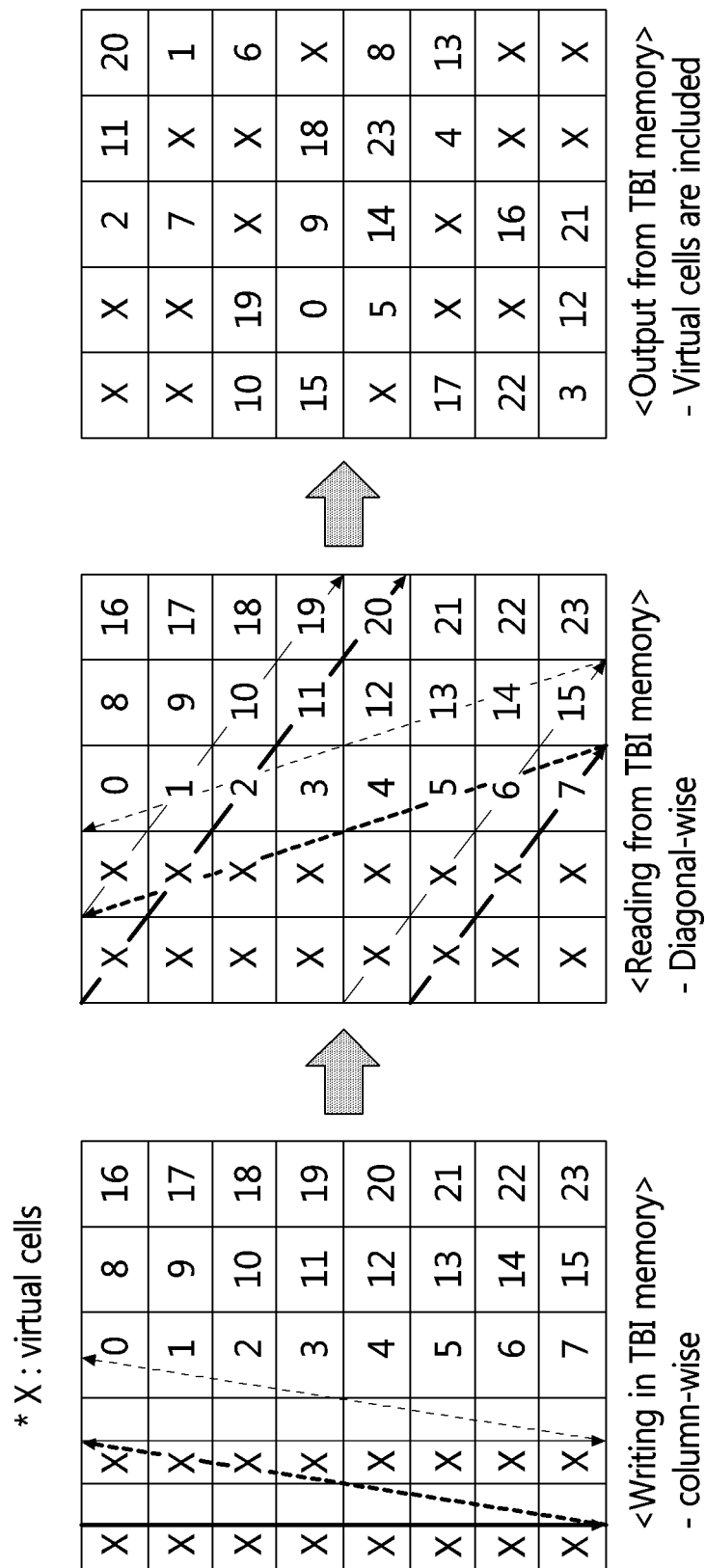
FIG. 42 is a diagram showing an example of operation of the twisted block interleaver in FIG. 38.

FIG. 42 is a diagram showing an example of operation of the twisted block interleaver in FIG. 38.

Referring to FIG. 42, the example where the number ($N_r$) of cells included in each FEC block is 8, $N_{FEC\_TI\_MAX}$ is 5, $N_{FEC\_TI}$ is 3, and $N_{IU}$ is 2 is showed.

In the example of FIG. 42, the virtual cells corresponding to two columns are stored in the twisted block interleaver, and the twisted block interleaving is performed through the column-wise writing operation and the diagonal-wise reading operation.

In the example of FIG. 42, virtual cells are included in the output memory of the twisted block interleaver.

Figure 43:
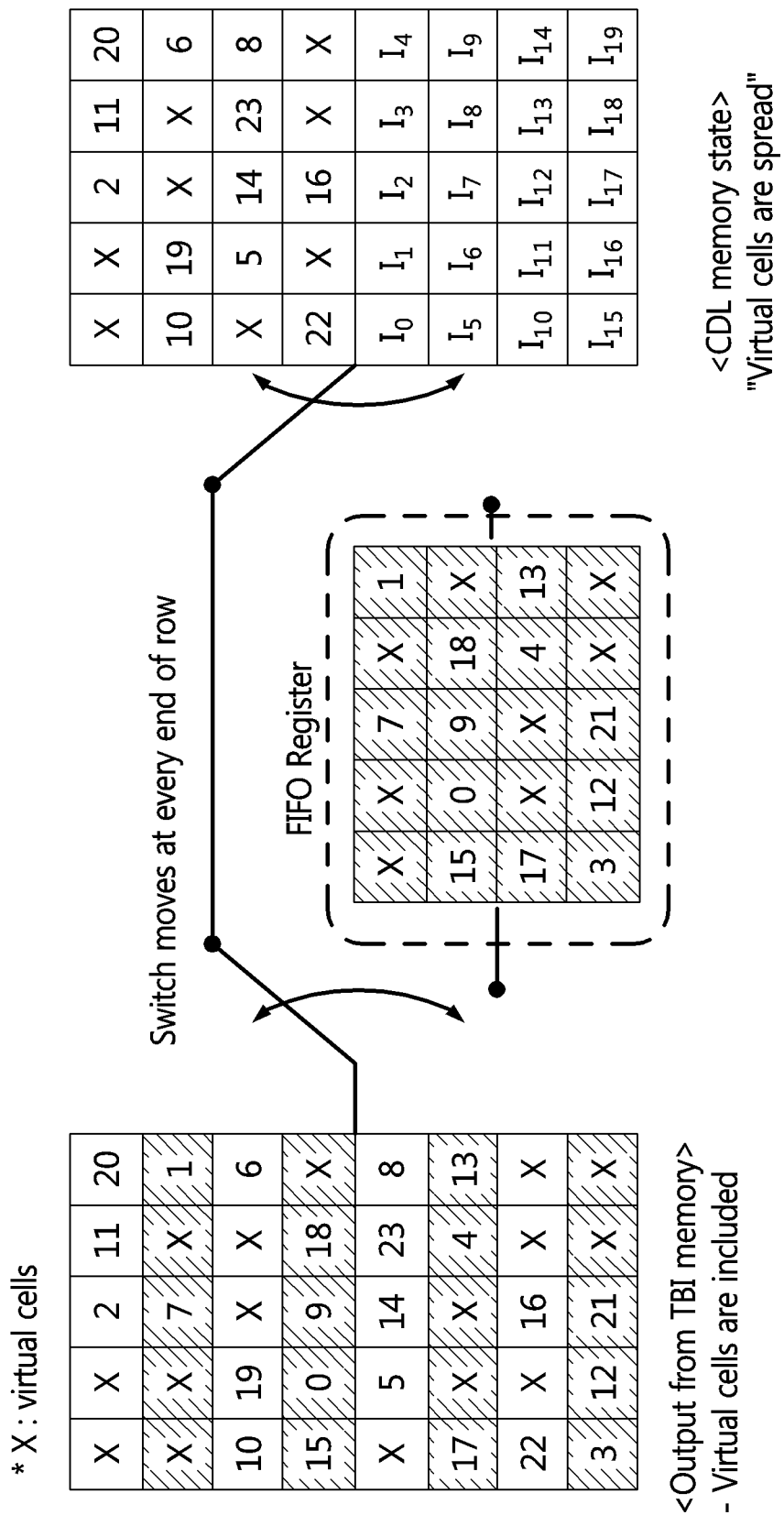
FIG. 43 is a diagram showing an example of operation of the convolutional delay line in FIG. 38.

FIG. 43 is a diagram showing an example of operation of the convolutional delay line in FIG. 38.

Referring to FIG. 43, there are two branches in the convolution delay line as $N_{IU}$ is 2, and the second branch includes a FIFO register.

In the example of FIG. 43, the virtual cells read from the twisted block interleaver are transferred to the convolutional delay line.

In particular, FIG. 43 represents the first subframe timing in case of $N_{IU}$=2. In this timing, all the data corresponding to the second branch are the values stored in the FIFO register.

As explained above, the virtual cells may be not included in a transmission signal.

Therefore, the first subframe (subframe #1) may carry "2, 11, 20, 10, 19, 6, 5, 14, 23, 8, 22, 16" and the second subframe (subframe #2) may carry "7, 1, 15, 0, 9, 18, 17, 4, 13, 3, 12, 21" when the memory is written and read from the left side to the right side.

In the example of FIG. 43, $I_0, I_1, \ldots, I_{19}$ which were stored in the FIFO register at previous timing and are outputted from the FIFO register are to be stored in the lower part (the fifth row~the eighth row) of the memory corresponding to the convolutional delay line, but they may be stored in the second row, the fourth row, the sixth row and the eighth row of the memory corresponding to the convolutional delay line according to the embodiment.

Figure 44:
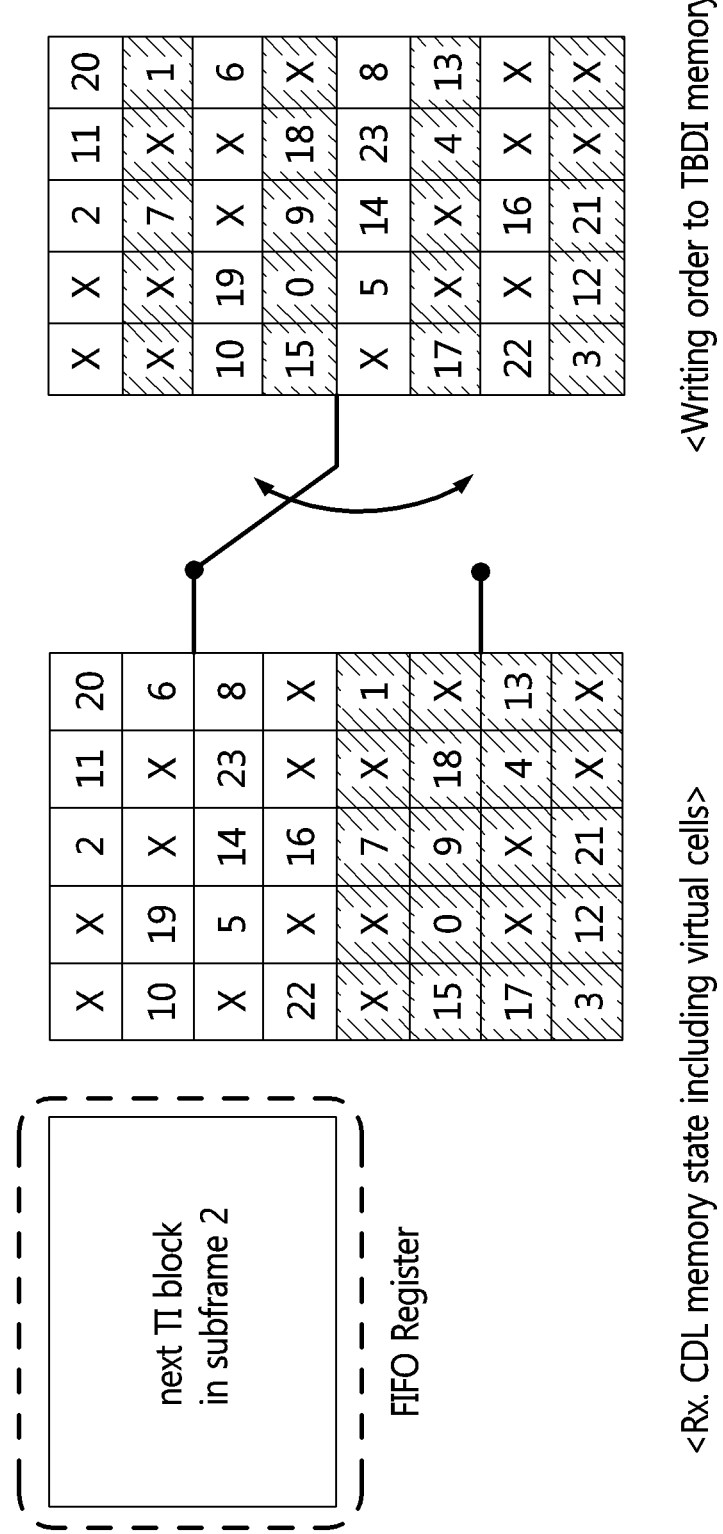
FIG. 44 is a diagram showing an example of the decoding process corresponding to the operation in FIG. 43.

FIG. 44 is a diagram showing an example of the decoding process corresponding to the operation in FIG. 43.

Referring to FIG. 44, the time deinterleaver corresponding to the decoding process may restore memory data (CDL memory state including virtual cells) in FIG. 44 from two subframes through the FIFO register. Moreover, the time deinterleaver may restore data (writing order to TBDI memory) to be inputted to the twisted block deinterleaver from the memory data.

As shown in FIG. 44, virtual cells are spread in the receiver when virtual cells are transferred from the twisted block interleaver to the convolutional delay line. In this case, the receiver shall know the writing process of virtual cells.

That is, the inverse convolutional delay line of the receiver requires the position information of virtual cells and this causes additional memory and an increase of complexity in decoding.

Figure 45:
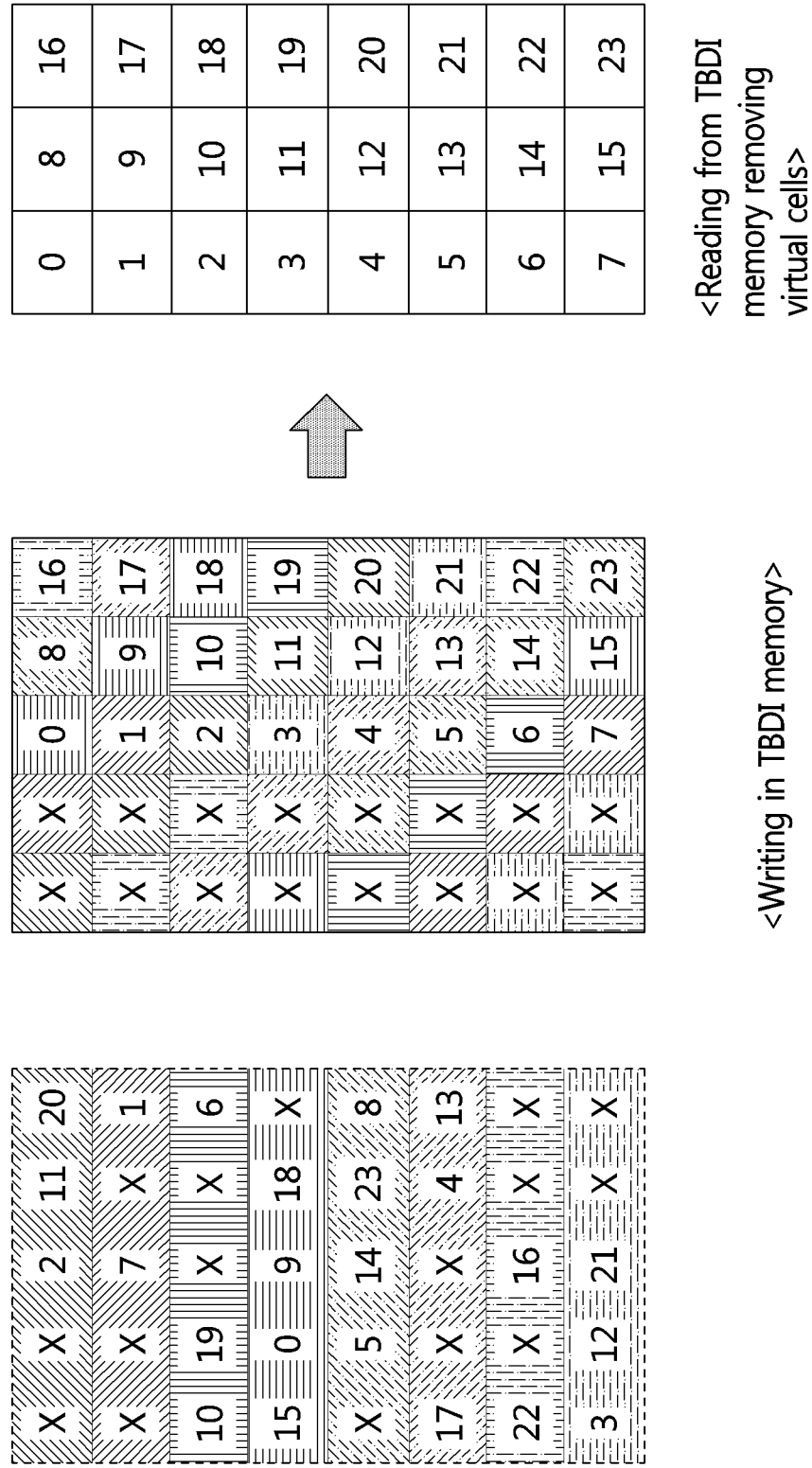
FIG. 45 is a diagram showing an example of the decoding process corresponding to the operation in FIG. 42.

FIG. 45 is a diagram showing an example of the decoding process corresponding to the operation in FIG. 42.

Referring to FIG. 45, the positions of the virtual cells should be known for performing the twisted block deinterleaving properly. That is, the positions of virtual cells or at least the number of virtual cells at each row should be known for correct twisted block deinterleaving operation in the time deinterleaver of the receiver.

Therefore, the embodiment explained through FIG. 42 FIG. 45 has a problem of increasing decoding complexity because the time deinterleaver should know the positions of virtual cells.

Figure 46:
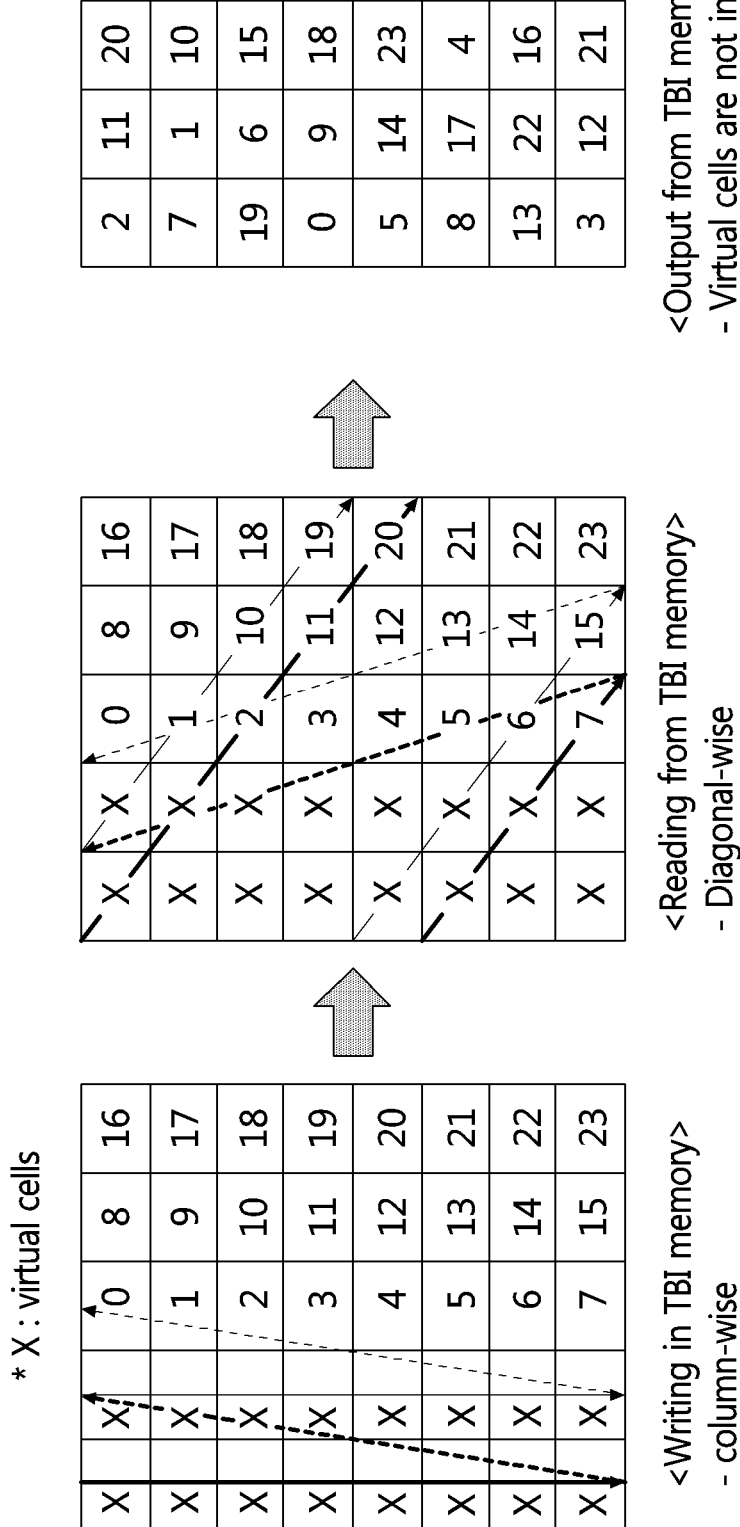
FIG. 46 is a diagram showing another example of operation of the twisted block interleaver in FIG. 38.

FIG. 46 is a diagram showing another example of operation of the twisted block interleaver in FIG. 38.

Referring to FIG. 46, unlike the example shown in FIG. 42, in the example shown in FIG. 46, it can be seen that virtual cells belonging to virtual FEC blocks are skipped during the reading process from the twisted block interleaver.

That is, the twisted block interleaver does not output virtual cells but outputs only data cells corresponding to data in an example of FIG. 46.

Figure 47:
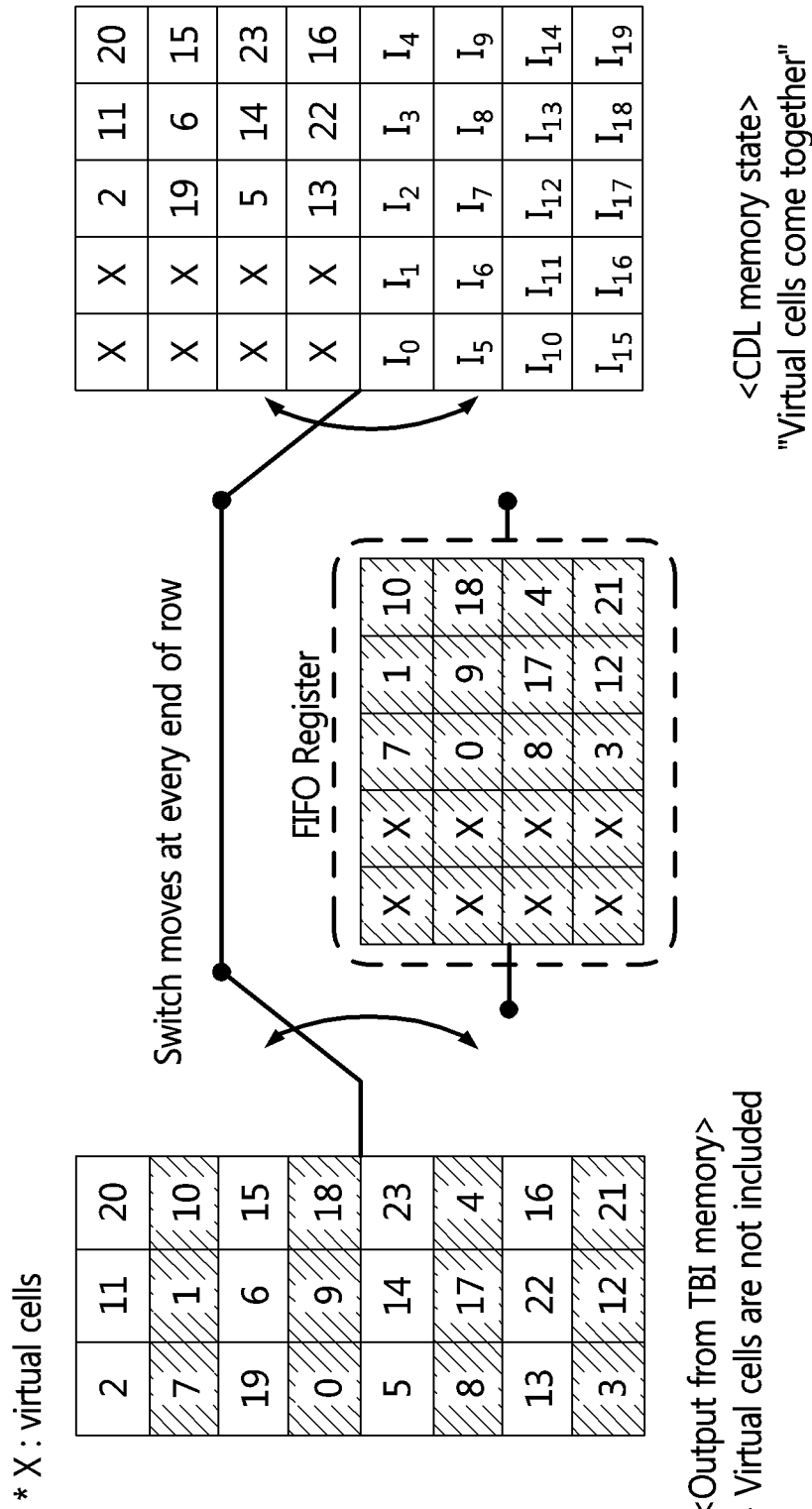
FIG. 47 is a diagram showing another example of operation of the convolutional delay line in FIG. 38.

FIG. 47 is a diagram showing another example of operation of the convolutional delay line in FIG. 38.

Referring to FIG. 47, it can be seen that virtual cells are not written from the twisted block interleaver to the convolutional delay line in the example of FIG. 47.

That is, the convolutional delay line may read only data cells except for virtual cells from the twisted block interleaver and store them, and then may generate (and store) new virtual cells so that the virtual cells may not be spread.

In this case, it can be seen that the data shown in FIG. 47 read and write from left to right when the memory operates in FIFO (First-In-First-Out) scheme. However, the virtual cells denoted with "X" in the example of FIG. 47, may be written to the memory most recently for each row. That is, the writing order to the memory corresponding to the convolutional delay line in the example of FIG. 47 may be 2, 11, 20, X, X, 19, 6, 15, X, X, 5, 14, 23, X, X, . . . .

In this case, virtual cells may be stored corresponding to the leftmost ($N_{FEC\_TI\_MAX}-N_{FEC\_TI}$) columns of the convolutional delay line when the data cells are written from the twisted block interleaver to the convolution delay line.

Similarly to FIG. 43, FIG. 47 shows the first subframe timing in case of $N_{IU}$=2, and it can be seen that all the data corresponding to the second branch are values stored in the FIFO register at this timing.

In this case, virtual cells may not be included in the transmission signal.

Therefore, the first subframe (subframe #1) may carry "2, 11, 20, 19, 6, 15, 5, 14, 23, 13, 22, 16", and the second subframe (subframe #2) may carry "7, 1, 10, 0, 9, 18, 8, 17, 4, 3, 12, 21" when the memory shown in FIG. 47 is written and read from left to right (excluding virtual cells).

In the example of FIG. 47, $I_0, I_1, \ldots, I_{19}$ which were stored in the FIFO register at previous timing and are outputted from the FIFO register are to be stored in the lower part (the fifth row~the eighth row) of the memory corresponding to the convolutional delay line, but they may be stored in the second row, the fourth row, the sixth row and the eighth row of the memory corresponding to the convolutional delay line according to the embodiment.

In the examples of FIG. 43 and FIG. 47, the memory corresponding to the convolutional delay line is shown for convenience of explanation, and the convolutional delay line may not include a separate output memory according to the embodiment.

Figure 48:
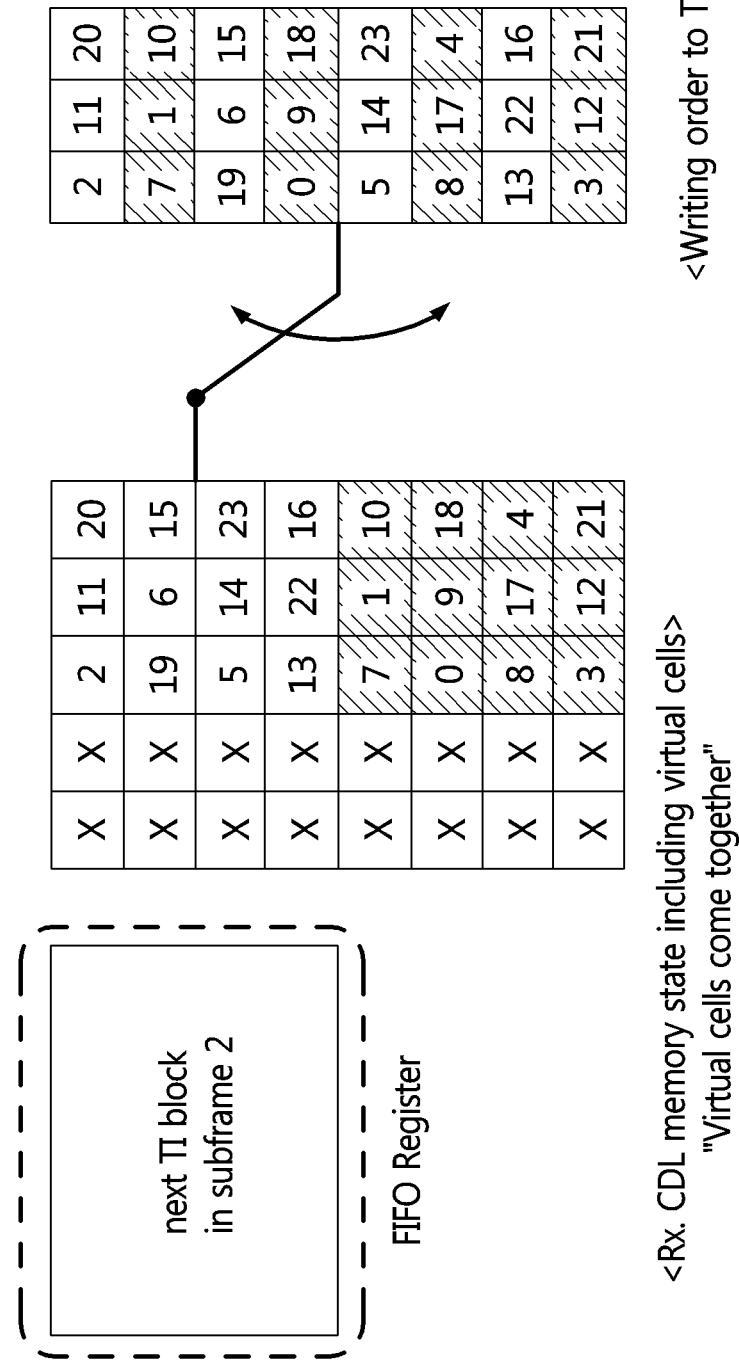
FIG. 48 is a diagram showing an example of the decoding process corresponding to the operation in FIG. 47.

FIG. 48 is a diagram showing an example of the decoding process corresponding to the operation in FIG. 47.

Referring to FIG. 48, the time deinterleaver corresponding to the decoding process may restore memory data (CDL memory state including virtual cells) in FIG. 48 from two subframes through the FIFO register. Moreover, the time deinterleaver may restore data (writing order to TBDI memory) to be inputted to the twisted block deinterleaver from the memory data. Unlike the case of FIG. 44, in the example shown in FIG. 48, the positions of virtual cells are known in the decoding process of the inverse convolutional delay line, and the virtual cells are not spread (come together).

Therefore, the decoding complexity is lowered in the case of FIG. 48 than in the case of FIG. 44.

Figure 49:
FIG. 49 is a diagram showing an example of the decoding process corresponding to the operation in FIG. 46.

FIG. 49 is a diagram showing an example of the decoding process corresponding to the operation in FIG. 46.

Referring to FIG. 49, since the inverse processes of the column-wise writing operation and the diagonal-wise reading operation in the twisted block deinterleaving are performed except for the virtual cells, it can be seen that the deinterleaving can be simpler than the case of FIG. 45.

Figure 50:
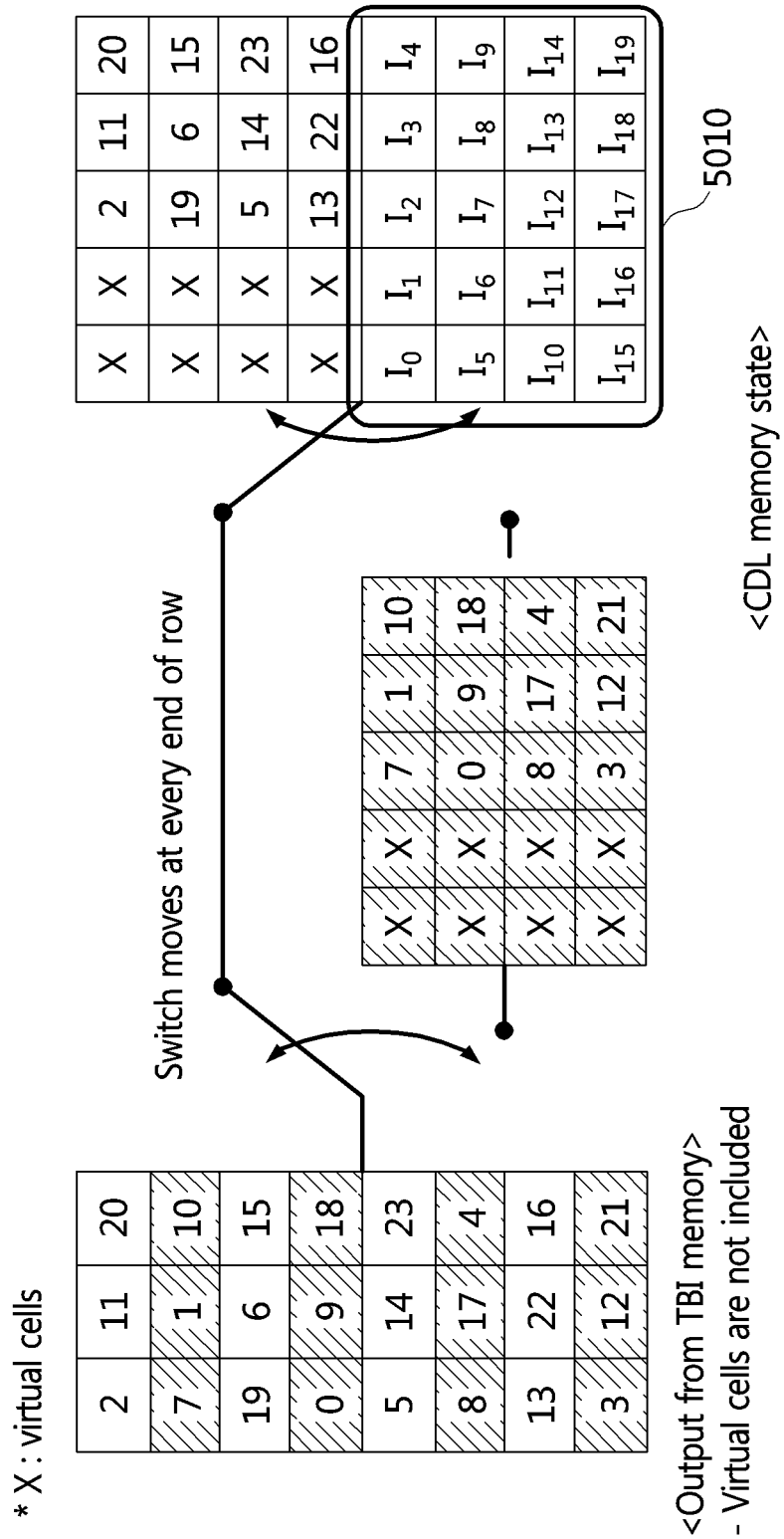
FIG. 50 is a diagram showing initial values of the FIFO register included in the convolutional delay line.

FIG. 50 is a diagram showing initial values of the FIFO register included in the convolutional delay line.

Referring to FIG. 50, it can be seen that all the data corresponding to the second branch at the first subframe timing in case of $N_{IU}=2$ are values 5010 which are stored in the FIFO register.

In this case, the convolutional delay line may output only a part of initial values stored in the FIFO register.

In this case, the part of the initial values may correspond to one initialization cell for each of remaining branches except for the first branch of branches corresponding to the time interleaving unit $N_{IU}$.

That is, one cell may be output and remaining cells may not be output for each row among the values 5010 stored in the FIFO register.

According to an embodiment, memories corresponding to the twisted block interleaver (TBI) and the convolutional delay line (CDL) may operate according to FIFO scheme, and the reading and writing for these memories may be performed from right to left. In this case, unlike the case of FIG. 50, the first row of the twisted block interleaver memory may store 2, 11 and 20 from right to left, the second row may store 7, 1, 10 from right to left, the third row may store 19, 6, 15 from right to left, the fourth row may store 0, 9, 18 from right to left, the fifth row may store 5, 14, 23 from right to left, the sixth row may store 8, 17, 4 from right to left, the seventh row may store 13, 22, 16 from right to left, and the eighth row may store 3, 12, 21 from right to left.

In this case, the writing and the reading of the FIFO register shown in FIG. 50 may be performed from right to left. In this case, the first row of the FIFO register may be initialized to $I_0$, X, X, X, X from right to left, the second row may be initialized to $I_1$, X, X, X, X from right to left, the third row may be initialized to 12, X, X, X, X from right to left, and the fourth row may be initialized to $I_3$, X, X, X, X from right to left.

In the example of FIG. 50, the memory corresponding to the convolutional delay line may be conceptual to illustrate the output of the convolutional delay line, and the convolutional delay line may not include a separate output memory according to an embodiment.

At the timing corresponding to the first subframe, the memory (CDL memory) corresponding to the convolutional delay line may store the data (20, 11, 2) stored in the first row of the memory corresponding to the twisted block interleaver, the data (15, 6, 19) stored in the third row of the memory, the data (23, 14, 5) stored in the fifth row of the memory, the data (16, 22, 13) stored in the seventh row of the memory, and the values initialized to the FIFO register. In this case, the data initialized to the FIFO register may be stored to the memory corresponding to the convolutional delay line. That is, at the timing corresponding to the first subframe, the first row of the memory corresponding to the convolutional delay line may store 2, 11, 20, X, X (two new virtual cells) from right to left. The third row of the memory corresponding to the convolutional delay line may store 19, 6, 15, X, X (two new virtual cells) from right to left. The fifth row of the memory corresponding to the convolutional delay line may store 5, 14, 23, X, X (two new virtual cells) from right to left. The seventh row of the memory corresponding to the convolutional delay line may store 13, 22, 16, X, X from right to left.

In this case, the second row of the memory corresponding to the convolutional delay line may store one initialization cell ($I_0$) at the rightmost side, and then may store four virtual cells. In this case, the fourth row of the memory corresponding to the convolutional delay line may store one initialization cell ($I_1$) at the rightmost side, and then may store four virtual cells. In this case, the sixth row of the memory corresponding to the convolutional delay line may store one initialization cell ($I_2$) at the rightmost side, and then may store four virtual cells. In this case, the eighth row of the memory corresponding to the convolutional delay line may store one initialization cell ($I_3$) at the rightmost side, and then may store four virtual cells.

That is, at the timing corresponding to the first subframe, the first row of the memory corresponding to the convolutional delay line may store 2, 11, 20, X, X from right to left, the second row may store $I_0$, X, X, X, X from right to left, the third row may store 19, 6, 15, X, X from right to left, the fourth row may store $I_1$, X, X, X, X from right to left, the fifth row may store 5, 14, 23, X, X from right to left, the sixth row may store $I_2$, X, X, X, X from right to left, the seventh row may store $I_3$, 22, 16, X, X from right to left, and the eighth row may store 13, X, X, X, X from right to left. In this case, X may represent a virtual cell. In this case, the first row of the FIFO register shown in FIG. 50 may store 7, 1, 10, X, X from right to left, the second row may store 0, 9, 18, X, X from right to left, the third row may store 8, 17, 4, X, X from right to left and the fourth row may store 3, 12, 21, X, X from right to left.

In this case, the virtual cells stored in the memory corresponding to the convolutional delay line may not be output from the time interleaver. That is, the first subframe may carry "2, 11, 20, $I_0$, 19, 6, 15, $I_1$, 5, 14, 23, 12, 13, 22, 16, $I_3$," and the second subframe may carry " . . . , 7, 1, 10, . . . , 0, 9, 18, . . . , 8, 17, 4, . . . , 3, 12, 21". In this case, "$I_0, I_1, I_2, I_3$" may correspond to the part of the initial values.

In this case, " . . . " may correspond to the next time interleaving block output from the twisted block interleaver.

Figure 51:
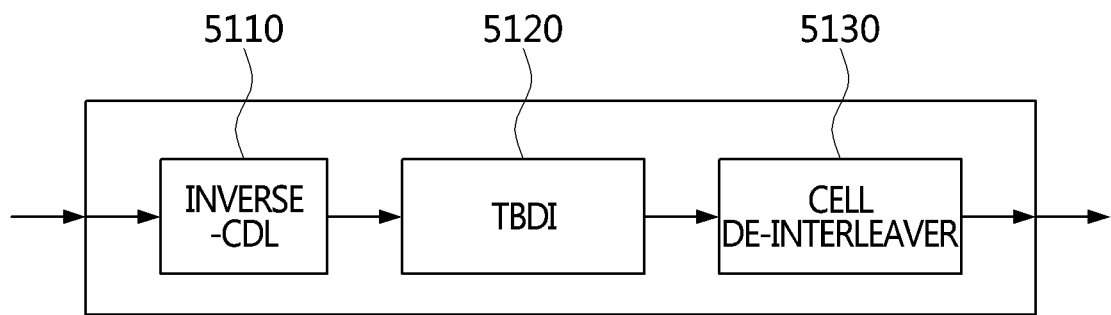
FIG. 51 is a block diagram showing an example of the time deinterleaver in FIG. 8 or FIG. 12.

FIG. 51 is a block diagram showing an example of the time deinterleaver in FIG. 8 or FIG. 12.

Referring to FIG. 51, the time deinterleaver includes inverse convolutional delay line 5110, the twisted block deinterleaver 5120 and the cell deinterleaver 5130.

The inverse convolutional delay line 5110 performs the inverse process of the convolutional delay line shown in FIG. 38.

In this case, the inverse convolutional delay line 5110 may predict the positions of the virtual cells newly generated in the convolutional delay line at a transmitter side, and may perform the inverse process based on the predicted virtual cell positions.

The twisted block deinterleaver 5120 may perform the inverse process of the twisted block interleaver shown in FIG. 38.

In this case, the twisted block deinterleaver 5120 may generate new virtual cells and store them after restoring data cells.

In this case, the twisted block deinterleaver 5120 may predict the positions of the virtual cells newly generated in the convolutional delay line at the transmitter side, and may perform the inverse process based on the predicted virtual cell positions.

In this case, the twisted block deinterleaver 5120 may perform the inverse process of the column-wise writing operation and the diagonal-wise reading operation of the twisted block deinterleaving except for virtual cells.

The cell deinterleaver 5130 performs the inverse process of the cell interleaver shown in FIG. 38.

Figure 52:
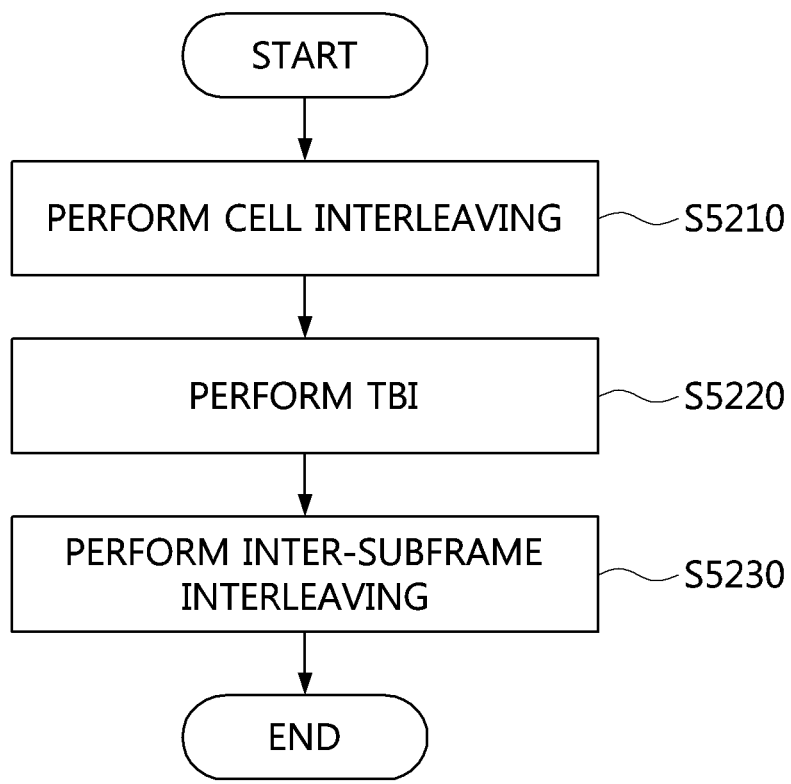
FIG. 52 is an operation flowchart showing a method of time interleaving according to an embodiment of the present invention.

FIG. 52 is an operation flowchart showing a method of time interleaving according to an embodiment of the present invention.

Referring to FIG. 52, the method according to the embodiment of the present invention, the cell interleaving corresponding to cells in the time interleaving block is performed at step S5210.

According to the embodiment, the step S5210 may be omitted.

Furthermore, in the method according to the embodiment of the present invention, the twisted block interleaving corresponding to intra-subframe interleaving is performed at step S5220.

In this case, the step S5220 may perform the twisted block interleaving by using a column-wise writing operation and a diagonal-wise reading operation.

Furthermore, in the method according to the embodiment of the present invention, the inter-subframe interleaving is performed by using an output of the twisted block interleaving at step S5230.

In this case, the step S5230 may be performed by using the convolutional delay line.

In this case, the convolutional delay line may read only data cells except for virtual cells corresponding to the twisted block interleaving.

In this case, the convolutional delay line may generate (store) new virtual cells prior to switches moving to a next branch, after each row of the data cells is written from the output of the twisted block interleaving.

In this case, the new virtual cells may correspond to the number obtained by subtracting the number of FEC blocks ($N_{FEC\_TI}$) in a time interleaving block of an interleaving frame from the maximum number of the FEC blocks ($N_{FEC\_TI\_MAX}$) corresponding to the time interleaving block of the interleaving frame for each branch.

In this case, the new virtual cells may not be outputted from the inter-subframe interleaving.

In this case, the convolutional delay line may include branches corresponding to a time interleaving unit ($N_{TU}$), and each of remaining branches except for the first branch of the branches may include at least one FIFO register.

In this case, the convolutional delay line may output only a part of initial values stored in the FIFO register.

In this case, the part of the initial values may correspond to one initialization cell for each of the remaining branches.

The method of time deinterleaving according to an embodiment of the present invention may be provided in a manner corresponding to FIG. 52.

For example, the method of time deinterleaving according to an embodiment of the present invention may include a step of performing inter-subframe deinterleaving corresponding to an inverse process of the step S5230 and a step of performing twisted block deinterleaving corresponding to an inverse process of the step S5220. In this case, the method of time deinterleaving according to the embodiment of the present invention may further include a step of performing cell deinterleaving corresponding to an inverse process of the step S5210.

According to the present invention, the decoding complexity can be lowered by appropriately setting positions of virtual cells when inter-subframe interleaving is performed.

Furthermore, according to the present invention, the broadcasting system can operate more efficiently because the convolutional delay line for hybrid-time interleaving operates by using new virtual cells independent of virtual cells included in a twisted block interleaver.

Furthermore, according to the present invention, the broadcasting system can operate more efficiently without increasing the decoding complexity by appropriately using initial values of the FIFO register included in the convolutional delay line.

As described above, the apparatus and method for time interleaving according to the present invention are not limited to the configurations and methods of the aforementioned embodiments, but some or all of the embodiments may be selectively combined such that the embodiments are modified in various manners.

What is claimed is:

1. An apparatus for time deinterleaving, comprising:
an inverse convolutional delay line configured to perform inter-subframe deinterleaving that corresponds to an inverse process of inter-subframe interleaving performed by a convolutional delay line of a transmitter; and
a twisted block deinterleaver configured to perform intra-subframe deinterleaving that corresponds to an inverse process of intra-subframe interleaving performed by a twisted block interleaver of the transmitter,
wherein the inter-subframe interleaving is performed by using an output of the intra-subframe interleaving at the transmitter,
wherein the convolutional delay line reads only data cells except for virtual cells from the twisted block interleaver, and
wherein after each row of the data cells is written from the twisted block interleaver, the convolutional delay line generates new virtual cells prior to switches moving to a next branch.

2. The apparatus of claim 1, wherein the intra-subframe interleaving is performed by a column-wise writing operation and a diagonal-wise reading operation.

3. The apparatus of claim 1, wherein the new virtual cells correspond to a number obtained by subtracting a number ($N_{FEC\_TI}$) of FEC blocks in a time interleaving block of an interleaving frame from a maximum number ($N_{FEC\_TI\_MAX}$) of the FEC blocks corresponding to the time interleaving block of the interleaving frame for each branch.

4. The apparatus of claim 3, wherein the new virtual cells are not outputted from a time interleaver of the transmitter.

5. The apparatus of claim 4, wherein the convolutional delay line includes branches corresponding to a time interleaving unit ($N_{IU}$), and each of remaining branches except for a first branch of the branches includes at least one FIFO register.

6. The apparatus of claim 5, wherein the convolutional delay line outputs only a part of initial values stored in the FIFO register.

7. The apparatus of claim 6, wherein the part of the initial values corresponds to one initialization cell for each of the remaining branches.

8. A method of time deinterleaving, comprising:
performing inter-subframe deinterleaving that corresponds to an inverse process of inter-subframe interleaving performed by a convolutional delay line of a transmitter; and
performing intra-subframe deinterleaving that corresponds an inverse process of intra-subframe interleaving performed by a twisted block interleaver of the transmitter,
wherein the inter-subframe interleaving is performed by using an output of the intra-subframe interleaving at the transmitter,
wherein the convolutional delay line reads only data cells except for virtual cells from the twisted block interleaver, and
wherein after each row of the data cells is written from the twisted block interleaver, the convolutional delay line generates new virtual cells prior to switches moving to a next branch.

* * * * *